(12) United States Patent
Morton et al.

(10) Patent No.: US 12,023,770 B2
(45) Date of Patent: Jul. 2, 2024

(54) MAGNETIC COUPLING DEVICE WITH AT LEAST ONE OF A SENSOR ARRANGEMENT AND A DEGAUSS CAPABILITY

(71) Applicants: MAGSWITCH TECHNOLOGY WORLDWIDE PTY LTD., Lafayette, CO (US); David H. Morton, Boulder, CO (US); Paul J. Karp, Boulder, CO (US); Cengiz Kizilkan, Ingolstadt (DE)

(72) Inventors: David H. Morton, Boulder, CO (US); Paul J. Karp, Boulder, CO (US); Cengiz Kizilkan, Ingolstadt (DE)

(73) Assignee: Magswitch Technology, Inc., Superior, CO (US)

( * ) Notice: Subject to any disclaimer, the term of this patent is extended or adjusted under 35 U.S.C. 154(b) by 845 days.

(21) Appl. No.: 17/049,947

(22) PCT Filed: Apr. 12, 2019

(86) PCT No.: PCT/US2019/027267
§ 371 (c)(1),
(2) Date: Oct. 22, 2020

(87) PCT Pub. No.: WO2019/209553
PCT Pub. Date: Oct. 31, 2019

(65) Prior Publication Data
US 2021/0268615 A1    Sep. 2, 2021

Related U.S. Application Data

(63) Continuation-in-part of application No. 15/964,884, filed on Apr. 27, 2018, now Pat. No. 11,097,401.

(Continued)

(51) Int. Cl.
*B23Q 3/15* (2006.01)
*B25B 11/00* (2006.01)
(Continued)

(52) U.S. Cl.
CPC .............. *B23Q 3/15* (2013.01); *B25B 11/002* (2013.01); *B25J 15/0608* (2013.01); *G01R 33/02* (2013.01)

(58) Field of Classification Search
None
See application file for complete search history.

(56) References Cited

U.S. PATENT DOCUMENTS 2,863,550 A    12/1958  Hommel
2,947,429 A     8/1960  Buccicone
(Continued)

FOREIGN PATENT DOCUMENTS

CN    2179359 Y   10/1994
CN    1104989 A    7/1995
(Continued)

OTHER PUBLICATIONS

Extended European Search Report for European Application No. 18792036.8, dated Dec. 8, 2020, 8 pages.
(Continued)

*Primary Examiner* — Bernard Rojas
(74) *Attorney, Agent, or Firm* — Faegre Drinker Biddle & Reath LLP

(57) ABSTRACT

Magnetic coupling devices are disclosed having magnetic field sensors. The magnetic coupling device may include a calibration module for calibrating the magnetic coupling devices.

37 Claims, 48 Drawing Sheets

Related U.S. Application Data

(60) Provisional application No. 62/490,706, filed on Apr. 27, 2017, provisional application No. 62/490,705, filed on Apr. 27, 2017.

(51) Int. Cl.
    *B25J 15/06* (2006.01)
    *G01R 33/02* (2006.01)

(56) References Cited

U.S. PATENT DOCUMENTS

| | | |
|---|---|---|
| 3,089,064 A | 5/1963 | Cotton |
| 3,316,514 A | 4/1967 | Radus et al. |
| 3,355,209 A | 11/1967 | Richards et al. |
| 3,452,310 A | 6/1969 | Israelson |
| 3,646,669 A | 3/1972 | Erickson |
| 3,895,270 A | 7/1975 | Maddox |
| 4,314,219 A | 2/1982 | Haraguchi |
| 4,384,313 A | 5/1983 | Steingroever et al. |
| 4,465,993 A | 8/1984 | Braillon |
| 4,594,568 A | 6/1986 | Hubner et al. |
| 4,610,580 A | 9/1986 | Palm |
| 4,639,170 A | 1/1987 | Palm |
| 4,921,292 A | 5/1990 | Harwell et al. |
| 4,956,625 A | 9/1990 | Cardone et al. |
| 5,444,902 A | 8/1995 | Casturo et al. |
| 5,525,950 A | 6/1996 | Wang |
| 5,794,497 A | 8/1998 | Anderson |
| 6,076,873 A | 6/2000 | Jung |
| 6,104,270 A | 8/2000 | Elias |
| 6,160,697 A | 12/2000 | Edel |
| 6,229,422 B1 | 5/2001 | Pignataro |
| 6,331,810 B1 | 12/2001 | Jung |
| 6,489,871 B1 | 12/2002 | Barton |
| 6,573,817 B2 | 6/2003 | Gottschalk |
| 6,636,153 B1 | 10/2003 | Barton et al. |
| 6,663,154 B2 | 12/2003 | Pancheri |
| 6,707,360 B2 | 3/2004 | Underwood et al. |
| 7,012,495 B2 | 3/2006 | Underwood et al. |
| 7,049,919 B2 | 5/2006 | Yamaki |
| 7,148,777 B2 | 12/2006 | Chell et al. |
| 7,161,451 B2 | 1/2007 | Shen |
| 7,396,057 B2 | 7/2008 | Ye et al. |
| 8,031,038 B2 | 10/2011 | Kimura |
| 8,157,155 B2 | 4/2012 | Diez et al. |
| 8,183,965 B2 | 5/2012 | Michael |
| 8,256,098 B2 | 9/2012 | Michael |
| 8,350,663 B1 | 1/2013 | Michael |
| 8,604,900 B2 | 12/2013 | Kocijan |
| 8,878,639 B2 | 11/2014 | Kocijan |
| 8,892,258 B2 | 11/2014 | Jacobsen et al. |
| 8,907,754 B2 | 12/2014 | Barton et al. |
| 8,934,210 B1 | 1/2015 | Denis et al. |
| 9,164,154 B2 | 10/2015 | Filosa et al. |
| 9,202,616 B2 | 12/2015 | Fullerton et al. |
| 9,232,976 B2 | 1/2016 | Fortier et al. |
| 9,242,367 B2 | 9/2016 | Timmons et al. |
| 9,453,769 B2 | 9/2016 | Michael |
| 9,484,137 B2 | 11/2016 | Kocijan |
| 9,589,715 B2 | 3/2017 | Choi |
| 9,818,522 B2 | 11/2017 | Kocijan |
| 10,903,030 B2 * | 1/2021 | Morton ............ B65H 3/16 |
| 11,031,166 B2 | 6/2021 | Morton et al. |
| 11,097,401 B2 | 8/2021 | Morton et al. |
| 11,511,396 B2 | 11/2022 | Morton et al. |
| 11,651,883 B2 | 5/2023 | Morton et al. |
| 11,839,954 B2 * | 12/2023 | Morton ............ B25B 11/002 |
| 2001/0045785 A1 | 11/2001 | Chen et al. |
| 2002/0105400 A1 | 8/2002 | Underwood et al. |
| 2003/0030342 A1 | 2/2003 | Chen et al. |
| 2004/0239460 A1 | 12/2004 | Kocijan |
| 2005/0012579 A1 | 1/2005 | Underwood et al. |
| 2009/0027149 A1 | 1/2009 | Kocijan |
| 2010/0201468 A1 | 8/2010 | Pohl et al. |
| 2010/0301839 A1 | 12/2010 | Cardone et al. |
| 2011/0248806 A1 | 10/2011 | Michael |
| 2013/0026774 A1 | 1/2013 | Ding |
| 2013/0135067 A1 | 5/2013 | Choi |
| 2013/0234817 A1 | 9/2013 | Kocijan |
| 2013/0285399 A1 | 10/2013 | Sarh et al. |
| 2013/0320686 A1 | 12/2013 | Morton |
| 2014/0055069 A1 | 2/2014 | Dai et. al. |
| 2014/0132254 A1 | 5/2014 | Thomas et al. |
| 2014/0314507 A1 | 10/2014 | Timmons et al. |
| 2015/0035632 A1 | 2/2015 | Sarh et al. |
| 2015/0367484 A1 | 12/2015 | Choi |
| 2016/0187208 A1 | 6/2016 | Michael |
| 2016/0289046 A1 | 10/2016 | Norton et al. |
| 2017/0011831 A1 | 1/2017 | Reijo |
| 2017/0232605 A1 | 8/2017 | Morton |
| 2018/0111237 A1 | 4/2018 | Michael |
| 2018/0193899 A1 | 7/2018 | Kizilkan |
| 2018/0311795 A1 | 11/2018 | Morton et al. |
| 2018/0315563 A1 | 11/2018 | Morton et al. |
| 2020/0185137 A1 | 6/2020 | Morton et al. |
| 2021/0031317 A1 | 2/2021 | Morton et al. |
| 2021/0031335 A1 | 2/2021 | Morton et al. |
| 2021/0122011 A1 | 4/2021 | Kitaura et al. |
| 2021/0210296 A1 | 7/2021 | Morton et al. |
| 2021/0296039 A1 | 9/2021 | Morton et al. |
| 2023/0090943 A1 | 3/2023 | Morton et al. |
| 2023/0170122 A1 | 6/2023 | Morton et al. |
| 2023/0343530 A1 | 10/2023 | Morton et al. |
| 2023/0364747 A1 | 11/2023 | Morton et al. |

FOREIGN PATENT DOCUMENTS

| | | |
|---|---|---|
| CN | 1402876 A | 3/2003 |
| CN | 1245725 C | 3/2006 |
| CN | 101274727 A | 10/2008 |
| CN | 101356597 A | 1/2009 |
| CN | 101711194 A | 5/2010 |
| CN | 201689754 U | 12/2010 |
| CN | 102574668 A | 7/2012 |
| CN | 202704790 U | 1/2013 |
| CN | 103332585 A | 10/2013 |
| CN | 103377793 A | 10/2013 |
| CN | 103563019 A | 2/2014 |
| CN | 104276506 A | 1/2015 |
| CN | 105684102 A | 6/2016 |
| CN | 105940468 A | 9/2016 |
| CN | 106102993 A | 11/2016 |
| CN | 206617466 U | 11/2017 |
| DE | 202007009403 U1 | 9/2007 |
| DE | 202016006696 U1 | 12/2016 |
| EP | 1425763 A1 | 6/2004 |
| EP | 1419034 B1 | 7/2006 |
| EP | 2218557 A2 | 8/2010 |
| EP | 2611569 A1 | 7/2013 |
| EP | 2535307 B1 | 4/2015 |
| EP | 3100289 A1 | 12/2016 |
| EP | 3100288 B1 | 3/2018 |
| EP | 3460411 A1 | 3/2019 |
| GB | 0695130 A | 8/1953 |
| GB | 1471025 A | 4/1977 |
| JP | 51-093568 U | 7/1976 |
| JP | 59-030072 U | 2/1984 |
| JP | 63-015404 A | 1/1988 |
| JP | 04-207002 A | 7/1992 |
| JP | 2608002 B2 | 5/1997 |
| JP | 10-012432 A | 1/1998 |
| JP | 2002-144271 A | 5/2002 |
| JP | 2003-516627 A | 5/2003 |
| JP | 2007-208024 A | 8/2007 |
| JP | 2008-253127 A | 10/2008 |
| JP | 2009-509886 A | 3/2009 |
| JP | 2013-219364 A | 10/2013 |
| JP | 2014-081002 A | 5/2014 |
| JP | 5798208 B2 | 10/2015 |
| JP | 2017-506818 A | 3/2017 |
| KR | 10-2003-0007387 A | 1/2003 |
| KR | 10-2009-0035432 A | 4/2009 |
| KR | 10-2012-0130040 A | 11/2012 |
| KR | 10-2013-0063129 A | 6/2013 |

(56) References Cited

FOREIGN PATENT DOCUMENTS

| KR | 10-1643538 B1 | 7/2016 |
|---|---|---|
| WO | 96/07610 A1 | 3/1996 |
| WO | 99/08293 A1 | 2/1999 |
| WO | 01/43147 A1 | 6/2001 |
| WO | 03/09972 A2 | 2/2003 |
| WO | 03/19583 A1 | 3/2003 |
| WO | 2008/142716 A2 | 11/2008 |
| WO | 2009/000008 A1 | 12/2008 |
| WO | 2010/020006 A1 | 2/2010 |
| WO | 2010/135788 A1 | 12/2010 |
| WO | 2012/029073 A1 | 3/2012 |
| WO | 2012/160262 A1 | 11/2012 |
| WO | 2014/033757 A1 | 3/2014 |
| WO | 2015/033851 A1 | 3/2015 |
| WO | 2015/114214 A1 | 8/2015 |
| WO | 2015/114220 A1 | 8/2015 |
| WO | WO 2015114214 A1 * | 8/2015 |
| WO | 2016/162419 A1 | 10/2016 |
| WO | 2018/200948 A1 | 11/2018 |
| WO | 2018/227140 A1 | 12/2018 |

OTHER PUBLICATIONS

Official Action for Canadian Application No. 3,061,331, dated Feb. 9, 2021, 3 pages.
Search Report and First Office Action for Chinese Application No. 2018800408500, dated Apr. 6, 2021, 16 pages.
Ixtur Automatic On/Off Lifting Magnets; Industrial Magnetics, Inc., magnetics.com, Nov. 1, 2015, https://web.archive.org/web/20151101101715/https://www.magnetics.com product.asp?ProductID=169, two pages.
"MagnaGrip SS Sensing System" https://www.maglogix.com/maglogix-switchable-permanent-magnets-magnagrip, copyright 2014-2017, printed Jul. 20, 2019, (5 pages).
"MaxX The hand controlled magnetic lifter", Tecnomagnete, Oct. 2008, (16 pages).
"Pick & Place For End-of-Arm Tooling", DocMagnet, undated, (5 pages).
"Pick 'n Place D Series", DocMagnet, retrieved from https://web.archive.org/web/20150512113557/http://www.docmagnet.com:80/products/magnetic-material-handling/automation/pick-n-place-d-series/, May 12, 2015, (4 pages).
"RPL 11 ERIEZ Lifting Magnet 1,100 lb Hoist or Crane," eBay, ebay.com, seller: industrial_supplies_warehouse, ebay Item No. 263279261219, accessed: Oct. 2017. https://www.ebay.com/itm/RPL-11-ERIEZ-Lifting-Magnet-1-100-lb-Hoist--or-Crane-/263279261219.
Ara Nerses Knaian: "Electropermanent Magnetic Connectors and Actuators: Devices and Their Application in Programmable Matter", PhD Thesis., Massachusetts Institute of Technology, 2010, pp. 1-206.
International Preliminary Report on Patentability received for PCT Patent Application No. PCT/US2018/029786, dated Nov. 7, 2019, 10 pages.
International Preliminary Report on Patentability received for PCT Patent Application No. PCT/US2018/036734, dated Dec. 19, 2019, 7 pages.
International Search Report and Written Opinion of the International Searching Authority, Australian Patent Office, PCT/US2018/029786 to Magswitch Technology Worldwide PTY Ltd et al., dated Aug. 21, 2018, 17 pages.
International Search Report and Written Opinion received for PCT Patent Application No. PCT/US2018/036734, dated Sep. 4, 2018, 10 pages.
International Search Report and Written Opinion received for PCT Patent Application No. PCT/US2019/019179, dated Jun. 24, 2019, 14 pages.
International Search Report and Written Opinion received for PCT Patent Application No. PCT/US2019/027267, dated Jul. 17, 2019, 27 pages.
Knaian, "Electropermanent Magnetic Connectors and Actuators: Devices and Their Application in Programmable Matter", PHD Thesis, Massachusetts Institute of Technology, 2010 (206 pages).
Material Handling Catalogue, DocMagnet, undated, (8 pages).
International Preliminary Report on Patentability received for PCT Patent Application No. PCT/US2019/019179, dated Sep. 3, 2020, 9 pages.
International Preliminary Report on Patentability received for PCT Patent Application No. PCT/US2019/027267, dated Nov. 5, 2020, 11 pages.
The Wayback Machine—https://web.archive.org/web/20170405061444/https7/en.wikipedia.org/wiki/Electropermanent_magnet, (dated Apr. 5, 2017; retrieved Oct. 11, 2021), (9 pages).
U.S. Appl. No. 62/248,804, filed Oct. 30, 2015, (64 pages).

* cited by examiner

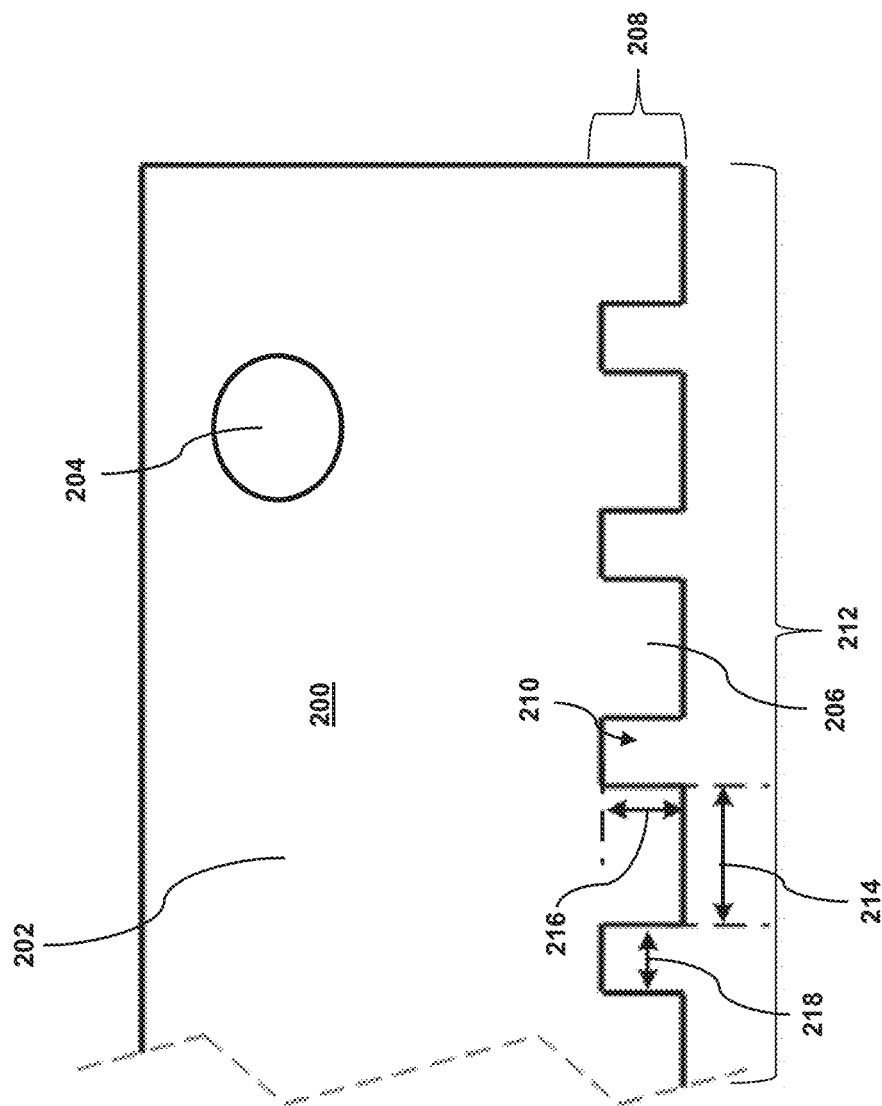

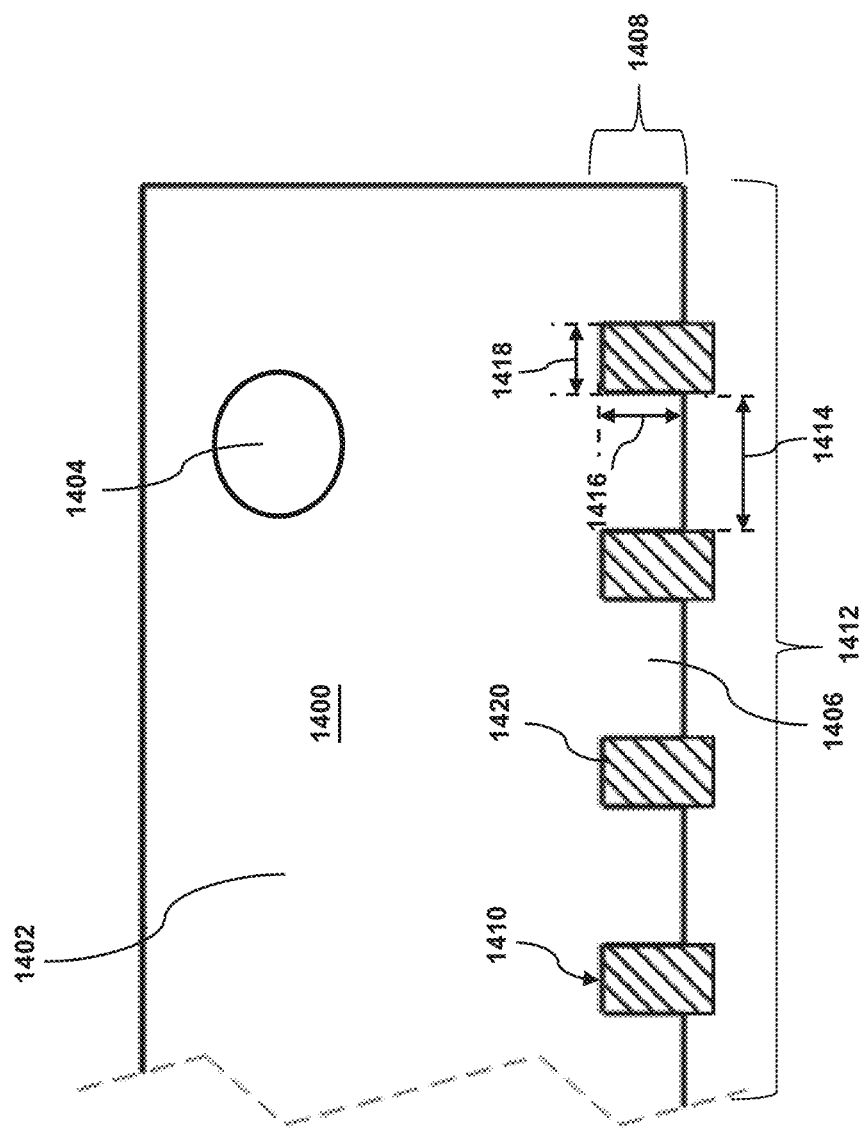

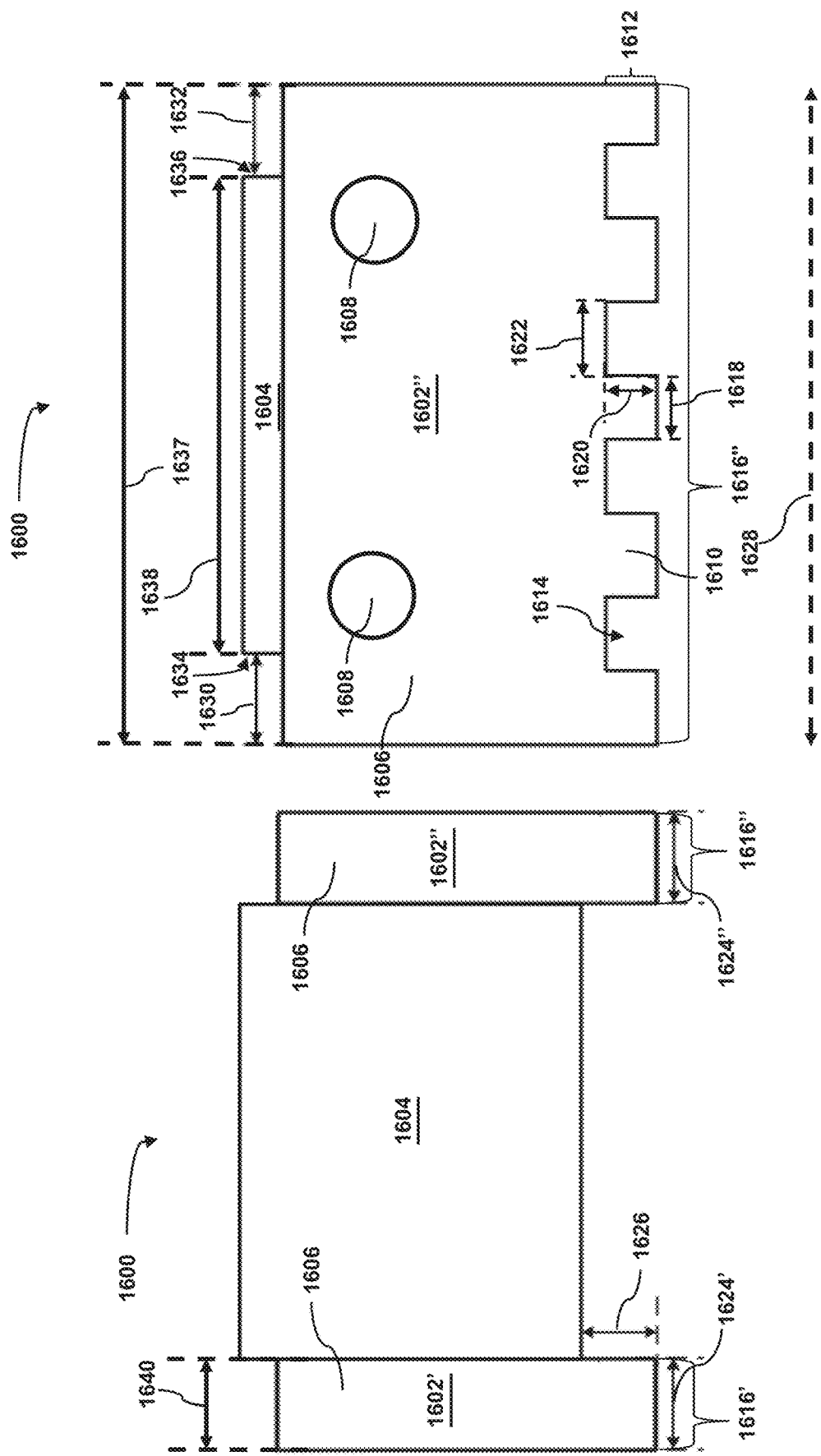

MAGNETIC COUPLING DEVICE WITH AT LEAST ONE OF A SENSOR ARRANGEMENT AND A DEGAUSS CAPABILITY

RELATED APPLICATIONS

The present application is a continuation of PCT Application No. PCT/US2019/027267, filed Apr. 27, 2018, which is a continuation-in-part of U.S. application Ser. No. 15/964,884, filed Apr. 27, 2018 and the present application is a continuation-in-part of U.S. application Ser. No. 15/964,884, filed Apr. 27, 2018, which claims the benefit of U.S. Provisional Patent Application No. 62/490,705, titled MAGNETIC COUPLING TOOL WITH SENSOR ARRANGEMENT, filed Apr. 27, 2017 and the benefit of U.S. Provisional Patent Application No. 62/490,706, titled MAGNETIC COUPLING TOOL WITH DEGAUSS CAPABILITY, filed Apr. 27, 2017. All of the aforementioned disclosures are expressly incorporated herein by reference for all purposes.

TECHNICAL FIELD

The present disclosure is related to magnetic coupling devices having at least one sensor to determine one or more parameters indicative of the quality of the magnetic circuit between the magnetic coupling device and a ferromagnetic workpiece, as well as, a relative position between magnetic coupling device and the ferromagnetic workpiece. Additionally, the magnetic coupling devices may include degauss capability.

BACKGROUND

There are numerous devices which use magnetic fields in order to attract and/or secure a ferromagnetic target to a working face of the device. Examples include magnetic clamping devices such as workpiece chucks, permanent magnet lifting devices, magnetic latches, magnetic tool stands, etc.

Generally speaking, most of such devices include one or more sources of magnetic flux. These sources include electromagnets, electro-permanent magnets, switchable permanent magnet units or arrangements, and combinations thereof. In order to channel the magnetic flux provided by the magnet(s) to one or more working face(s) of the device at which the target is to be secured magnetically, high magnetic permeability pole shoes or guides are often used, in creating a magnetic working circuit.

In many applications, and from a practical engineering perspective, users of such devices are primarily interested in determining the actual (pull) force which is exerted at the working face on the target, having otherwise access to rating data of the magnet(s) employed in the device and which, all other aspects of the device-internal part of the magnetic working circuit being ideal, includes the Gauss rating of the magnet. The Gauss rating in turn allows determining of a maximum, theoretical pull force which such magnet(s) can exert on a target, using established formulae, where the target's size, geometry and ferromagnetic composition enables it to be fully magnetically saturated. That is, it is assumed that no or only negligible stray magnetic field lines outside the circuit comprised of magnet, pole shoes and target exist, in particular at the working face where 'air gaps' are often present between pole shoes and target which adversely affect pull force. Some magnet manufacturers also provide maximum pull force rating values for their magnets, based on laboratory testing.

It is well known that the actual pull force exerted by a magnetic device on a target will be different to that determinable from the Gauss rating of the magnet or the rated maximum pull force determined by experimentation. The actual or effective pull force is reduced by a number of factors, including uneven contact at the interface pole shoe—target (i.e. presence of air gaps at the interface), the interface pole shoe—target not being perpendicular to the magnetic field lines at the interface, target having 'thin' dimensions leading to magnetic field lines extending past and outside the target (stray and leakage flux leakage), target surface geometry and coatings, etc.

In the context of magnetic devices which use robotic arms and other positioning devices to move the device between off-target and on-target operating positions, additional factors beyond pull force need to be accounted for, e.g. the need for precise positioning of the device with its working face against specific areas or zones on the target, which can be of as simple geometric shape as a plate or thin sheet metal stamping, to more complex multi-curved forms such as engine cam shafts.

Because many of these variables are difficult or impossible to predict in use of such magnetic devices, various operating methods and measuring systems have been proposed and integrated into such magnetic devices, to gain in-use and real-time information about qualitative and quantitative parameters relevant to the external part of magnetic working circuit, relevantly whether the target is and remains safely attached to the working face of the device, and whether the pull force remains within safety or rating thresholds.

Magnetic grippers are a common tool for handling steel workpieces in industrial automation. They achieve large holding forces and are relatively straight-forward to integrate into a robotics system, but for specific problems noted below. Many magnetic grippers used in industry are powered by pneumatic actuators. This prevents most magnetic grippers from interfacing with control electronics of a fully automated process. Without an interface between a magnet gripper and the control electronics, the robot (and the operator) has no easy way of obtaining feedback from the magnet gripper on tool status or workpiece handling performance.

One common way around this in industry is to provide additional sensors on the outside of the magnet gripper to detect various tool states, such as when the tool is turned fully on vs fully off, or when a target part is in contact with the magnet gripper's working face. Though this method of adding sensors works, it is expensive to add many additional and function-dedicated sensors. In addition, sensors added to the outside of the tool are vulnerable to damage from the robot's movement, operation, and surrounding environment. Additional sensors also add wiring complexity, making integration of the robot arm more expensive and difficult.

Regardless of the lay-out and the interface between the magnetic coupling device and the workpiece, it is well known that ferromagnetic workpieces that have been exposed to a magnetic field during handling by such devices retain residual magnetism from the handling operation, in particular where a strong magnetic field was used to generate sufficient pull force to retain the workpiece secured to the device. Relevantly, in many cases it is desired for such workpieces to be totally or to a viable extent free of residual magnetism, for example where following magnetic handling a workpiece is to be machined or residual magnetism may interfere with subsequent use of the workpiece.

It is equally well known that workpieces can be demagnetized by exposing these to an alternating magnetic field of decreasing intensity, for example by passing them through a field of an AC-powered Degaussing Chamber (or coil) if they are small enough or moving a tool comprising a demagnetization coils over the part while generating an alternating magnetic field of decreasing intensity that ultimately removes the remaining magnetism from the workpiece.

One problem with such methodologies is that they require a separate, dedicated extra processing step in workpiece handling/machining routines and/or a separate (additional) tool/device to perform the operation.

Against the above background, and in particular having regard to the added challenges which integration of sensors into robotic end of arm (EOA) magnetic coupling tools such as grippers and workpiece transfer equipment present, it is desired to provide a device (or tool) which is intended to allow integration of feedback measures in a magnetic coupling tool, to allow for superior operation and use of magnetic technology in robotics. Exemplary feedback measures may include an indication of whether a target (i.e. a workpiece) is properly magnetically retained at the working face of the tool, an indication of a quality of coupling between an end-of-arm magnetic tool (EOAMT) and workpiece, such as correct positioning of the tool within predetermined thresholds at a target zone of the workpiece, detection of proximity of a target workpiece vis a vis an EOAMT, and other factors. Further, it is desired to provide magnetic coupling tools with improved degaussing functionality.

SUMMARY

Embodiments of the present disclosure relate to magnetic couplers for lifting, transporting, and/or holding a ferromagnetic workpiece. Exemplary embodiments include but are not limited to the following examples.

In an exemplary embodiment, a magnetic system comprises: a machine including a base that is configured to perform an operational cycle; at least one magnetic coupling device operatively coupled to the machine at a first end of the machine opposite the base, wherein each magnetic coupling device of the at least one magnetic coupling device comprises: a housing including a switchable magnetic flux source supported by the housing; a plurality of workpiece engagement surfaces supported by the housing and magnetically coupled to the switchable magnetic flux source, the plurality of workpiece engagement surfaces adapted to contact a ferromagnetic workpiece, a first workpiece engagement surface of the plurality of workpiece engagement surfaces corresponding to a north pole of the magnetic coupling device and a second workpiece engagement surface of the plurality of workpiece engagement surfaces corresponding to a south pole of the magnetic coupling device; and at least one magnetic field sensor supported by the housing, wherein a magnetic field sensor of the at least one magnetic field sensor is positioned to monitor a first magnetic flux associated with the first workpiece engagement surface or a second magnetic flux associated with the second workpiece engagement surface; and a logic control circuit operatively coupled to the magnetic field sensor and the machine, the logic control circuit configured to perform a calibration sequence for the at least one magnetic coupling device using an output from the magnetic field sensor during the operational cycle.

In an example thereof, to perform the calibration sequence, the logic control circuit is configured to: store initial values of minimum and maximum leakage fluxes for the first magnetic flux and the second magnetic flux prior to the machine performing the operational cycle; and replace the initial values of the minimum and maximum leakage fluxes with updated values of minimum and maximum leakage fluxes sensed by the magnetic field sensor during the operational cycle.

In an example thereof, the logic control circuit is configured to correlate the initial values of the minimum and maximum leakage fluxes and the updated values of the minimum and maximum leakage fluxes to a type of ferromagnetic workpiece.

In another example thereof, different minimum and maximum leakage fluxes are sensed by the magnetic field sensor at different positions during the operational cycle and wherein the logic control circuit is configured to correlate the different minimum and maximum leakage fluxes to the different positions.

In a further example thereof, different minimum and maximum leakage fluxes are sensed by the magnetic field sensor at different times during the operational cycle and wherein the logic control circuit is configured to correlate the different minimum and maximum leakage fluxes to the different times.

In yet another example thereof, different minimum and maximum leakage fluxes are sensed by the magnetic field sensor at different times for a specific position during the operational cycle and wherein the logic control circuit is configured to correlate the different minimum and maximum leakage fluxes to the different times for the specific position.

In even another example thereof, the calibration sequence is performed when the at least one magnetic coupling device is coupled to a ferromagnetic workpiece and when the at least one magnetic coupling device is not coupled to the ferromagnetic workpiece.

In still a further example thereof, the logic control circuit is configured to determine when the at least one magnetic coupling device is not securely coupled to the ferromagnetic workpiece based on the updated values of minimum and maximum leakage fluxes.

In another example thereof, the logic control circuit is configured to determine when the at least one magnetic coupling device is operating in a degraded mode based on the updated values of minimum and maximum leakage fluxes.

In yet another example thereof, the logic control circuit is configured to determine at least one operating state of the at least one magnetic coupling device based on the calibration sequence.

In a further example thereof, the switchable magnetic flux source is switched via an electromagnetic pulse delivered via coils to a magnet included in the switchable magnetic flux source.

In even another example thereof, the magnetic flux source comprises: a second permanent magnet rotatable relative to a first permanent magnet about an axis intersecting with the second permanent magnet to alter a position of the second permanent magnet relative to the first permanent magnet.

In yet a further example thereof, the magnetic flux source comprises: a second permanent magnet rotatable relative to a first permanent magnet about an axis in a non-intersecting relationship with the second permanent magnet to alter a position of the second permanent magnet relative to the first permanent magnet.

In still another example thereof, the magnetic field sensor is positioned to monitor the first magnetic flux and the at least one magnetic field sensor comprises a second magnetic field sensor positioned to monitor the second magnetic flux; and wherein the logic control circuit is configured to perform the calibration sequence for the at least one magnetic coupling device using the output from the magnetic field sensor and an output from the second magnetic field sensor during the operational cycle.

In even another example thereof, the magnetic flux source comprises a first magnetic platter supported by the housing and a second magnetic platter supported by housing, the second magnetic platter being rotatable relative to the first magnetic platter about an axis in a non-intersecting relationship with the second magnetic platter to alter a position of the second permanent magnet relative to the first permanent magnet, the first magnetic platter comprising a first plurality of spaced apart permanent magnets including the first permanent magnet, each of the first plurality of spaced apart permanent magnets has a north pole side and a south pole side, and a first plurality of pole portions interposed between adjacent permanent magnets of the first plurality of permanent magnets, wherein the first plurality of permanent magnets are arranged so that each pole portion of the first plurality of pole portions is one of a north pole portion which is adjacent the north pole side of two permanent magnets of the first plurality of permanent magnets and a south pole portion which is adjacent the south pole side of two permanent magnets of the first plurality of permanent magnets; the second magnetic platter comprising a second plurality of spaced apart permanent magnets including the second permanent magnet, each of the second plurality of spaced apart permanent magnets has a north pole side and a south pole side, and a second plurality of pole portions interposed between adjacent permanent magnets of the second plurality of permanent magnets, wherein the second plurality of permanent magnets are arranged so that each pole portion of the first plurality of pole portions is one of a north pole portion which is adjacent the north pole side of two permanent magnets of the second plurality of permanent magnets and a south pole portion which is adjacent the south pole side of two permanent magnets of the second plurality of permanent magnets, wherein the first magnetic sensor is associated with one of the north pole portions of the second magnetic platter and the second magnetic sensor is associated with one of the south pole portions of the second magnetic platter.

In yet another example thereof, the machine includes a plurality of moveable segments.

In a further example thereof, the machine is a robotic arm, a mechanical gantry, a crane hoist, or a pick and place machine.

In still a further example thereof, the switchable magnetic flux source comprises a magnetic platter including a plurality of permanent magnet portions interposed between a plurality of ferromagnetic pole piece portions, the magnetic platter being linearly translatable within the housing along an axis extending between a first end portion of the housing and a second end portion of the housing to at least each of a first state and a second state, the magnetic platter being arranged adjacent to a ferrous piece such that the magnetic coupling device establishes a first magnetic circuit through the ferrous piece and provides a first magnetic field at a workpiece contact interface of the magnetic coupling device when the magnetic platter is in the first state and the magnetic platter being arranged spaced apart from the ferrous piece such that the magnetic coupling device provides a second magnetic field at the workpiece contact interface when the magnetic platter is in the second state, the second magnetic field being a non-zero magnetic field strength.

In an example thereof, the magnetic coupling device is linearly translatable to a third state, the magnetic platter being arranged between the first state and the second state when the magnetic platter is in the third state.

In another example thereof, the workpiece contact interface comprises a plurality of spaced-apart projections.

In another exemplary embodiment, a method comprises: sensing, by at least one magnetic field sensor, at least one magnetic flux associated with a first workpiece engagement surface of a magnetic coupling device, a second magnetic flux associated with a second workpiece engagement surface of a magnetic coupling device, or both, wherein the magnetic coupling device is coupled to a machine at a first end opposite a base of the machine and wherein the machine is configured to perform an operational cycle; store initial values of minimum and maximum leakage fluxes of the first magnetic flux and the second magnetic flux prior to the machine performing the operational cycle; and replace the initial values of the minimum and maximum leakage fluxes with updated values of minimum and maximum leakage fluxes sensed by the at least one magnetic field sensor during the operational cycle.

In an example thereof, the method further comprises correlating the initial values of the minimum and maximum leakage fluxes and the updated values of the minimum and maximum leakage fluxes to a type of ferromagnetic workpiece.

In another example thereof, different minimum and maximum leakage fluxes are sensed at different positions during the operation cycle and the method further comprises correlating the different minimum and maximum leakage fluxes to the different positions.

In even another example thereof, different minimum and maximum leakage fluxes are sensed at different times during the operation cycle and the method further comprises correlating the different minimum and maximum leakage fluxes to the different times.

In yet another example thereof, different minimum and maximum leakage fluxes are sensed by the magnetic field sensor at different times for a specific position during the operational cycle and the method further comprises correlating the different minimum and maximum leakage fluxes to the different times for the specific position.

In still another example thereof, the method is performed when the magnetic system is coupled to a ferromagnetic workpiece and when the magnetic system is not coupled to the ferromagnetic workpiece.

In a further example thereof, the method further comprises determining when the magnetic system is not securely coupled to a ferromagnetic workpiece based on the updated values of minimum and maximum leakage fluxes.

In yet another example thereof, the method further comprises determining when the magnetic system is operating in a degraded mode based on the updated values of minimum and maximum leakage fluxes.

In even another example thereof, the method further comprises determining at least one operating state of the magnetic coupling device based on the calibration sequence.

Other aspects and optional and/or preferred embodiments will become apparent from the following description provided below with reference to the accompanying drawings.

BRIEF DESCRIPTION OF THE DRAWINGS

FIG. 41 illustrates a side view of a portion of an exemplary pole shoe.

FIG. 43 illustrates a side view of a portion of another exemplary pole shoe.

FIG. 46A illustrates a front view of another exemplary switchable magnetic device.

FIG. 46B illustrates a side view of the switchable magnetic device depicted in FIG. 46A.

DETAILED DESCRIPTION OF THE DRAWINGS

In the figures as well as in the preceding section of this specification, terms such as 'upper', 'lower', 'axial' and other terms of reference are used to facilitate an understanding of the technology here described and are not to be taken as absolute and limiting reference indicators, unless the context indicates otherwise. The terms "couples", "coupled", "coupler" and variations thereof are used to include both arrangements wherein the two or more components are in direct physical contact and arrangements wherein the two or more components are not in direct contact with each other (e.g., the components are "coupled" via at least a third component), but yet still cooperate or interact with each other.

Figure 1:
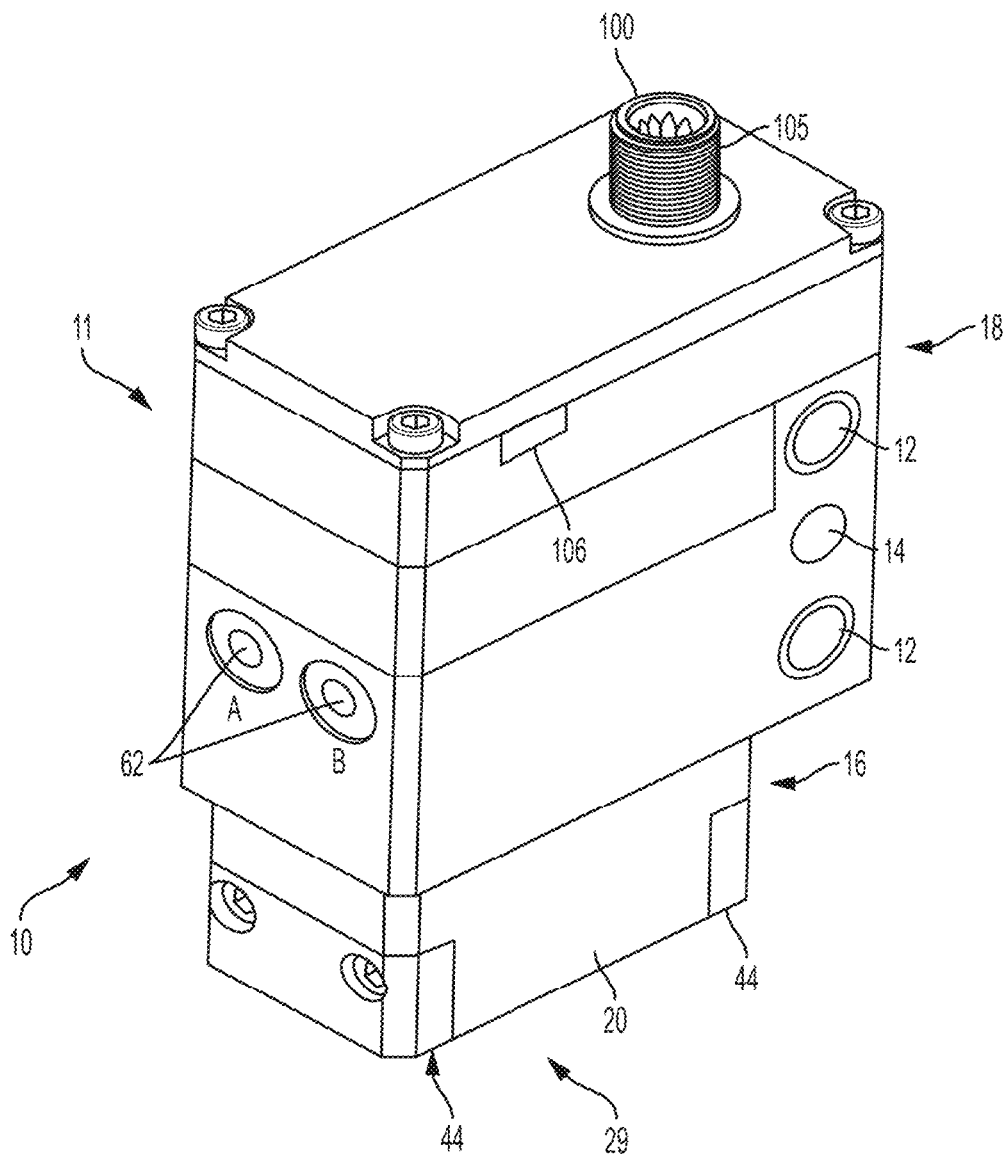
FIG. 1 illustrates a perspective view of an exemplary end-of-arm magnetic coupling tool.

Referring to FIG. 1, an exemplary magnetic coupling tool 10 is shown. Magnetic coupling tool 10 is configured to magnetically couple a ferromagnetic workpiece 17 (see FIG. 21). Magnetic coupling tool 10 is described herein for use as an end of arm ("EOAMT") unit for a robotic system, such as robotic system 700 (see FIG. 25) but may also used with other lifting and transporting systems for ferromagnetic materials. Exemplary lifting and transporting systems include robotic systems, mechanical gantries, crane hoists and additional systems which lift and/or transport ferromagnetic materials. Additionally, magnetic coupling tool 10 may also be used as part of a stationary fixture for holding at least one part for an operation, such as welding, inspection, and other operations. Logic control circuit 23 by monitoring sensors 98 is able to verify that the part being held on the stationary fixture is in a correct position.

Figure 2:
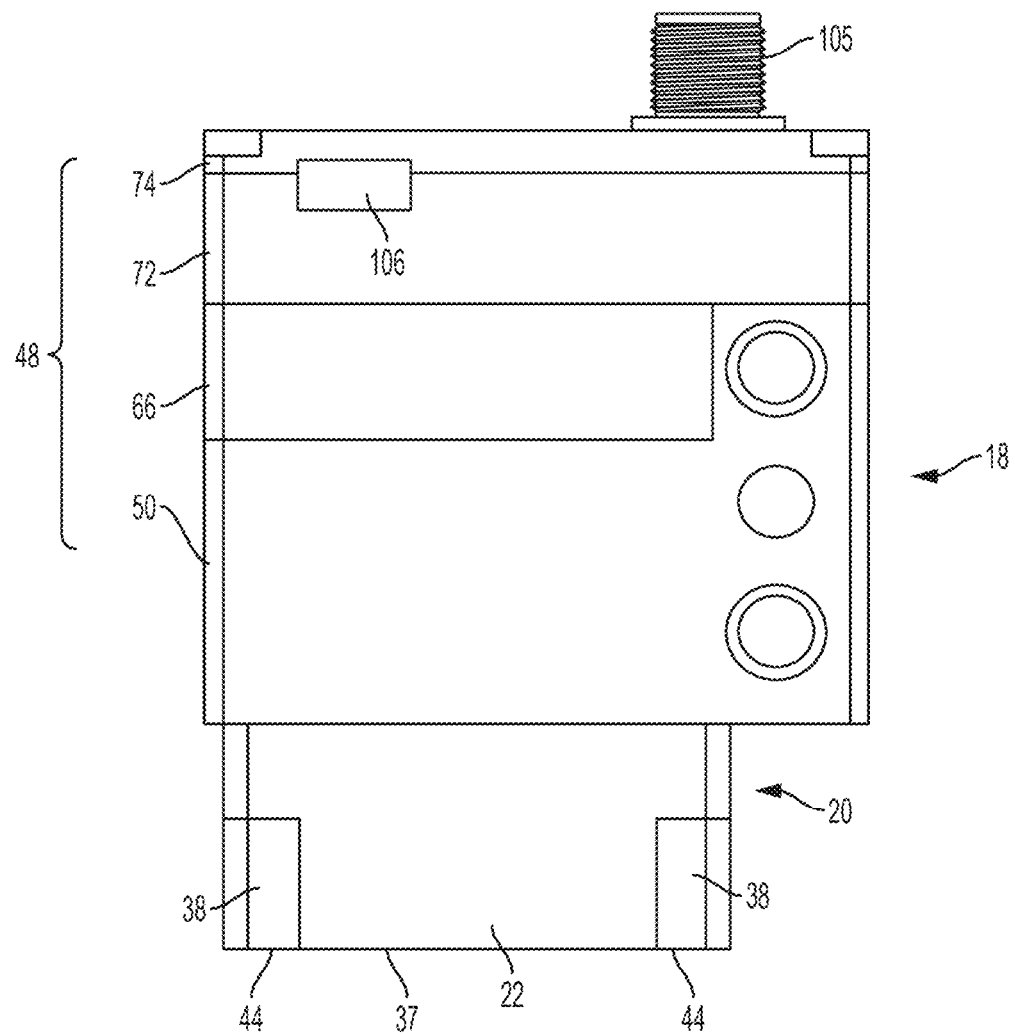
FIG. 2 illustrates a side elevation of the end-of-arm magnetic coupling tool of FIG. 1.
Figure 3:
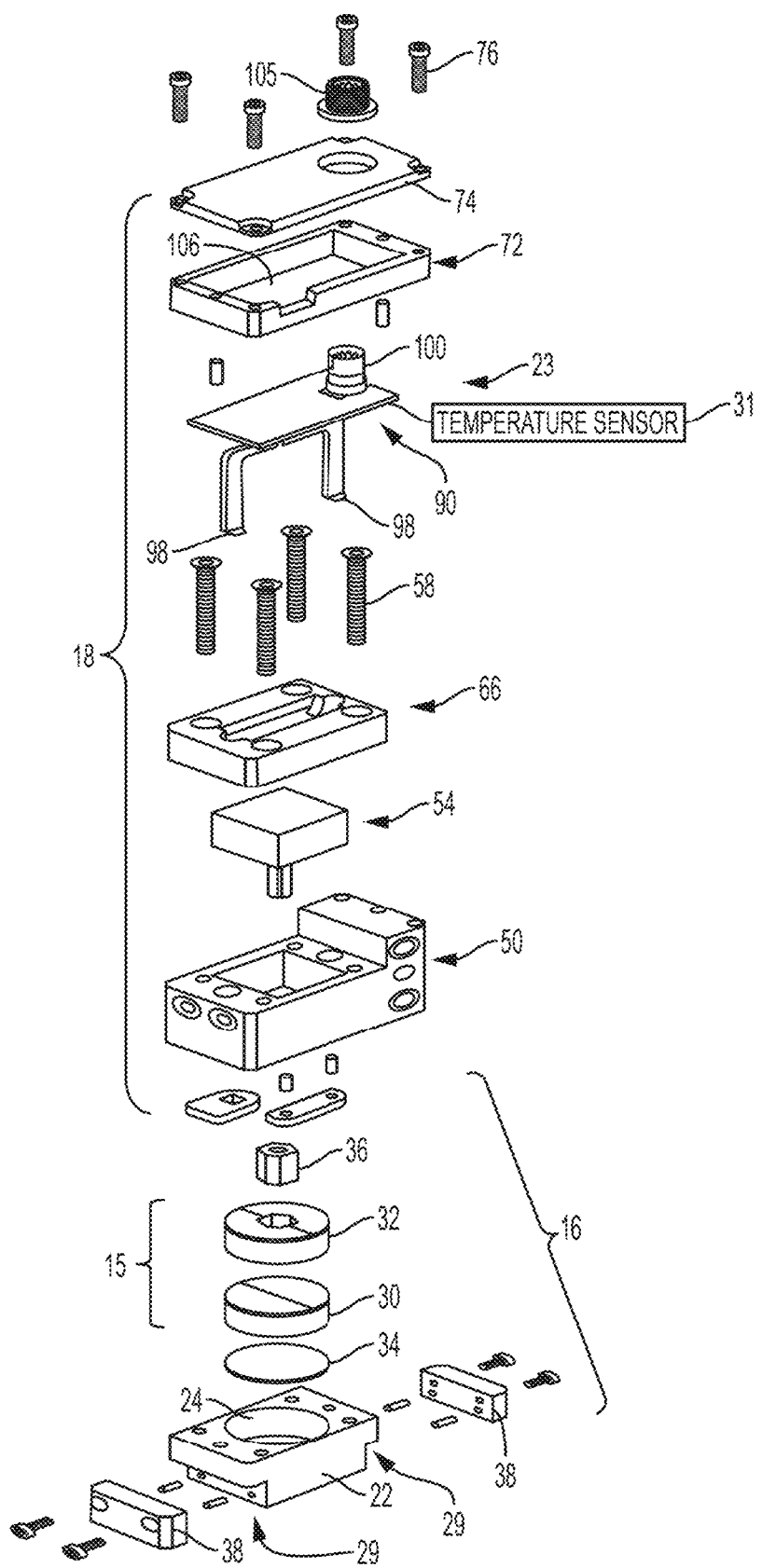
FIG. 3 illustrates an exploded perspective view of the end-of-arm magnetic coupling tool of FIG. 1.

Referring to FIGS. 1-3, magnetic coupling tool 10 includes a housing 11 and a switchable magnetic flux source 15 (see FIG. 3) supported by housing 11. The switchable magnetic flux source 15 includes a plurality of permanent magnets, illustratively permanent magnets 30, 32 (see FIG. 3). The plurality of permanent magnets including a first permanent magnet 30 and a second permanent magnet 32 movable relative to the first permanent magnet 30. First permanent magnet 30 being held fixed relative to housing 11. Magnetic coupling tool 10 further including a plurality of workpiece engagement surfaces 44 supported by housing 11. The plurality of workpiece engagement surfaces 44 being magnetically coupled to switchable magnetic flux source 15. The plurality of workpiece engagement surfaces 44 adapted to contact the ferromagnetic workpiece 17 (see FIG. 21). A first workpiece engagement surface 44 of the plurality of workpiece engagement surfaces corresponding to a north pole of the magnetic coupling tool 10 and a second workpiece engagement surface 44 of the plurality of workpiece engagement surfaces corresponding to a south pole of the magnetic coupling tool 10.

Magnetic coupling tool 10 further includes a plurality of magnetic field sensors 98 (see FIG. 3) supported by housing 11. A first magnetic field sensor 98 of the plurality of magnetic field sensors positioned to monitor a first magnetic flux associated with the first workpiece engagement surface 44 of the plurality of workpiece engagement surfaces and a second magnetic field sensor 98 of the plurality of magnetic field sensors positioned to monitor a second magnetic flux associated with the second workpiece engagement surface 44 of the plurality of workpiece engagement surfaces. Magnetic coupling device 10 further including a logic control circuit 23 operatively coupled to the plurality of magnetic field sensors 98. Logic control circuit 23 is configured to determine at least one operating state of magnetic coupling tool 10 based on an output from at least one of the plurality of magnetic field sensors 98.

In the illustrated embodiment of FIGS. 1-11, magnetic coupling device 10 is an end of arm magnetic coupling tool (herein "EOAMT") devised for magnetically securing a ferromagnetic workpiece 17 to a working face 44 of the tool 10. The end of arm magnetic coupling tool 10 comprises an on-off switchable magnetic flux source 15; a first housing component 22 of housing 11 in which is received the magnetic flux source 15; and at least two, magnetic pole extension shoes 38 each having each a workpiece engagement surface 44 and a flux detection surface 46 at an end opposite to the workpiece engagement surface 44. Pole extension shoes 38 are mounted to or at least partially form integral part of the first housing component 22 such as to receive magnetic flux from the magnetic flux source 15 and to make such received magnetic flux available at the workpiece engagement surfaces 44. In embodiments, workpiece engagement surfaces 44 are part of housing 22. Tool 10 further includes a number of magnetic field detection sensors 98. In embodiments, the number of magnetic field detection sensors is equal in number to the number of pole extension shoes 38 and/or workpiece engagement surfaces 44. Each of the magnetic field detection sensors 98 is located a predetermined distance away, but in close proximity to the flux detection surface of an associated one of the pole extension shoes 38. In one example, the magnetic field detection sensors 98 are positioned within respective pole extension shoes 38. In the illustrated embodiment, magnetic field detection sensors 98 are positioned above respective pole extension shoes 38. The tool 10 further comprising logic control circuit 23 which is operative to receive an output signal from one or more of the magnetic field detection sensors 98 and determine from said output signal(s) at least one of the following operating states of the tool: whether the magnetic flux source 15 is switched on or off, whether there is a ferromagnetic workpiece 17 in spatial proximity to one or more of the workpiece engagement surfaces 44 at the pole extension shoes 38, whether one or more of the workpiece engagement surfaces 44 at the pole extension shoes 38 abut a workpiece 17, and whether abutment of a workpiece 17 at one or more of the workpiece engagement surfaces 44 is adequate and within predetermined positioning thresholds.

In embodiments, the first magnetic field sensors 98 and the logic control circuit 23 are housed/received within a further (second) housing component 18 which itself may be of multi-piece construction and which is coupled/secured to the first housing component 22, such as to provide a compact-footprint end of arm magnetic coupling tool 10 with integrated magnetic field detection and workpiece-tool interface detection capabilities.

In embodiments of the end of arm magnetic coupling tool 10, the magnetic flux source 15, the first housing component 22 and the pole extension shoes 38 are based around on-off switchable, dipole permanent magnet units as developed by the Magswitch Group (of which the applicant is part of). In particular, modified Magswitch 'AR' series switchable magnetic flux sources may be used.

In embodiments, the first housing component 22 is a rectangular prism ferromagnetic steel housing component with a central cylindrical bore 24, in which two cylindrical, diametrically polarized rare-earth permanent magnets 30, 32 are stacked (the latter providing the on-off switchable magnetic flux source). One of the magnets 30 is fixed against rotating within the cylindrical bore 24, while the other magnet 32 is free to rotate upon external torque application using a suitable actuator 54 (pneumatic, hydraulic, or electric) interfaced with the rotatable magnet 32. The steel housing 22 has a substantially rectangular foot print, wherein the central bore 24 is centered in the housing 11 and dimensioned such that only thin wall webs connect the opposing thick-walled housing halves that provide integral pole extension pieces of the device, as described in U.S. Pat. No. 6,707,360, the entire disclosure of which is expressly incorporated by reference herein for all purposes. The lower magnet 30 is secured in the housing component 22 with the N-S pole separation plane extending (bridging) between the thin wall webs, so that the N- and S-poles of the magnet are extended into the respectively adjacent thick wall portion of the housing component 22 (see FIG. 4).

When rotatable magnet 32 is rotated relative to fixed magnet 30 to align the N- and S-poles of the two magnets 30, 32, the steel housing 22 becomes magnetically polarized, i.e. the housing itself provides part of or both of the pole extension shoes to redirect the flux from the magnets 30, 32 towards the two, magnetically separated workpiece engagement surfaces 44 provided at one axial end of the housing at the lower surfaces of pole extension shoes 38. This, in turn, allows a magnetic circuit to form between the two opposing sides of the steel housing 22. This turns the dipole flux source "on", i.e. an on state. When rotatable magnet 32 is rotated relative to fixed magnet 30 to partially, but not completely align the N- and S-poles of the two magnets, the steel housing 22 becomes magnetically polarized, i.e. the housing 22 itself provides part of or both of the pole extension shoes to redirect the flux from magnets 30, 32 towards the two, magnetically separated workpiece engagement surfaces 44 provided at one axial end of the housing 22 at the lower surfaces of the pole extension shoes 38. This in turn allows a magnetic circuit to form between the two opposing sides of steel housing 22. The magnetic flux available at workpiece engagement surfaces 44 is reduced compared to the on state and approaches the magnetic flux available at the workpiece engagement surfaces 44 of the on state the more aligned the N- and S-poles of the two magnets 30, 32 become. This turns the dipole flux source 15 "partially on", i.e. a partial on state. When top magnet 32 is rotated relative to fixed lower magnet 30 to anti-align the N- and S-poles, the magnetic circuit is closed within the housing 22, tuning the unit "off", i.e. an off state, and effectively no usable magnetic flux can be "tapped" by a target workpiece 17 when brought into contact with the workpiece engagement surfaces 44, as would otherwise be the case in the on state or the partial on state of the unit 10. Additional types of magnetic devices and actuation mechanisms and embodiments that may be used in the embodiments disclosed herein are provided in U.S. Non-Provisional application Ser. No. 15/965,582, filed Apr. 27, 2018, titled VARIABLE FIELD MAGNETIC COUPLERS AND METHODS FOR ENGAGING A FERROMAGNETIC WORKPIECE, U.S. Provisional Application Ser. No. 62/517,057, filed Jun. 8, 2017, titled ELECTROMAGNET-SWITCHABLE PERMANENT MAGNET DEVICE and U.S. Provisional Application Ser. No. 62/750,082, filed Oct. 24, 2018, titled LINEARLY ACTUATED MAGNETIC COUPLING DEVICE, the entire disclosures of which are expressly incorporated by reference herein for all purposes.

In embodiments, placement of magnetic field detection sensors 98 relative to the pole extension shoes 38 provides a sensing system for the switchable magnetic source 15. No matter what switching state (on state, partial on state, off state) the switchable dipole permanent magnet unit 15 is in, there is always some magnetic field present outside the vicinity of the workpiece engagement surfaces 44 on the lower side of the pole extensions shoes 38, providing "leakage flux" pathways. This leakage may be very small in the off state of the switchable permanent magnet unit 15 and could be confined. Relevantly though, the amount of leakage flux is heavily dependent on the internal magnetic circuit of the unit 10 itself, the on/partial on/off state of the unit 10, and the magnetic circuit formed between the unit 10 and the specific target workpiece 17.

When the unit 10 is in the off state wherein the two magnets 30, 32 are anti-aligned and forming a closed magnetic circuit inside of the steel housing 22, the unit 10 has very little leakage flux, though detectable with sensitive magnetic field sensors 98 when properly placed. When the unit 10 is in the on state wherein the two magnets 30, 32 are aligned and in absence of a fully shunting target workpiece 17 at or in proximity of the workpiece engagement surfaces 44 there is a much higher level of leakage flux. When the unit 10 is in the partial on state the level of leakage flux is less than in the on state and more than in the off state.

Further, in the on state or the partial on state, the amount of leakage flux is also determined by the quality of the working magnetic circuit formed between the pole shoes 38 of the unit 10 and workpiece 17 at the workpiece engagement surfaces 44, and the size, shape and material of the workpiece 17 itself. The quality of this magnetic circuit is determined primarily by the thickness and relative magnetic permeability of the workpiece material, and the quality of contact between the magnet through the workpiece engagement surfaces 44 and the workpiece 17. The higher quality the magnetic circuit is the less leakage flux there is to be detected on the side of the pole shoes 38 interacting with the workpiece 17. The quality of the magnetic circuit is increased the thicker the workpiece 17 is, the higher the workpiece's relative magnetic permeability, and the larger area of the contact between the pole shoes 38 and the workpiece 17.

These 'leakage' effects allow for the magnetic field sensors 98 to monitor and derive various operational states of unit 10 incorporating Magswitch switchable permanent magnet units or other suitable switchable magnet units. Magswitch "AR" series devices are normally designed for use with detachable pole shoes 38. Pole shoe size and geometry can be selected to suit application fields and dual-purpose pole shoes 38 providing two differently contoured workpiece engagement surfaces at opposite axial ends may be employed.

In embodiments, a lower part of the first housing component 22 (which is quadrilateral in cross-section), where the lower fixed magnet 30 is located, is recessed or machined on opposite external sides (i.e. at the thick-walled portions) to provide respective shape-conforming receptacles or recesses 29 for two ferromagnetic pole shoes 38. In embodiments, the external shape of the two pole shoes 38 is chosen to provide four continuous and step-free external faces of the housing 11 when mounted thereto, i.e. these are rectangular prismatic or cuboid in shape.

The upper, un-recessed part of the first housing component 22 and the lower part of the first housing component with the exchangeably attached cuboid pole shoes 38 form a continuous, as flux-leakage free as possible flux delivery path towards the workpiece engagement surfaces 44 provided at the free axial terminal ends of the pole shoes 38. In this case also, the flux detection surfaces 46 opposite the workpiece engagement surfaces 44 will be provided at an upper terminal face of the first housing component 22, given the gap free mounting of the pole shoes 38 at the receptacles. Pole shoes 38 may be lengthened to locate workpiece engagement surfaces 44 below a lower side 37 (see FIG. 3) of housing component 22.

In embodiments, the EOAMT 10 will comprise, in addition to the first housing component 22, a second housing component 18 secured to an end of the first housing component opposite the workpiece engagement surfaces 44 of the pole extension shoes 38. The second housing component 18 is substantially non-ferromagnetic and includes at least two passage ways 70 (see FIG. 5) extending preferably to terminal openings located opposite the flux detection surfaces 46 at the first housing component 22 and receiving a respective one of two said first magnetic field detection sensors 98. This arrangement protects the sensors 98 from external damage while equally ensuring that magnetic flux leakage from the flux detection surfaces 46 at the first housing component 22 is sampled with minimal interference of other ferromagnetic components that could distort the magnetic field.

For sturdiness considerations and noting the need for the second housing component 18 to have magnetic properties that do not substantially adversely affect shaping (e.g. bundling) of magnetic field lines passing through the flux detection surfaces 46 at the first housing component 22, aluminum alloys are a preferred material choice, and non-ferrous stainless steel could be used as well. Equally, suitable impact resistant polymer materials (reinforced if desired) having the necessary low relative magnetic permeability values, can also find use. In this context, low relative magnetic permeability is one which is 4 to 6 orders of magnitude lower than that of the material used in the manufacture of the pole shoes 38 and the first housing component 22. In embodiments, the first housing component 22 and the pole shoes 38 are made from the same material.

The preferably also rectangular prismatic second housing component 18 can advantageously serve to house an actuator 54 which interfaces with the rotatable magnet 32 received in the first housing component 22 to switch the magnetic flux source 15 between an on state, an off state, and one or more partial on states, and to seal the bore 24 in which the magnets 30, 32 are received against infiltration of dust and water, in addition to housing the first sensors 98 in a protected manner against environmental influences.

In embodiments, the logic control circuit 23 is operative to receive output signals from the one or more of the first magnetic field (and any additional) detection sensors 98 and determine from said output signal(s) one or more of the operating states of the tool 10. In embodiments, the logic control circuit 23 comprises a central control board, preferably using a printed circuit board which contains a pre-programmed or programmable microprocessor, with analog to digital converters (ADCs) for sensor signal sampling and conditioning if required, and additional transistors that allow a GPIO (general-purpose input/output) of the processor to be interfaced to industrial 24V logic. The board will advantageously also host power conditioning, to take 24 V from an industrial power supply and regulate it to 5 or 3.3 V as normally used by industrial robotics microprocessors and circuit components, as well as provide the working voltage for the magnetic field sensors.

Figure 25:
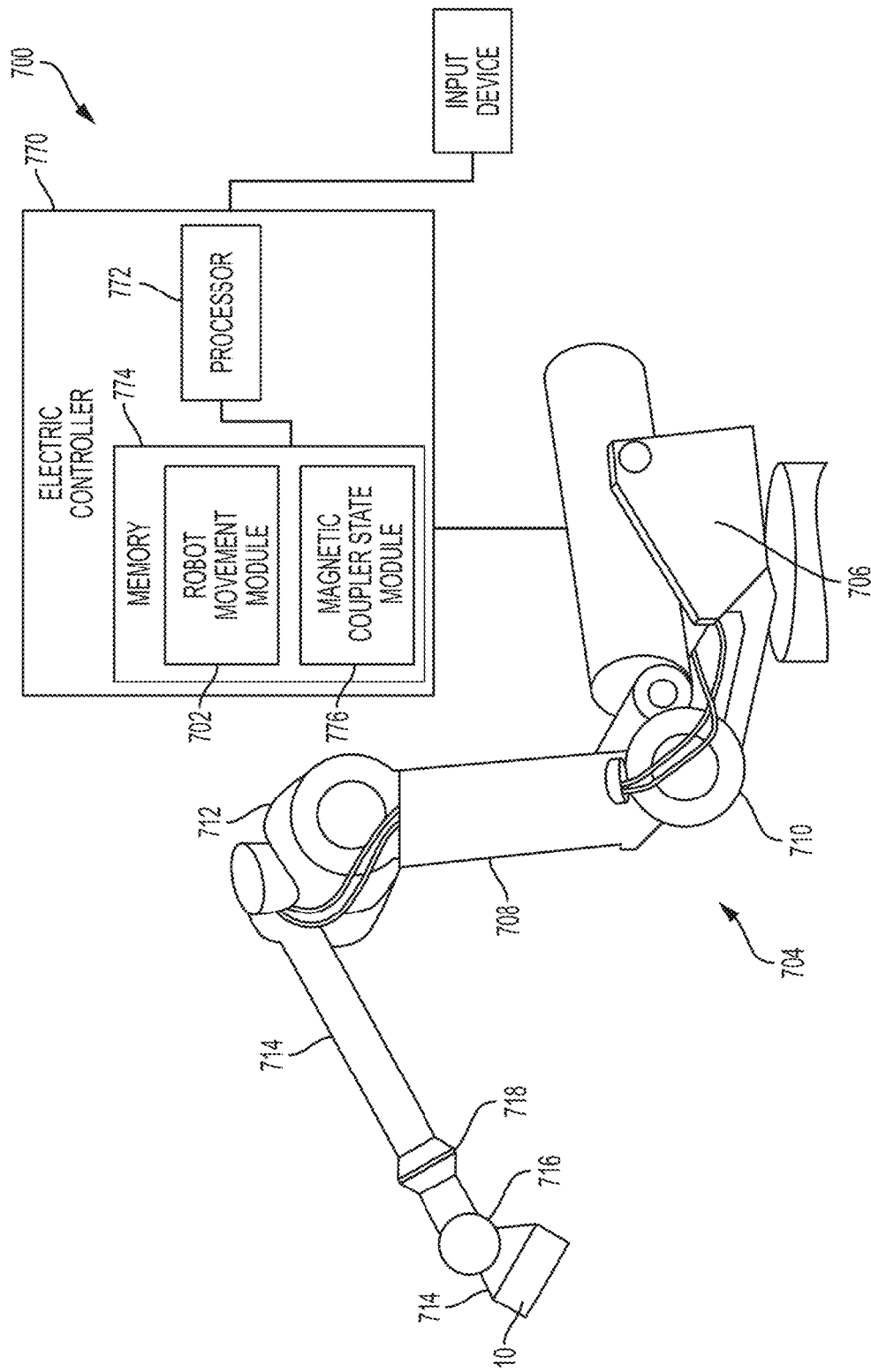
FIG. 25 illustrates a robotic system including the exemplary magnetic coupling device of FIG. 1 attached as an end of arm coupler.

In addition, the central control board may be provided with a series of blank headers, intended to accept a communications module that allows the control board to interface with external control electronics, such as robot controller 770 (see FIG. 25). This interface may be as simple as a discrete I/O connection, sending single bit On-Off signals over 24 V logic lines, or as advanced as a full industrial Ethernet connection.

As noted, the central control board will advantageously use ADCs for sensor signal sampling, but could equally incorporate direct analog inputs, with filtering and the required signal conditioning, that allow the microprocessor to receive and process signals from the first magnetic field sensors, but equally other sensors, e.g. temperature sensors 31, that may be incorporated into the first and/or second housing component.

The first magnetic field sensors 98 could be simple scalar magnetometers used to measure the total strength of a magnetic field. In embodiments, the magnetic field sensors 98 are preferably more complex and differentiating vector magnetometers, such as solid-state linear Hall Effect sensors, in particular of bi-directional type, magneto resistive sensors that can be incorporated in integrated circuits, etc.

Linear Hall Effect sensors can have a very small form factor and embodied in solid state ICs (e.g. Honeywell SS39ET/SS49E/SS59ET series) and are therefore a preferred embodiment of the first magnetic field sensors. Because of the small form factor (e.g. 3×3×1.5 mm), it is possible to incorporate various Linear Hall Effect sensors having different magnetic field detection ranges and sensitivities, for example, in providing the first magnetic field sensors 98, and which using suitable logic circuitry can be switched so that the respective sensor output signals can be processed and if necessary combined to obtain a clearer picture of the magnetic field near the flux detection surfaces 46 of the pole extension shoes 38 of the EOAMT 10, if required. In embodiments, the magnetic field sensors 98 are three dimensional sensors having the capability to sense magnetic fields in three orthogonal directions. An exemplary magnetic field sensor is Model No. TLV493D-A1B6 three-dimensional magnetic sensor available from Infineon Technologies AG located at Am Campeon 1-15, 85579 Neubiberg in Germany.

As noted, in embodiments additional sensors, such as temperature sensors 31 may be integrated in suitable cavities at the first housing component 22. An evaluation circuit (more precisely the software/program used in the microprocessor to perform signal evaluation and analysis) of the logic control circuit 23 will then compensate for temperature dependent drift of the magnetic field sensors 98 to yield more accurate EOAMT 10 positioning data.

Figure 14:
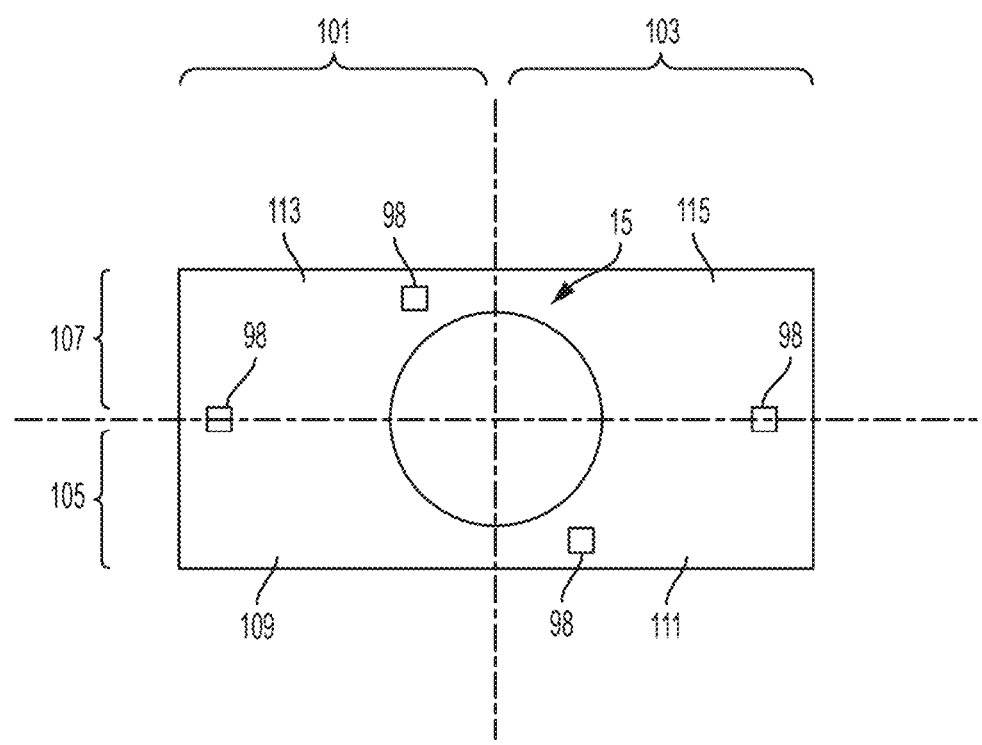
FIG. 14 illustrates a top view of an exemplary sensor layout of the end-of-arm magnetic coupling tool of FIG. 1.

Further, in embodiments, additional magnetic field sensors 98 are included. Referring to FIG. 14, a representative top view of unit 10, magnetic field sensors 98 are positioned as described herein with a first magnetic field sensor 98 being positioned in a left side half 101 of the magnetic coupling tool 10 and a second magnetic field sensor 98 being positioned in a right-side half 103 of the magnetic coupling tool 10. Additionally, a third magnetic field sensor 98 is positioned in a front half 105 of the magnetic coupling tool 10 and a fourth magnetic field sensor 98 is positioned in a rear half 107 of the magnetic coupling tool 10. The front half 105 including a first portion 109 of the left side half 101 and a first portion 111 of the right-side half 103. The rear half 107 including a second portion 113 of the left side half 101 and a second portion 115 of the right-side half 103. The addition of the third and fourth magnetic field sensors 98 provides additional sensor values which may be used to determine various operating states of the magnetic coupling tool 10. For example, logic control circuit 23 based on the outputs of the four magnetic field sensors may determine an orientation of the workpiece engagement surfaces 44 relative to the ferromagnetic workpiece 17 in two rotational axes, such as left-to-right tilt and front-to-back tilt.

Figure 13:
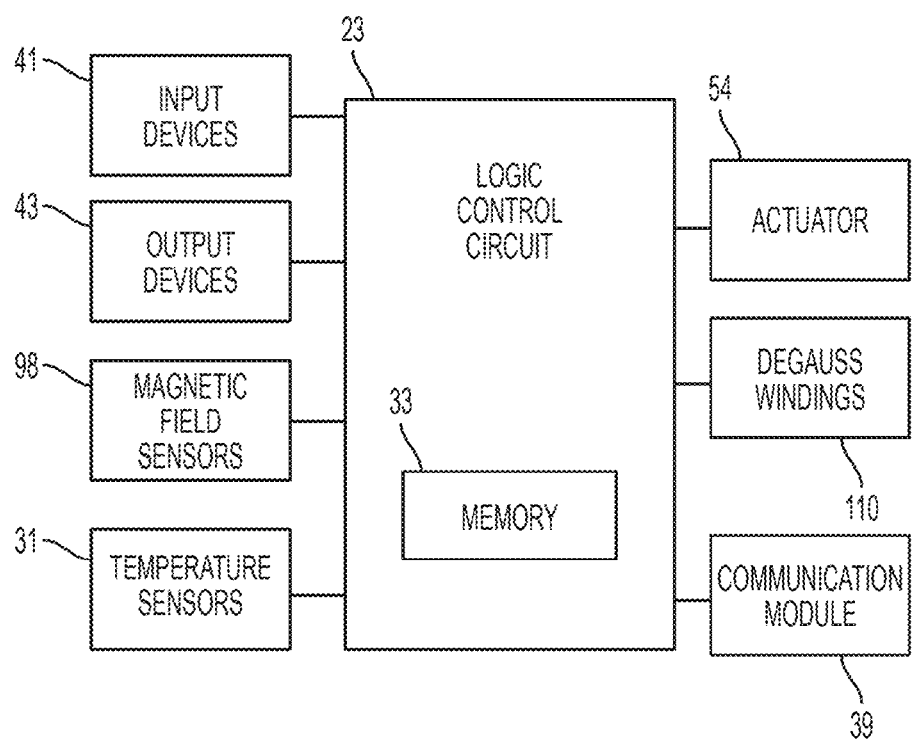
FIG. 13 illustrates a representative view of the logic control circuit of the end-of-arm magnetic coupling tool of FIG. 1.

Turning then to functional blocks of the logic control circuit 23. The simplest piece of information required about the EOAMT 10 is that of the switching state of the magnetic flux source 15 (unit), i.e. is the unit in the off state, the on state, or a partial on state. In the off state, the EOAMT 10 has extremely little or even no leakage flux. In the on state, even on a near perfect magnetic working circuit with a workpiece 17, the EOAMT's switchable permanent magnetic unit 15 has considerably more leakage flux than in the off state. Therefore, in a calibration process, the reading of one or more of the first magnetic field sensors 98 in the off state of the EOAMT 10 can be stored in a memory 33 (see FIG. 13) associated with the microprocessor of the logic control circuit 23 as a calibrated or hard coded value, and when the magnetometer reading rises above this off-state value, or some offset above this off-state value, the EOAMT 10 can be considered in the on state or a partial on state. When the magnetometer reading is at or close to the calibration stored value, the EOAMT 10 can be considered in the off state. In embodiments, through a calibration process, the reading of one or more of the first magnetic field sensors 98 in a desired partial on state may be stored in memory 33 as a calibrated or hard coded value, and when the magnetometer reading rises to a specific stored reading or within some percentage of the specific stored reading, the EOAMT 10 can be considered to be in the corresponding partial on state.

Figure 15:
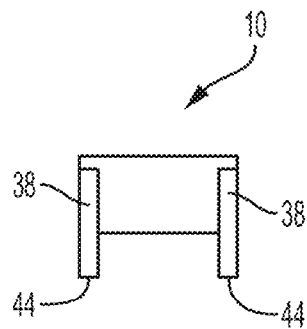
FIG. 15 illustrates a simplified front elevation view of the end of arm magnetic coupling device of FIG. 1 and no workpiece in the proximity of the end of arm magnetic coupling device.

Another functional block of the logic control circuit 23 may be used to determine if there is a ferromagnetic workpiece underneath one or both the workpiece engagement surfaces 44 of the two magnetic pole extension shoes 38 of the EOAMT 10, when the flux source unit is turned on or partially on. When no target part is present for the EOAMT to magnetically attach to (see FIG. 15), there is no 'true' (i.e. external working) magnetic circuit between the two pole shoes 38. Assuming that any workpiece 17 is sufficiently spaced apart from the pole shoes 38 so as to not distort the magnetic field, the flux would extend through air between the lower terminal ends of the pole shoes 38 (primarily between the workpiece engagement surfaces 44), effectively representing leakage flux. This also causes a high leakage flux to be present at the flux detection surfaces 46 of the pole extension shoes 38, and consequently a relatively high reading at the magnetic field sensors 98. By storing this "max leakage flux" for a given on state or partial on state in memory 33 associated with the microprocessor of the logic control circuit 23, either hard coded, or from a calibration run, in normal operation of the EOAMT 10 it is possible to determine if there is a workpiece present or not, by placing the magnetic switching unit in the on state or partial on state corresponding to the stored "max leakage flux" reference value and comparing a current sensor output with the stored "max leakage flux" reference value for the on state or the partial on state.

Figure 16:
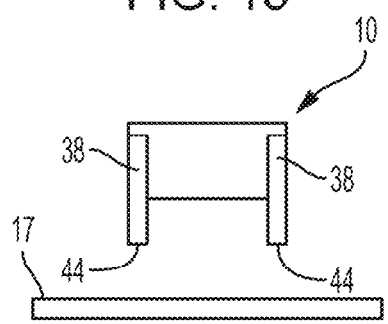
FIG. 16 illustrates a simplified front elevation view of the end of arm magnetic coupling device of FIG. 1 and a workpiece separated from the end of arm magnetic coupling device by a first separation.
Figure 17:
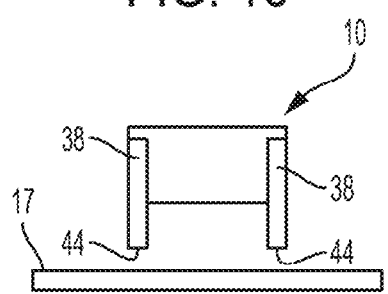
FIG. 17 illustrates a simplified front elevation view of the end of arm magnetic coupling device of FIG. 1 and a workpiece separated from the end of arm magnetic coupling device by a second separation.

In addition to detecting a presence or absence of workpiece 17, logic control circuit 23 may also provide an indication of a spacing of the workpiece engagement surfaces 44 from the workpiece 17 when the presence of a workpiece is detected (the current sensor value is below the stored "max leakage flux" for presence detection). In embodiments, logic control circuit 23, is configured to determine if at least one of the plurality of workpiece engagement surfaces 44 is proximate to the ferromagnetic workpiece 17. In one example, logic control circuit 23 determines if one of the workpiece engagement surfaces 44 is proximate to workpiece 17 when the current value for the corresponding sensor 98 falls below a threshold value. The threshold value may be determined and stored in memory 33 during a calibration run and may correspond to a known spacing between the workpiece engagement surface 44 and the workpiece 17 (see FIG. 16). In one embodiment, a plurality of threshold values is stored on memory 33, each corresponding to a respective known spacing. The plurality of stored threshold values permits logic control circuit 23 to provide better approximation of the spacing between the workpiece engagement surface 44 and the workpiece 17 and to distinguish between a first spacing (see FIG. 16) and a second, smaller spacing (see FIG. 17). An advantage, among others is that the ability to accurately determine proximity of a workpiece allows a robotic system (see FIG. 25) to move at a higher speed until magnetic coupling unit 10 is within a first spacing from workpiece 17 and thereafter move at a slower speed until contact is made with workpiece 17. In embodiments, for the various calibrations runs and values discussed herein, separate calibrations runs or values are performed for different types of ferromagnetic materials due to fact that target sensor readings may differ based on the respective size, shape, material, etc. of the target ferromagnetic workpiece.

Figure 18:
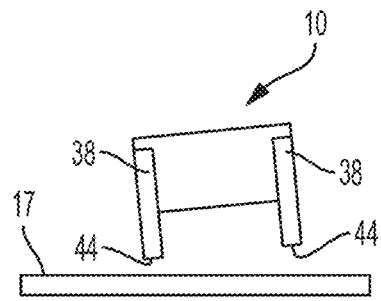
FIG. 18 illustrates a simplified front elevation view of the end of arm magnetic coupling device of FIG. 1 being tilted left-to-right relative to a workpiece.
Figure 19:
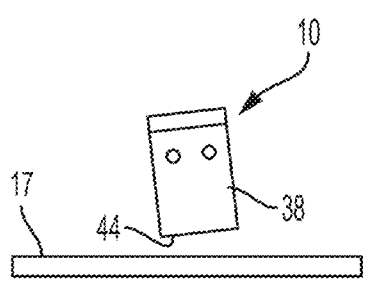
FIG. 19 illustrates a simplified front elevation view of the end of arm magnetic coupling device of FIG. 1 being tilted front-to-back relative to a workpiece.

In embodiments, logic control circuit 23 is configured to determine an orientation of the first workpiece engagement surface 44 and the second workpiece engagement surface 44 relative to the ferromagnetic workpiece 17. In one example, the orientation of the first workpiece engagement surface 44 and the second workpiece engagement surface 44 relative to the ferromagnetic workpiece 17 is determined by a comparison of an output of the first magnetic field sensor 98 and an output of the second magnetic field sensor 98. A first spacing between the first workpiece engagement surface 44 and the ferromagnetic workpiece 17 and a second spacing between the second workpiece engagement surface 44 and the ferromagnetic workpiece 17 are determined by logic control circuit 23 to be generally equal when the output of the first magnetic field sensor 98 and the output of the second magnetic field sensor 98 satisfy a first criteria. In one example, the first criteria is that the output of the first magnetic field sensor 98 is within a threshold amount of the output of the second magnetic field sensor 98. An example threshold amount is an absolute difference. In another example, the threshold amount is a percentage difference. When the first criteria is satisfied, the workpiece engagement surfaces 44 have generally equal spacing relative to the workpiece 17 (see FIG. 17). When the first criteria is not satisfied, the workpiece engagement surfaces 44 are angled relative to the workpiece 17 (see FIG. 18). If a third and fourth magnetic field sensor are incorporated, such as shown in FIG. 14, an angle about a pitch axis (see FIG. 19) may also be determined in addition to the angle about the roll axis depicted in FIG. 18.

In addition to these tool status and workpiece detection capabilities, the presence and specific location of at least two magnetic field sensors 98 in the specified location near the pole shoes 38, provides more advanced feedback. This is because situation-dependent, potentially uneven distribution of leakage flux around the individual pole extension shoes can be sampled, compared and evaluated.

In embodiments, in the on state (equally applicable to a known partial on state) of the magnetic flux source 15, if the workpiece engagement surfaces 44 of the pole extension shoe 38 with the magnets' North Poles has good contact with a workpiece 17, but the pole extension shoe 38 with the magnets' South Poles has poor contact with the workpiece 17 (see FIG. 20), there will be more leakage flux on the South Pole than the North Pole. The first magnetic field sensor 98 above the North Pole and the first magnetic field sensor above the South Pole 98 are able to detect this condition, and the sensor 98 above the South Pole will return a higher reading than the sensor 98 above the North Pole. In one example, bidirectional Hall Effect sensors are used for sensors 98. Therefore, by reading each sensor 98 separately and comparing the readings between them, logic control circuit 23 is able to determine that the South Pole has poor contact on the workpiece 17. In embodiments, the logic control circuit has a functional block to perform such evaluation, implementable in hardware and microprocessor software. In one example, logic control circuit 23 determines the South Pole has poor contact when a difference in the readings of the North Pole sensor 98 and the South Pole sensor 98 exceed a stored threshold amount.

Figure 21:
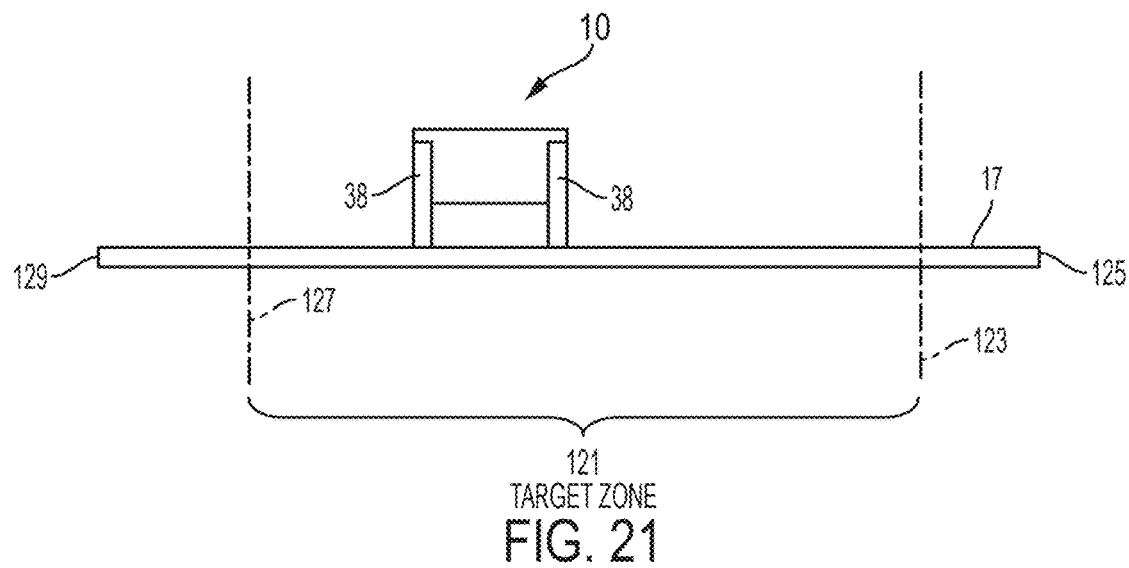
FIG. 21 illustrates a simplified front elevation view of the end of arm magnetic coupling device of FIG. 1 contacting a central portion of a workpiece.

In embodiments, logic control circuit 23 is configured to determine if a placement of the first workpiece engagement surface 44 and the second workpiece engagement surface 44 relative to the ferromagnetic workpiece 17 are within a target zone 121 on the ferromagnetic workpiece 17 (see FIG. 21). In one example, the placement of the first workpiece engagement surface 44 and the second workpiece engagement surface 44 relative to the ferromagnetic workpiece 17 are determined by logic control circuit 23 to be within the target zone 121 (FIGS. 21-23) of the ferromagnetic workpiece 17 when both an output of the first magnetic field sensor 98 satisfies a first criteria and an output of the second magnetic field sensor 98 satisfies a second criteria. An exemplary first criteria is that the output of the first magnetic field sensor 98 is within a first range of magnetic flux values and an exemplary second criteria is the output of the second magnetic field sensor 98 is within a second range of magnetic flux values.

Figure 22:
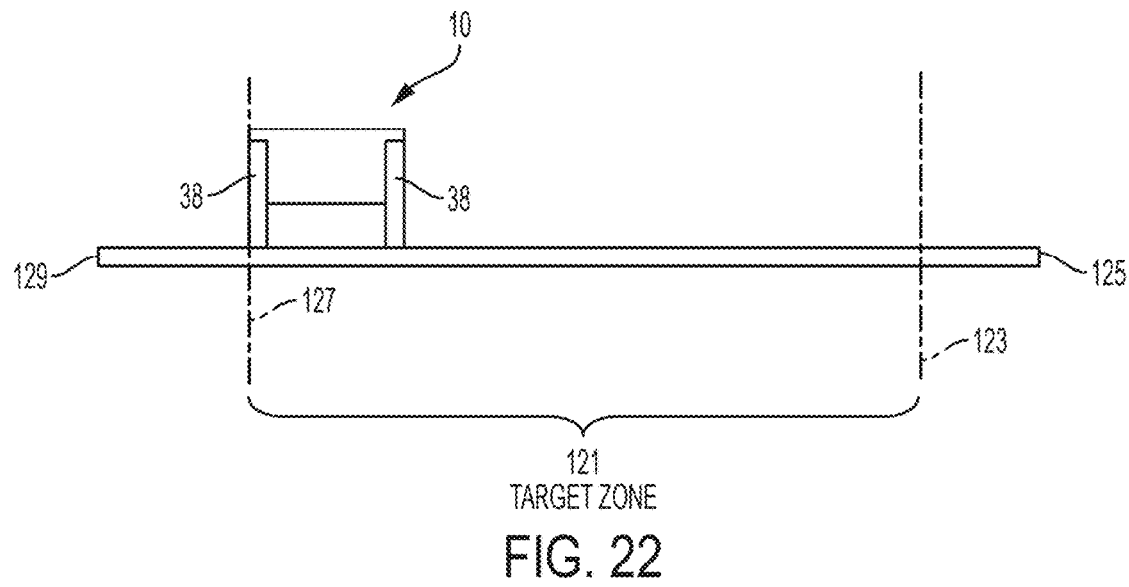
FIG. 22 illustrates a simplified front elevation view of the end of arm magnetic coupling device of FIG. 1 contacting a workpiece at a first limit position.
Figure 23:
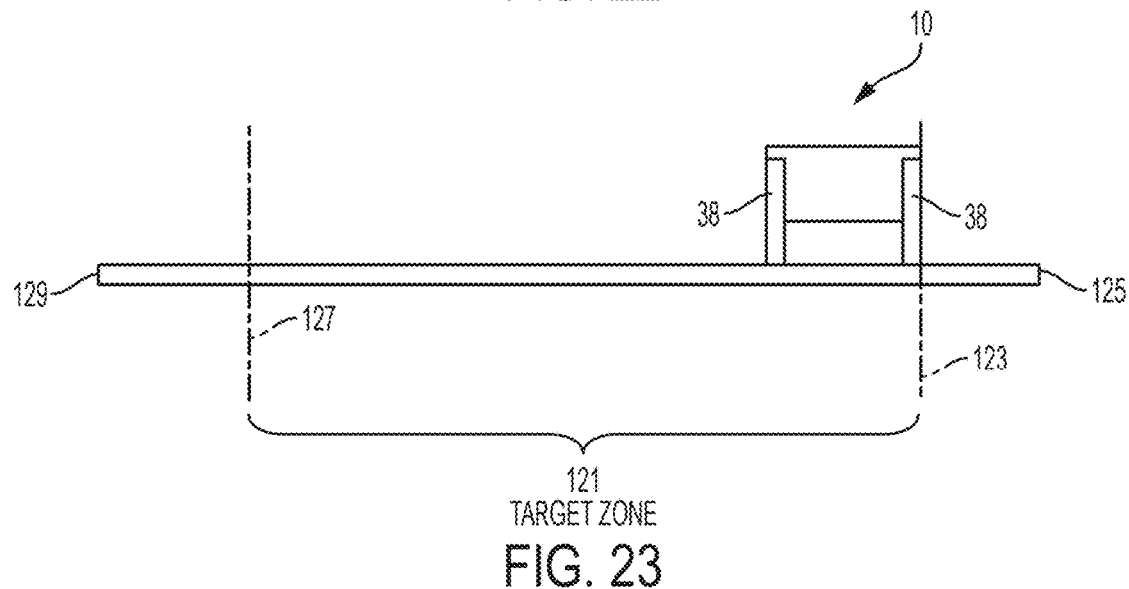
FIG. 23 illustrates a simplified front elevation view of the end of arm magnetic coupling device of FIG. 1 contacting a workpiece at a second limit position.

Referring to FIGS. 21-23, target zone 121 is illustrated. Workpiece 17 is illustrated as a sheet of material having a right end 125 and a left end 129. Target zone 121 is the portion of workpiece 17 between a first offset 123 from the right end 125 of workpiece 17 and a second offset 127 from the left end 129 of workpiece 17. In one example, as tool 10 approaches and/or exceeds second offset 127, the leakage flux associated with the left pole extension shoe 38 is higher than the leakage flux associated with the right pole extension shoe 38 due to the left pole extension shoe approaching left end 129 of workpiece 17. In similar fashion, as tool 10 approaches and/or exceeds first offset 123, the leakage flux associated with the right pole extension shoe 38 is higher than the leakage flux associated with the left pole extension shoe 38 due to the right pole extension shoe approaching right end 125 of workpiece 17. Although shown as a linear target zone 121, a two-dimensional target zone 121 may be defined for a length and a width of workpiece 17. In one example a calibration run is executed wherein tool 10 is placed at each of first limit 123 (see FIG. 23) and second limit 127 (see FIG. 22) and the corresponding leakage flux values for the magnetic flux sensors 98 at both limits are stored in memory 33. The two leakage flux values stored for the first limit position (see FIG. 23) are stored in memory 33 as "Limiting Position 1" (two values, one for each sensor 98). The two leakage flux values stored for the second limit position (see FIG. 22) are stored in memory 33 as "Limiting Position 2" (two values, one for each sensor 98). In embodiments, the first range of the first criteria are the values between and including Limiting Position 1 and Limiting Position 2 for one of the magnetic field sensors 98 and the second range of the second criteria are the values between and including Limiting Position 1 and Limiting Position 2 for the other of the magnetic field sensors 98. Assuming the first range of values correspond to the left side sensor 98 of unit 10 and the second range of values correspond to the right side sensor 98 of unit 10, logic control circuit 23 determines that a left end of the tool 10 is positioned outside of the target zone 121 when the second criteria is satisfied and the first criteria is not satisfied and likewise that a right end of the tool 10 is positioned outside of the target zone 121 when the first criteria is satisfied and the second criteria is not satisfied.

In embodiments, using (storing) 'Limiting Position 1' and Limiting Position 2' calibrated values on memory 33 allows a tool user to calibrate the workpiece present signal to only come on when a specific magnetic work circuit is formed (if calibrated as the same position) or within a range of magnetic working circuits (if calibrated as 2 different positions). The North and South pole signal positions can either be the equivalent of the "max leakage" position of Limiting Position 1/2 or it can be outside of that in a greater leakage position. These calibrations are what allow for so called double blank detection (DBD) and part specific or range specific confirmation. The freedom for the North and South pole positions to be outside of the limiting positions is intended to give the user more freedom, especially if they are landing near edges on thinner steel sheets.

In embodiments, it is also possible to use this multisensory approach to provide additional tool status data. In the above situation, beyond just comparing the two sensor readings to determine a general state of the tool and the presence or absence of a workpiece in proximity of the workpiece engagement surfaces of the pole extension shoes, by taking more differentiated and precise magnetic field measurements from each sensor when in closer proximity to the workpiece (i.e. presence already detected, but proximity not yet quantified) and performing calculations on the value of each sensor's signal and the value of the difference between the magnetometer readings, one can determine the orientation of the tool relative to the workpiece, such as what angle a magnet gripper including the tool 10 is sitting relative to a flat steel workpiece.

Taking this even further, using calibration runs of tool 10 with respect to a predefined workpiece having known parameters (size, shape, material, etc.) and by storing into memory of the evaluation circuit data obtained from processing of sensor output signals during the various calibration runs, it is possible to completely determine the orientation and distance to a workpiece target surface relative to the EOAMT position, even before the pole extension shoes contact the workpiece, in particular if additional magnetic field sensors are placed in locations other than the ones previously specified, such as shown in FIG. 14. As the unit 10 emits leakage flux in any state, even the off state, very sensitive sensors can respond to small variations in the leakage flux emanating from the pole shoes at the sensor detection surfaces in the off state. When an EOAMT in the off state or a known partial on state approaches a workpiece, then, adequately sensitive magnetometers can indicate proximity to component, and can deliver signals which are converted into control signals for the robotic arm in acting as a sort of "vision" for an otherwise blind robot.

For example, assuming that a total of four magnetometers are present, one at the flux detection surface of the North pole shoe and one at the flux detection surface of the South pole shoe associated with the magnetic flux source, as previously noted, and two additional sensors at other locations, such as shown in FIG. 14, when moving the EOAMT towards the workpiece with one of the sensors moving closer (in absolute terms) than the others, leakage flux lines near that sensor would increase in density, focusing themselves toward the workpiece. In bringing the EOAMT even closer to the workpiece (without changing spatial attitude and translational direction of the housing component coupled to the end of the arm of the robot, the flux lines would redistribute more intensely across the housing component, with the density of flux lines on the nearest sensor being inversely proportional to the distance between the sensor and the workpiece. This produces an even higher reading in the magnetometer over the close-proximity sensor. By comparing the close proximity magnetometer output to the signal output from the other 3 magnetometers, and by evaluating the data one can tell where and how close the workpiece is to the working faces of the EOAMT, given the known spatial relationships between the sensors and the working face of the pole extension shoes.

In performing accurate calculations on the outputs of the magnetometers of the EOAMT, other functionalities can be enabled when the magnetic flux source is switched on and contact is established with the workpiece. There is a direct relationship between the amount of magnetic flux in a working magnetic circuit, and the amount of physical force that the working magnetic circuit can withstand, which in the case of a magnetic coupling tool corresponds to the tool's payload. As the leakage flux from a permanent magnet depends on how much of the magnetic flux is 'consumed' (i.e. bound) in the primary working circuit, there is a correlation between the leakage flux and the maximum payload that can be sustained by the coupling tool. The microprocessor of the logic control circuit 23 is programmed, in one embodiment, with the appropriate formulae and calibration runs can be performed such that the combined readings of the magnetometers on the tool can be used to derive a more exact holding force of the EOAMT than with known devices. This could be used as a "safety check," to make sure that the EOAMT is able to lift the workpiece before being moved by the robot.

In all of these situations, the microprocessor of the logic control circuit 23 is responsible for accepting input from each of the magnetometers 98 of the EOAMT and performing calculations and comparisons. The microprocessor then determines various tool states based upon the calculations. In embodiments, tool 10 communicates the determined tool states and feedback points to an external robot controller 770 (see FIG. 25). This is handled by either the 24V I/O or a communications module 39. Once the feedback has been communicated to the robot controller 770, the robot controller 770 is then able to adjust an orientation of tool 10 and operation to address challenges or issues in operation.

It will be appreciated that the logic control circuit 23 comprises the required components to perform isolation, filtering and amplification of signals provided by the sensors for processing by the on-board microprocessor of the EOAMT 10.

In embodiments, the EOAMT 10 incorporates input devices 41 and output devices 43. Exemplary input devices include buttons, switches, levers, dials, touch displays, soft keys, and communication module 39. Exemplary output devices include visual indicators, audio indicators, and communication module 39. Exemplary visual indicators include displays, lights, and other visual systems. Exemplary audio indicators include speakers and other suitable audio systems. In embodiments, tool 10 includes simple visual status indicators, in the form of one or more LEDs positioned behind LED window 106, which are driven by the microprocessor of logic control circuit 23, to indicate when a predefined Tool status is present or absent (e.g. Red LED on when magnetic flux source 15 is off, Green LED blinking fast when magnetic flux source 15 is on and proximity of target 17 is detected, Green LED slower blinking with Yellow LED on when contacting target 17 outside intended specific area 121 on target 17 (e.g. partially complete magnetic working circuit) and Yellow LED off with steady Green LED on, showing tool engagement within threshold limits, showing safe magnetic coupling state.

Referring to the FIGS. 1-29, additional details regarding embodiments of tool 10 are provided. Referring to FIGS. 1 and 2, an embodiment of tool 10 is illustrated that can be integrated as an end of arm tool in a robotic material handling apparatus 700 (see FIG. 25) by way of fastening structures 12, 14 which in this case are threaded bores and a dowel bore in a housing component of tool 10 adapted to receive fastening bolts (not shown). Other arrangements/ interfaces for securing tool 10 to a robotic arm 704 of robotic system 700 or other type of positioning apparatus are known to the skilled person.

Tool 10 incorporates magnetic field detection sensors 98, as well as, an on-board sensor output signal processing circuit with integrated microprocessor, logic control circuit 23, which in turn provides a variety of tool status information data that can be displayed visually and/or used by a controller 770 of robotic system 700 to determine whether the tool 10 is in an on state, a partial on state, or off state; whether the tool 10 has been positioned correctly (within predefined thresholds) on a target zone 121 of a workpiece 17 (see FIG. 21); whether a safe magnetic working circuit has been established between tool 10 and target workpiece 17; and also to assist in positioning tool 10 by the robotic arm 704.

Tool 10 includes two subassemblies, a switchable permanent magnet assembly 16 and an actuator and electronic sensor and feedback assembly 18. FIG. 3 is an exploded view of the entire tool 10, whereas FIGS. 4 and 5 respectively show the permanent magnet assembly 16 and the actuator 54 and electronic sensor and feedback assembly 18.

Figure 4:
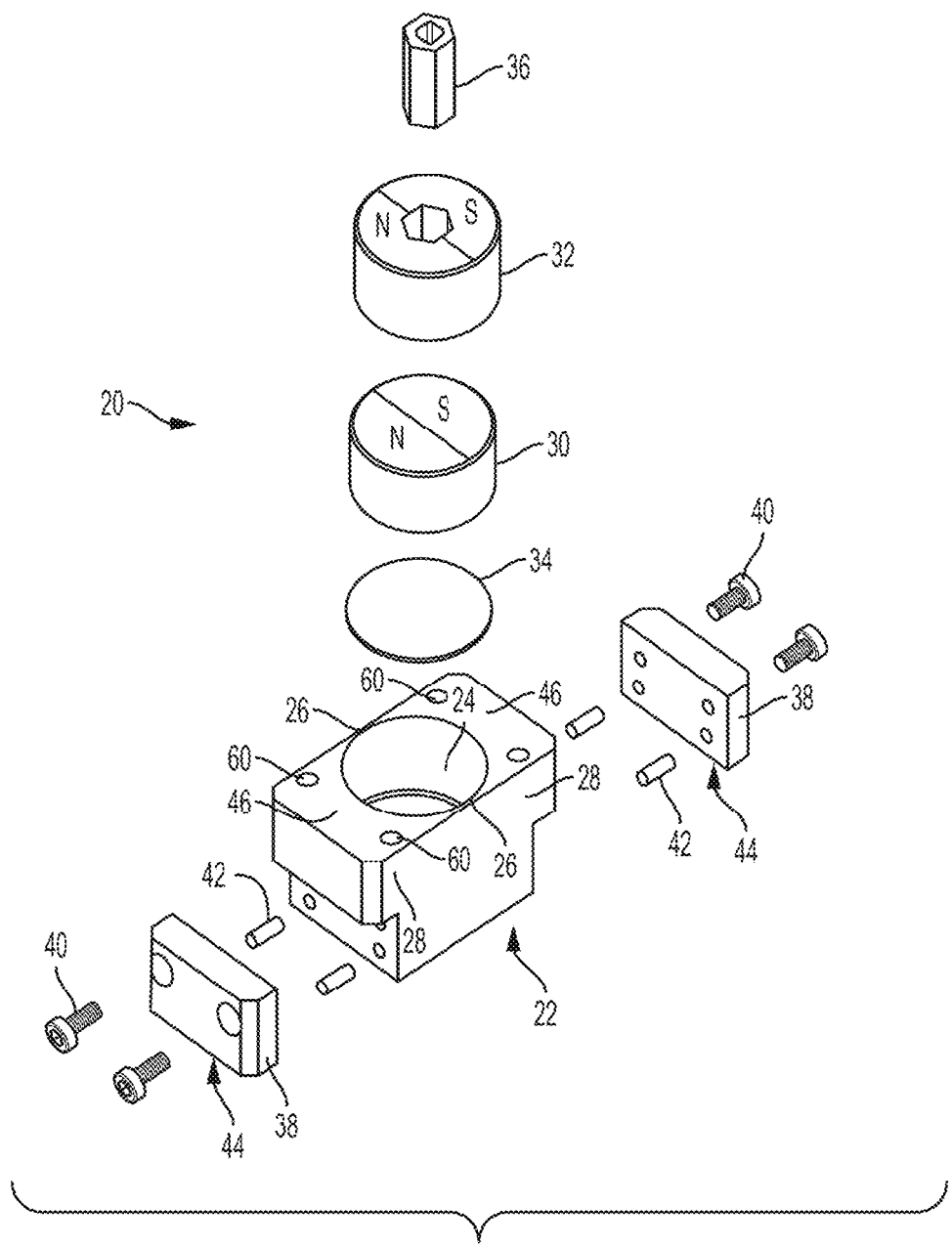
FIG. 4 illustrates an exploded perspective view of an exemplary switchable permanent magnet unit, a magnetic flux source, and replaceable pole extension shoes of the end-of-arm magnetic coupling tool of FIG. 1.

Referring to FIG. 4, an embodiment of a switchable permanent magnet device 20 as described in U.S. Pat. No. 7,012,495 (Magswitch), the entire disclosure of which is expressly incorporated by reference herein for all purposes, is illustrated. Switchable permanent magnet device 20 is a modified version of an AR type Magswitch unit as manufactured and sold by Magswitch Technology Inc. Device 20 includes a ferromagnetic steel housing 22, illustratively of rectangular foot print, essentially a unitary rectangular prismatic body with an upper portion whose width is larger than a lower portion with both portions having the same depth. In one embodiment, housing 22 is a multi-piece housing. A circular bore 24 extends axially from the bottom to the top of housing 22, with its axis coinciding with the intersection of the width and depth symmetry planes of housing 22, so that a small web 26 of material is left standing on opposite depth ends of housing 22, which subdivide housing 22 in essentially magnetically isolated portions along the height of housing 22. The wall thickness of the width-ward housing portions 28 is substantial and sufficient to fully carry magnetic flux provided by two cylindrical, diametrically magnetized rare earth permanent magnets 30, 32 which are received in bore 24. A shunt plate 34 is inserted to close the bottom end of bore 24. Bottom magnet 30 is fixed against rotation in bore 24 in such an orientation that the N-S pole separation plane (p) of magnet 30 bisects the web portions 26 and polarizes the opposite width-ward housing portions with the respective N- and S-polarities of the dipole magnet 30. Top magnet 32, despite having a hexagonal prism depression on its upper face to allow for hexagonal prism drive shaft 36 to be inserted into it, has ideally and as far as possible the same magnetization characteristics as lower magnet 30.

Two ferromagnetic pole shoes 38, illustratively of essentially rectangular prismatic configuration (but for chamfered edges at an outside face), of a material magnetically compatible with or the same as housing 22, are mounted to the width-ward sides at the lower portion of housing 22 to complement the shape of the upper portion of housing 22, using bolts 40 and locator pins 42. Pole shoes 38 preferably extend beyond a lower side 37 (see FIG. 3) of housing 22 but are illustratively shown as generally flush with the lower side 37 of housing 22. Pole shoes 38 define at a lower face respective workpiece engagement surfaces 44 which in the illustrated embodiment are planar but could be of different geometry and/or contoured to form fittingly abut against a target surface of a workpiece 17 to be magnetically coupled to and handled by tool 10. The fit of pole shoes 38 to the receptacles defined at the lower portion of housing 22 is such as to minimize or indeed essentially avoid magnetic circuit air gaps; in other words, the thick-walled width-ward portions of housing 22 and the pole shoes 38 together form a magnetic flux path from the magnets 30, 32 to the top and bottom axial end faces of housing 22.

As noted, the pole shoes 38 define at their lower terminal end the tool's workpiece engagement (or working) surface(s), whereas the top faces of the thick-walled width-ward portions of housing 22 define what will herein be termed flux detection surfaces 46. In absence of an external magnetic working circuit, and even when such is created, magnetic flux lines pass through both the workpiece engagement surfaces 44 at pole shoes 38 and flux detection surfaces 46 of housing 22.

For further details on such switchable permanent magnet units 20, compare Magswitch Technology technical information of its products which is publically available, including magnetic rating of Magswitch AR devices. For example, an AR 50 coupling unit has a max. workpiece break away rating of 249 kg with a safe working load of 62 Kg and safe shear load of 31 Kg, the magnets having a flux output to cause full saturation of a ferromagnetic workpiece having a thickness of 9.5 mm and a bottom face footprint area of 52×64 mm.

Figure 5:
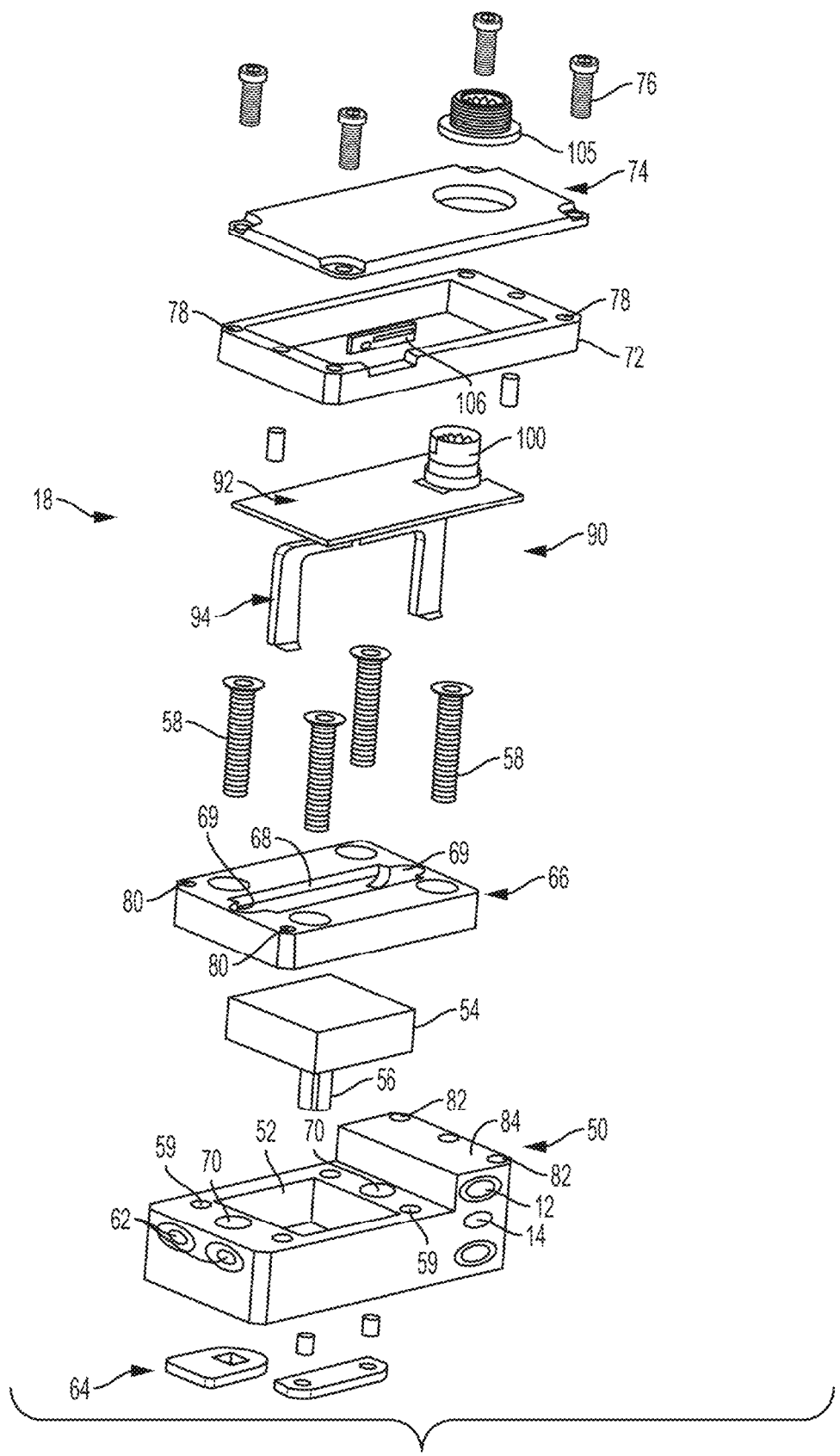
FIG. 5 illustrates an exploded perspective view of a second housing component of the end-of-arm magnetic coupling tool of FIG. 1 which houses an exemplary actuator for switching of the magnetic flux source, a plurality of exemplary magnetic field sensors for interaction with the housing and pole shoes of the magnetic flux source, and an exemplary on-board logic control circuit for delivering tool status data and indication via an exemplary output device.

Turning then to FIG. 5, the actuator and electronic sensor and feedback assembly 18 (as identified in FIG. 2) is illustrated. Referring to FIGS. 3 and 5, assembly 18 comprises a four-part housing assembly 48 whose parts serve different functional purposes.

A lower rectangular-footprint actuator housing part 50 is made (machined and/or cast) from aluminum and includes a rectangular depression 52 with a through passage opening towards the lower face of housing part 50, which serves to house a rotary actuator 54.

Rotary actuator 54 has a torque output shaft 56 which in the assembled state of tool 10, in which lower housing part 50 is hermetically secured to the top of the magnet assembly's housing 22 using four fastening bolts 58 which extend through four bores 59 in lower housing part 50 and engage with threaded bores 60 on the top face of housing 22. Torque output shaft 56 is inserted into hexagonal drive insert 36 present at the upper magnet 32. This enables actuator 54 to impart selective torque to rotate top magnet 32 in its housing 22 to turn the switchable permanent magnet device 20 between the off state, the on state, and a partial on state. Referring in this context to and as may be gleaned from FIG. 4, the lines across the upper faces of both magnets 30, 32 represent the respective separation planes of the North and South active poles of magnets 30, 32.

When the north and south poles of both magnets 30, 32 are on the same width-ward side of housing 22 such that the north pole of permanent magnet 32 completely overlaps the north pole of permanent magnet 30, device 20 is in the on state, providing flux past workpiece engagement surfaces 44 at pole shoes 38 and flux detection surfaces 46 at housing 22. When the north and south poles of both magnets are on the same width-ward side of housing 22 such that the north pole of permanent magnet 32 only partially overlaps the north pole of permanent magnet 30, device 20 is in the partial on state, providing flux past workpiece engagement surfaces 44 at pole shoes 38 and flux detection surfaces 46 at housing 22. When the north and south pole of both magnets 30, 32 are on the opposite sides (i.e. anti-aligned) such that the north pole of permanent magnet 32 completely overlaps the south pole of permanent magnet 30, the device is in the off state and flux is confined within the housing 22 and magnets 30, 32. Additional details on exemplary actuation and sensing systems are provided in U.S. Pat. No. 7,012,495, the entire disclosure of which is expressly incorporated by reference herein for all purposes.

Lower housing part 50 also includes two coupling conduits 62 through which the actuator 54 receives hydraulic or pneumatic fluid, depending on the actuator's make-up, to rotate its output shaft selectively to turn unit 20 on and off. In one embodiment, actuator 54 is an electric actuator and receives power from robotic system 700. Exemplary electric actuators include stepper motors. Reference number 64 in FIGS. 3 and 5 references a flag and hard stop that are provided to limit rotation and provide reference stops/positions for the upper magnet 32 of unit 20 in the on state and the off state rotational orientations. Retractable pins may be included to selectively provide reference stops for upper magnet 32 in various partial on states.

In embodiments, logic control circuit 23 monitors the rotational position of magnet 32 to verify that magnet 32 has been moved to the appropriate reference position for known partial on states and the on state. In examples where actuator 54 is a stepper motor, logic control circuit 23 monitors a position signal from the stepper motor and compares that to a stored position value to determine if magnet 32 in in the requested partial on or on state.

In embodiments, magnetic coupling device 10 includes a brake, such as a frictional brake which may interact with a rotatable member coupled to permanent magnet 32. The frictional brake may be actuated to maintain the current position of rotatable member and hence the current position of permanent magnet 32.

In embodiments, actuator 54 is a stepper motor and the ability of the stepper motor to hold its output shaft at a current position also holds permanent magnet 32 at a current position and hence magnetic coupling device 10 in a current state (on state, off state, partial on state).

An intermediate aluminum (or other non-ferromagnetic metallic) housing part 66 of housing assembly 48 has a rectangular footprint and is secured to the lower housing part 50 by the above-mentioned fastening bolts 58. Intermediate housing part 66 has a rectangular recess 68 with bores 69 on the width-ward ends of recess 68 extending from top to bottom, with the width-ward end bores 69 locating outside the rectangular depression 52 in lower housing part 50 and coinciding with respective cylindrical passage channels 70 that extend either from the top to the bottom face of lower housing part 50 or from the top to end a small distance from the bottom face.

On top of intermediate housing part 66 is a rectangular frame-like upper housing part 72, also made from non-ferromagnetic metal material, whose upper open end is closed by a rectangular non-ferromagnetic cover plate 74 which by way of four fastening screws 76 extending through bores 78 at the four corners of upper housing part 72 is sandwiched in sealing manner between cover plate 74 and intermediate housing part 66. It will be noted that two of the fastening screws 76 secure in threaded bores 80 on one width-ward side on the top of intermediate housing part 66, whereas the other two fastening screws 76 are seated and secured at two threaded bores 82 on a width-ward opposite side in a top block portion 84 of lower housing part 50, so that all housing parts 50, 66, 72 and 74 of housing assembly 48 of actuator and electronic sensor and feedback assembly 18 secure safely to one another.

Figure 6:
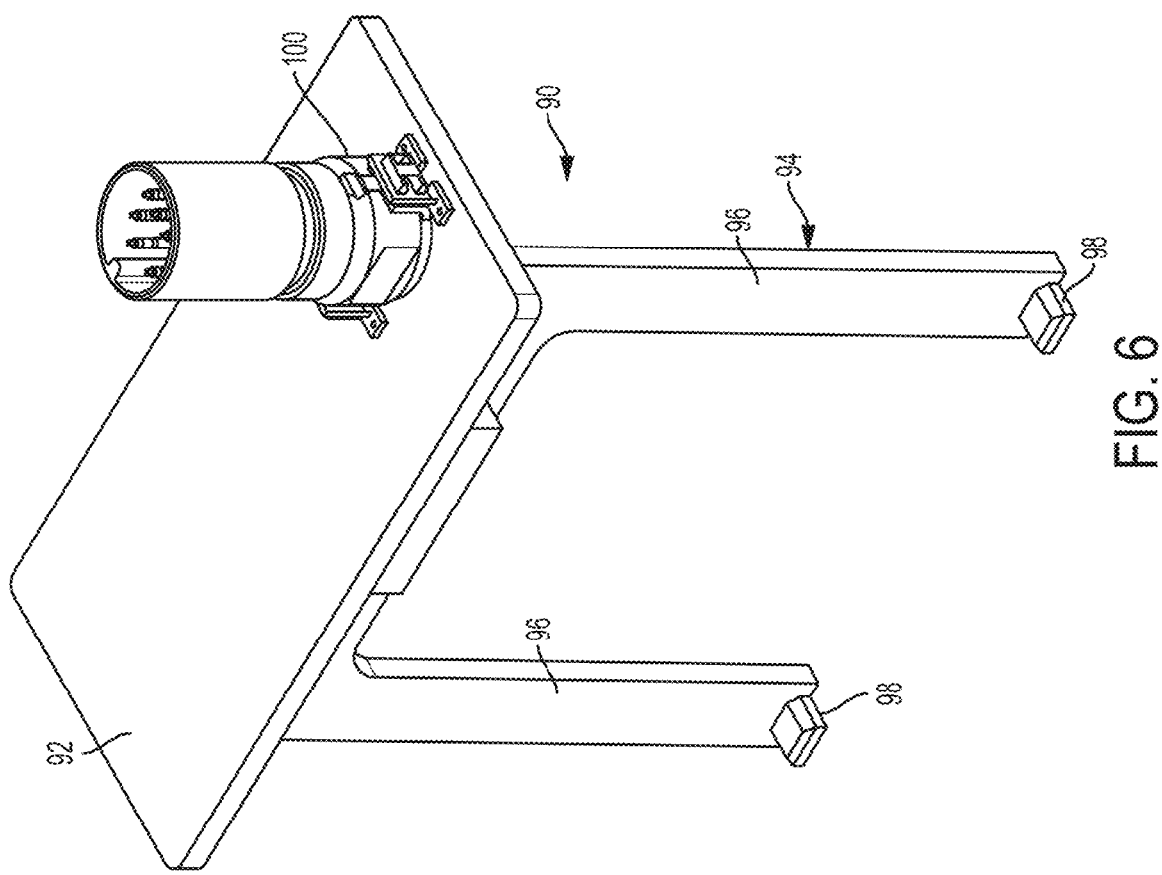
FIG. 6 illustrates a perspective view of portions of the logic control circuit of FIG. 5 including an exemplary coupled sensor printed circuit board assembly and an exemplary control logic printed circuit board with an exemplary input/output connector.
Figure 7:
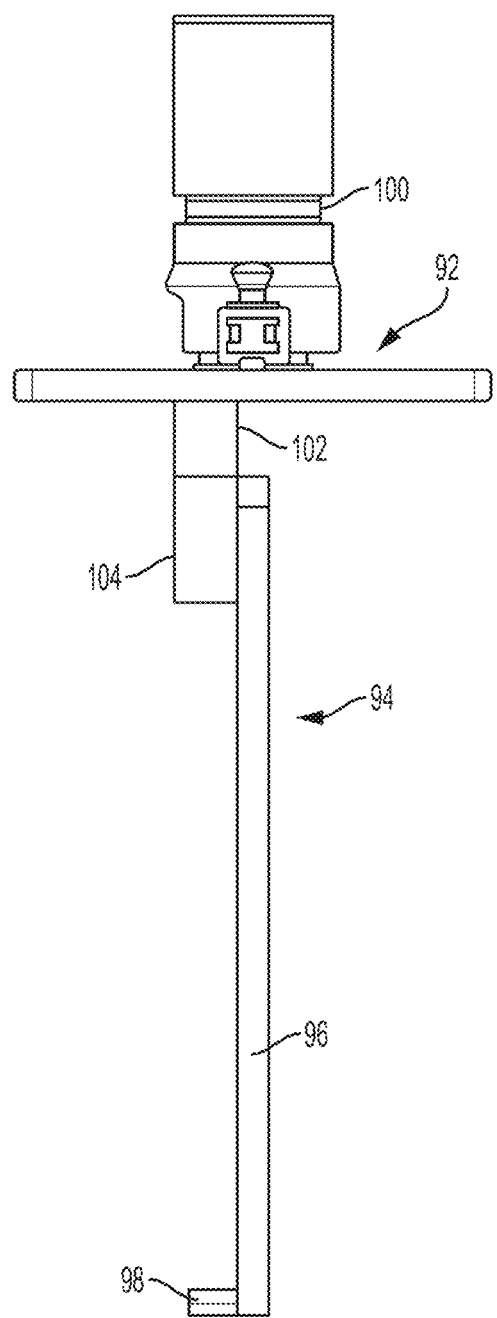
FIG. 7 illustrates a side elevation of FIG. 6.
Figure 8:
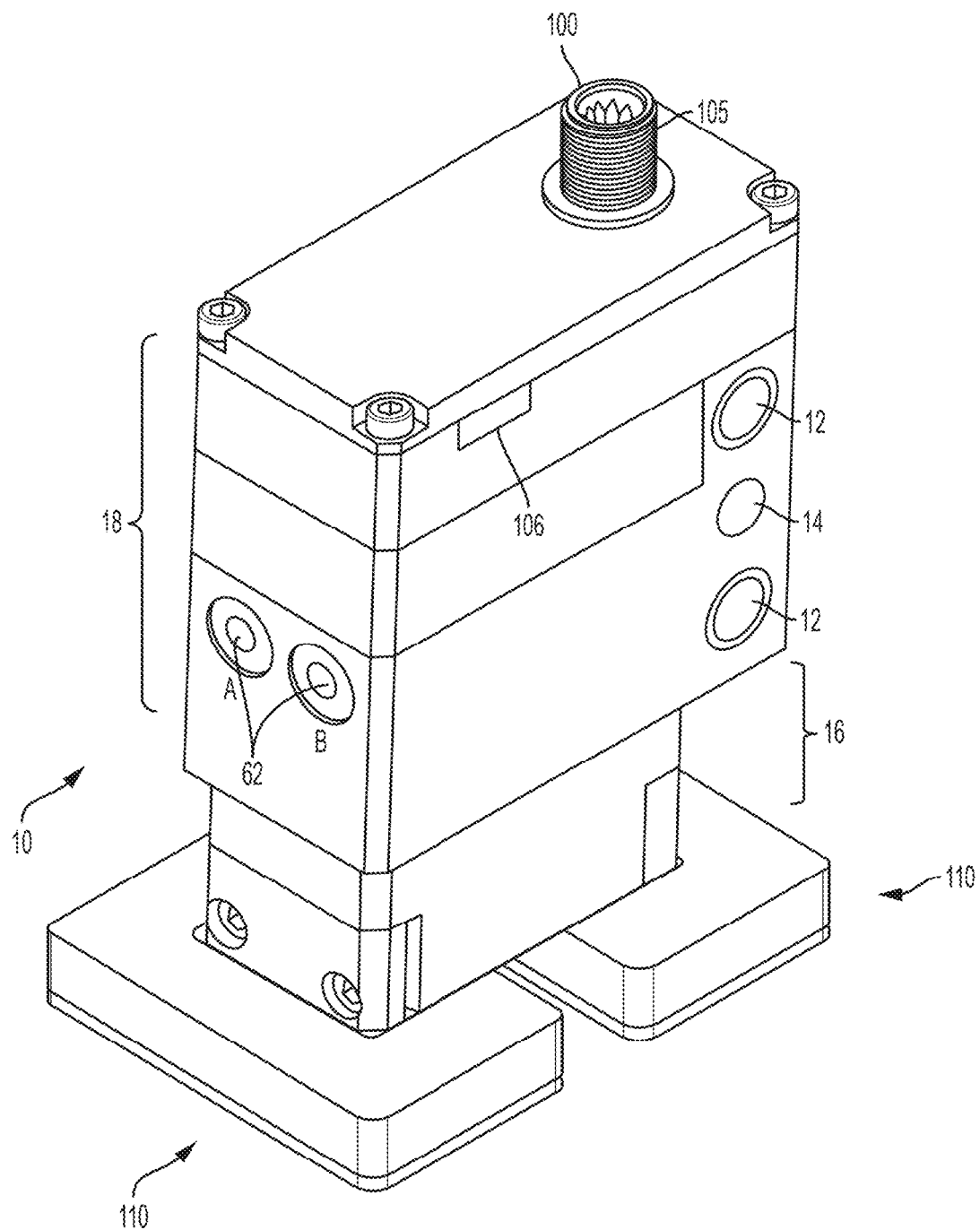
FIG. 8 illustrates a perspective view of an embodiment of the end-of-arm magnetic coupling tool of FIG. 1 including degauss capability.
Figure 9:
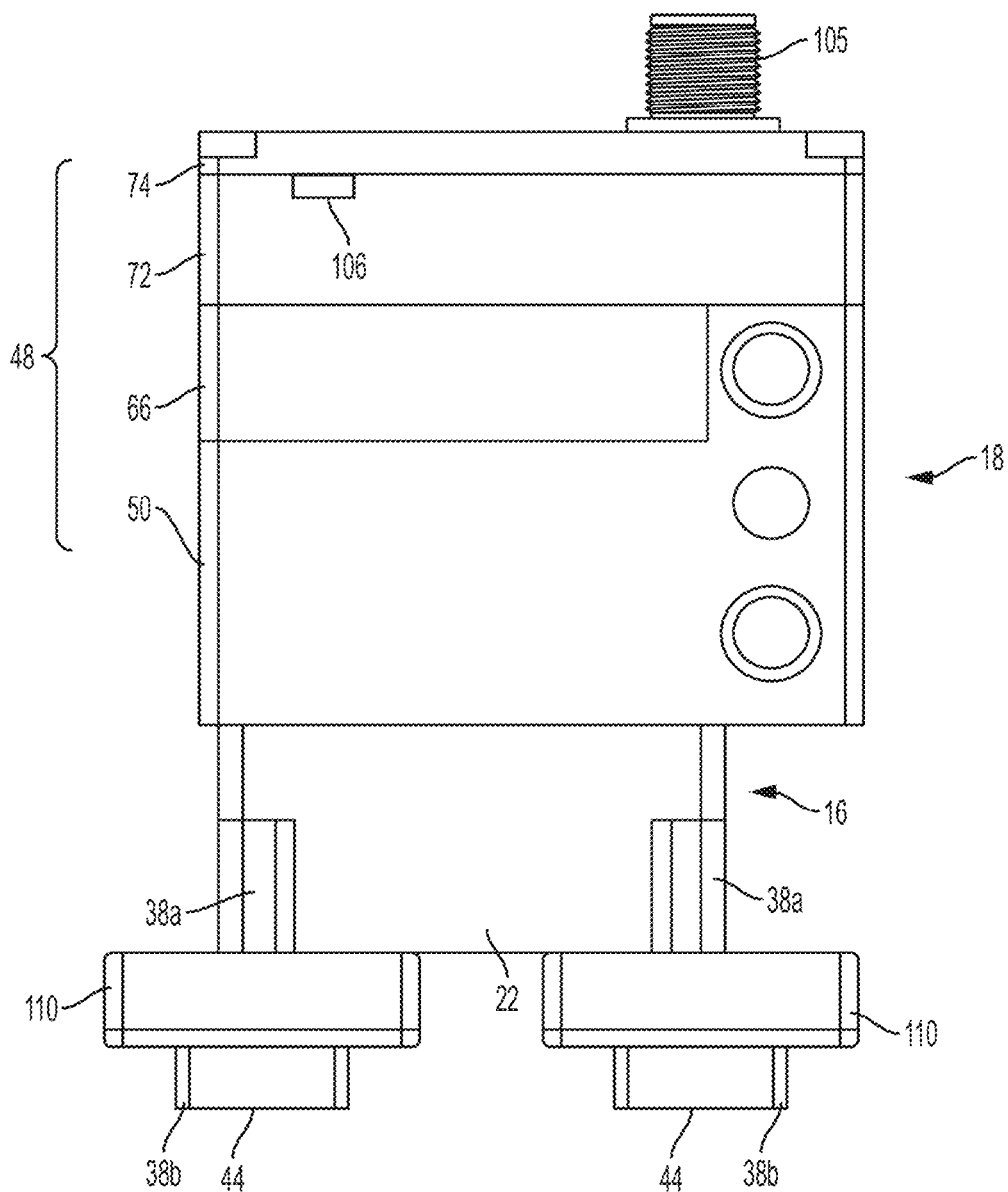
FIG. 9 illustrates a side elevation view of the arrangement of FIG. 8.

Referring to FIG. 5, actuator and electronic sensor and feedback assembly 18 further includes a magnetic field sensor and sensor signal processing circuit unit 90 which is part of logic control circuit 23 and that will now be described with reference to FIGS. 6 and 7. Unit 90 comprises two PCBs (printed circuit boards), a main control PCB 92 and a magnetometer sensor PCB 94 comprising two leg portions 96 which at their respective terminal ends each support/mount a magnetic flux sensor 98 of Linear Hall Effect type as mentioned above.

Main control PCB 92 includes a microcontroller (not illustrated separately), an M12 electronic connector 100 for interfacing I/O signals to/from the sensors and microcontroller with external equipment, and a board-to-board connector 102 on its underside for coupling with a complimentary board-to-board connector 104 located in the horizontal leg of PCB 94; connector 102 and 104 serve, beyond providing a mechanical connection between the PCBs, to conduct signals between electronic components on the respective boards, as is known in industry.

Referring to FIG. 3, main control PCB 92 will locate and be secured in the assembled state of upper housing assembly 48 within frame-like upper housing part 72, the board-to-board connectors 102 and 104 will come to locate within the rectangular through-passage 68 of intermediate housing part 66, and the leg portions 96 of magnetometer sensor board PCB 94 will extend past rectangular through-passage 68 of intermediate housing part 66 into the two cylindrical passage channels 70 in lower housing part 50. The overall arrangement ensures that the Hall Effect sensors 98 of PCB 94 will come to be securely located in a defined position a small distance away from the flux detection surfaces 46 of housing 22. In essence, this arrangement ensures that one magnetic flux sensor 98 of magnetometer sensor board PCB 94 is positioned over the North Pole of the switchable permanent magnet device 20 (one of the pole extension shoes 38), and the other sensor 98 is positioned over the South Pole (one of the pole extension shoes 38).

The magnetic field sensor and sensor signal processing circuit unit 90 has a layout and electronic components that allow magnetic flux signals to be sent electrically from sensors 98 to the microcontroller/processor on the main PCB 92 where these signals can be conditioned and information embedded in the signal can then be processed by the microcontroller through a series of algorithms to provide tool state feedback via an M12 electronic connector 100 which is secured to cover plate 74 using M12 pressed screw connector 105 used for attaching an M12 cable assembly to the M12 electrical connector 100 linked to the microcontroller.

Main PCB 92 may incorporate one or more output devices 144, illustratively LEDs, that receive status signals from the microcontroller/processor to provide a visual representation of certain tool states, beyond using the signals for an external control device. These tool states can be appreciated visually by an operator through an LED window 106 present in a wall of the frame-like upper housing part 72. The tool states will in any event include: magnet unit 20 of switchable permanent magnet assembly 16 on or off, North Pole pole shoe 38 (i.e. its workpiece engagement surface 44) on target or not (within settable thresholds, as explained below), which is indicative of the north pole shoe having a good magnetic hold on the workpiece), South Pole pole shoe 38 (i.e. its workpiece engagement surface 44) on target or not (within settable thresholds, as explained below), which is indicative of the south pole shoe having a good hold on the workpiece), and workpiece presence with overall good pull force exertion (both pole have good contact on the workpiece).

In an exemplary embodiment, the following operations were handled by tool 10: (1) Microprocessor (having an ADC unit) used to read magnetic sensor values; (2) Microprocessor used to read multiple sensors values; (3) Sensor readings used to light up tool status indication LEDs at certain sensor values; (4) Sensor readings used to light up an LED for the tool being On/Off; (5) an averaging function was created on the microprocessor to averages the sensor values; (6) A calibration function was created incorporating the averaging function to determine the on values for the sensors; and (7) The calibrated values from the calibration function were used to determine if the poles were off target, outside the target zone 121. In this exemplary embodiment of the EOAMT 10, a STM320F038 Discovery board was initially used followed by a custom designed main PCB board using STM32F030R8T6, and software coded and uploaded into memory of the processor, to perform the tool's functional settings, including calibration of the tool's sensors and controller.

An exemplary calibration procedure for the tool 10 includes placing the tool with its two workpiece engagement surfaces 44 against a workpiece 17 to be handled by the tool 10, in varying positions, multiple sampling of magnetic field sensor data at the sensors 98 located in close proximity to the flux detection surfaces 46 of the magnet unit's housing for each of the varying positions, averaging of sampled data, and storing threshold values in memory 33 against which live sensor data sampled during operation of the tool can be compared to determine tool status. To this end, the STM320F038 Discovery board was configured to allow toggling of data input. A three-step calibration procedure then includes, in the specified order:

1. Toggle the calibration input of input devices 41 (see FIG. 13).
    a. Now the tool is in calibration mode.
    b. Wait for the power LED to stop flashing.
2. Place the tool with its workpiece engagement surfaces against a workpiece with 'ideal' contact and turn on the magnetic flux unit to an on state or alternatively to a known partial on state.
3. Toggle the calibration input.
    a. Wait for the power LED to stop flashing.
    b. Once the power LED stops flashing, turn off the magnetic flux unit of the tool.
4. Orient the tool with its workpiece engagement surfaces on the workpiece so that the S-Pole pole shoe is at the extent of what a tool operator (user) wants to be the on-target value and turn the unit on to an on state or alternatively to a known partial on state.
5. Toggle the calibration input.
    a. Wait for the power LED to stop flashing.
    b. Once the power LED stops flashing, turn off the tool's magnetic flux source.
6. Orient the tool on the part so that the N-Pole pole shoe is at the extent of what the user wants to be the on-target value and turn the unit on to an on state or alternatively to a known partial on state.
7. Toggle the calibration input.
    a. Wait for the power LED to stop flashing.
    b. Once the power LED stops flashing, turn off the unit.
8. Once the power LED stops flashing, the tool will go back into sensing mode.

At this point in time, the state outputs of the tool should be functioning properly for the on state or known partial on state that was calibrated. If this is not the case, repeat the calibration steps.

Sensitivity inputs can be added to the firmware as well so that the user can adjust to be more or less sensitive from the calibrated values.

Another functionality which the tool with its on-board sensor array and signal processing logic can deliver is a so-called 'double blank' monitoring functionality, which is useful when magnetic coupling device 10 is used to de-stack ferromagnetic sheet blanks or partially shaped sheet material components from a staple (e.g. for transfer of the blanks between or to a blank drawing or molding station). This functionality includes a calibration of the tool as follows:

1. Toggle the calibration input.
    a. Now the user is in calibration mode.
    b. Wait for the power LED to stop flashing.
    c. Place the tool with its pole shoes on one sheet of steel with ideal contact and turn on to an on state or alternatively to a known partial on state the magnetic flux source of the tool (Note: this step is required each time the user changes sheet material thicknesses).
2. Toggle the calibration input.
    a. Wait for the power LED to stop flashing.
    b. Once the power LED stops flashing, turn off the unit.
3. Once the power LED stops flashing, the tool will go back into normal sensing mode.

At this point in time, the state outputs of the tool should be functioning properly. If this is not the case, repeat the calibration steps. If in a subsequent operation, the sensed leakage flux for the calibrated on state or partial on state is less than the stored calibrated value by a threshold amount (absolute or percentage) then tool 10 may be coupled to multiple workpieces instead of a single workpiece.

As mentioned herein other configurations of magnets may be used in place of permanent magnets 30, 32. Referring to FIGS. 26-30, an exemplary switchable permanent magnet assembly 200 of the present disclosure is represented. Switchable permanent magnet assembly 200 may replace magnetic flux source 15. Further, permanent magnet assembly 200 is placed in a non-ferrous housing, as opposed to housing 22 for magnetic coupling device 10. As explained in more detail herein pole portions 250 of permanent magnet system 200 are located at a lower side of the housing and contact workpiece 17 (see FIGS. 29 and 30) or have pole extension members positioned directly below pole portions 250 and contacting workpiece 17.

Switchable permanent magnet assembly 200 includes an upper platter 212 and a lower platter 214 to be placed in housing 22. Each of platters 212 and 214 include a plurality of spaced-apart permanent magnets 230 and a plurality of pole portions 250. Each of the plurality of spaced-apart permanent magnets 230 are illustratively shown as a single permanent magnet but may comprise multiple permanent magnets and/or at least one permanent magnet positioned within a housing. Exemplary platters are provided in U.S. Pat. No. 7,161,451 and German Utility Model DE202016006696U1, the entire disclosures of which are expressly incorporated by reference herein for all purposes.

Returning to the example of FIGS. 26-30, each permanent magnet 230 has a north pole side 232 and a south pole side 234. The permanent magnets 230 and pole portions 250 of platter 212 and of platter 214 are each arranged to form a closed shape wherein one of pole portions 250 is positioned between two of permanent magnets 230. Further, the permanent magnets 230 are arranged so that each of the two permanent magnets 230 contacting the pole portion 250 therebetween have either their north pole sides or their south pole sides contacting the pole portion 250. When the north pole sides of the adjacent permanent magnets 230 are contacting a pole portion 250, the pole portion 250 is referred to as a north pole portion. When the south pole sides of the adjacent permanent magnets 230 are contacting a pole portion 250, the pole portion 250 is referred to as a south pole portion.

Each of upper platter 212 and lower platter 214 includes an equal and even number of permanent magnet 230 and an equal number of pole portions 250. In one embodiment, in each of upper platter 212 and lower platter 214, permanent magnets 230 and pole portions 250 are arranged in a circular configuration.

In embodiments, lower platter 214, like magnet 30 in tool 10, is held stationary relative to the housing containing lower platter 214 and upper platter 212, like magnet 32 in tool 10, rotates relative to lower platter 214. Upper platter 212 is rotatable in directions 290, 292 about a central axis 294 relative to lower platter 214 to alter an alignment of the permanent magnets 230 and pole portions 250 of upper platter 212 relative to the permanent magnets 230 and pole portions 250 of lower platter 214.

Switchable permanent magnet assembly 200 is considered to be in an on state when the south pole portions 250 of lower platter 214 are aligned with the south pole portions 250 of upper platter 212 and the north pole portions 250 of lower platter 214 are aligned with the north pole portions 250 of upper platter 212. In the on-state, a workpiece is held by magnetic coupling device 10 due to a completion of a magnetic circuit from the aligned north pole portions 250 of upper platter 212 and lower platter 214, through the workpiece, and to the aligned south pole portions 250 of upper platter 212 and 214.

Switchable permanent magnet assembly 200 is considered to be in an off state when the south pole portions 250 of lower platter 214 are aligned with the north pole portions 250 of upper platter 212 and the north pole portions 250 of lower platter 214 are aligned with the south pole portions 250 of upper platter 212. In the off state, a workpiece is not held by magnetic coupling device 10 due to a completion of a magnetic circuit within upper platter 212 and lower platter 214 from the aligned north pole portions 250 of upper platter 212 to the south pole portions 250 of lower platter 214 and from the aligned north pole portions of upper platter 212 to the south pole portions 250 of lower platter 214.

Switchable permanent magnet assembly 200 is considered to be in a partial on state when the south pole portions 250 of upper platter 212 are partially overlapping the north pole portions 250 of lower platter 214 and the north pole portions 250 of upper platter 212 are partially overlapping the south pole portions 250 of lower platter 214. When in the partial on state, a workpiece may be held by magnetic coupling device 10 due to a completion of a magnetic circuit from the overlapping north pole portions 250 of upper platter 212 and lower platter 214, through the workpiece 27, and to the overlapping south pole portions 250 of upper platter 212 and lower platter 214. The strength of the magnetic circuit increases as the degree of overlap of the overlapping north pole portions 250 of upper platter 212 and lower platter 214 and the overlapping south pole portions 250 of upper platter 212 and lower platter 214 increases.

Figure 26:
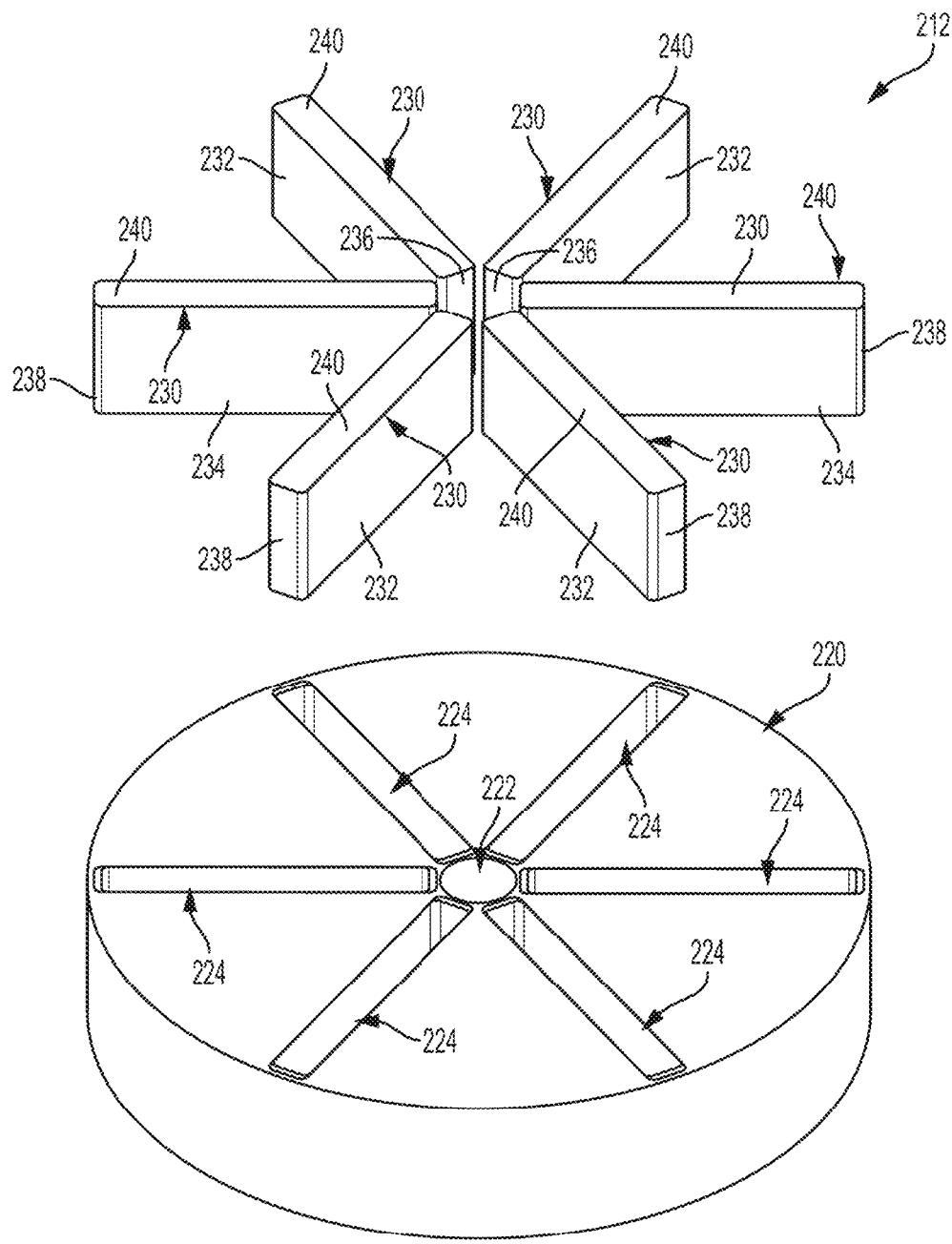
FIG. 26 illustrates an exploded, perspective view of an exemplary platter having a plurality of permanent magnets and pole portions.

Referring to FIG. 26, upper platter 212 is illustrated. Upper platter 212 includes a cylindrical base component 220 having a central aperture 222 and a plurality of radially extending apertures 224. Each of the radially extending apertures 224 is sized and shaped to receive a permanent magnet 230. Each permanent magnet 230 has a north side 232, a south side 234, a radially inward facing side 236, a radially outward facing side 238, a top 240, and a bottom.

Figure 27:
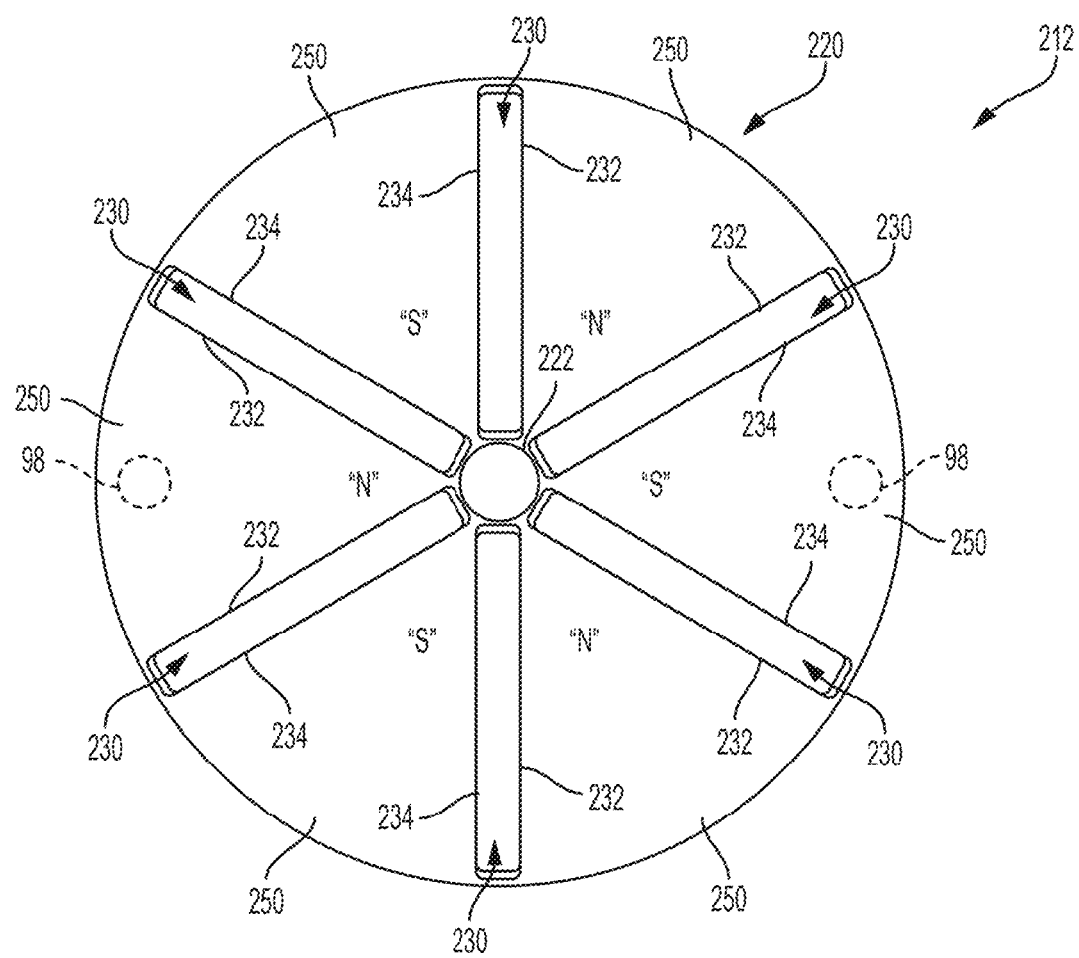
FIG. 27 illustrates a top, assembled view of the platter of FIG. 26.

Referring to FIG. 27, a top view of upper platter 212 is shown. Cylindrical base component 220 surrounds each of north sides 232, south sides 234, radially inward facing side 136, and radially outward facing side 138 of permanent magnet 230. In one embodiment, apertures 224 are not through apertures, but rather blind depth apertures from the bottom side of cylindrical base component 220 and hence cylindrical base component 220 would also surround top 240 of pole portions 250. In the illustrated embodiment, cylindrical base component 220 is a single integral component. In one embodiment, cylindrical base component 220 is comprised of two or more components joined together.

As shown in FIG. 27, permanent magnets 230 are arranged so that the north sides 232 of adjacent magnets are facing each other and the south sides 234 of adjacent magnets 230 are facing each other. This arrangement results in the portions 250 of cylindrical base component 220 between permanent magnet 230 to act as pole extensions for permanent magnet 230. In embodiments, base component 220 and hence pole portions 250 are made of steel. Other suitable ferromagnetic materials may be used for base component 220.

Figure 28:
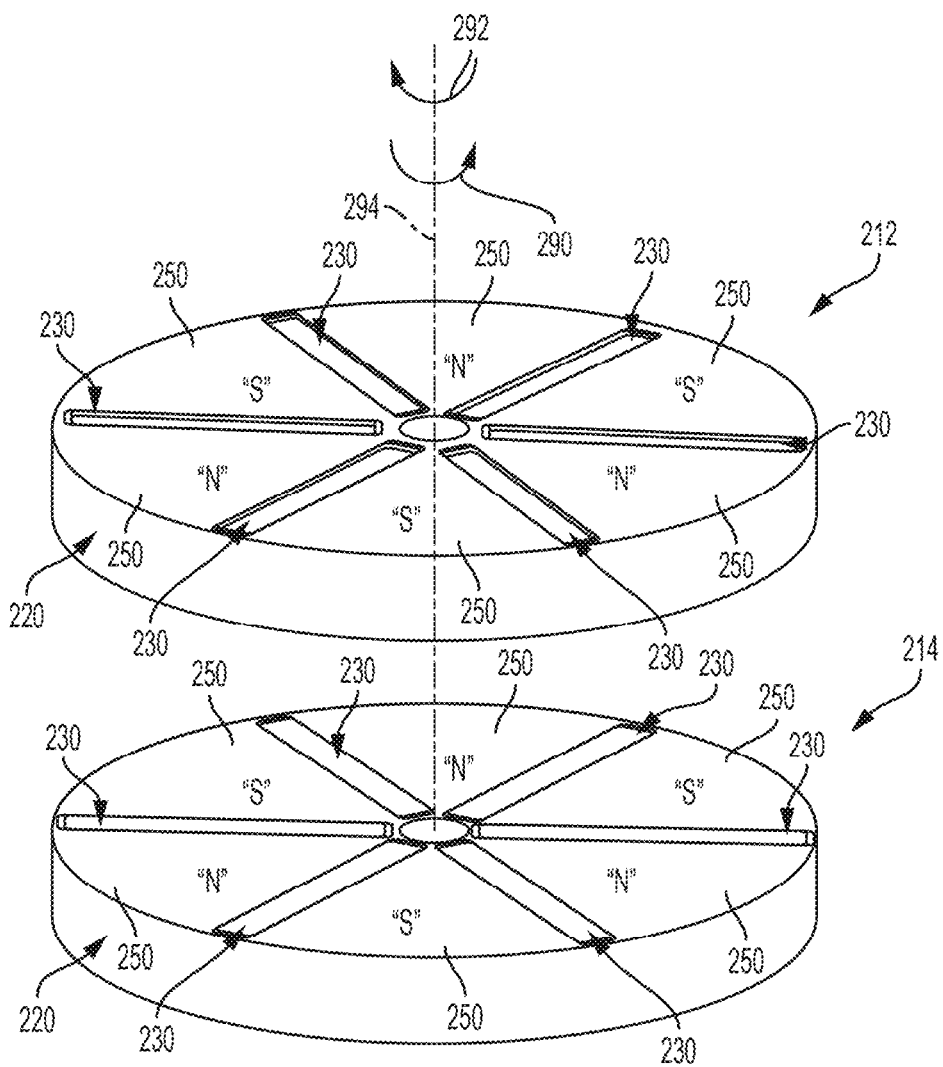
FIG. 28 illustrates a perspective view of the two instances of the platter of FIG. 26.

Referring to FIG. 28, upper platter 212 is shown exploded relative to lower platter lower platter 214. Lower platter 214 is generally identical to upper platter 212. Upper platter 212 may be rotated relative to lower platter 214 to place switchable permanent magnet assembly 200 in an on state, a partial on state, or an off state.

Figure 29:
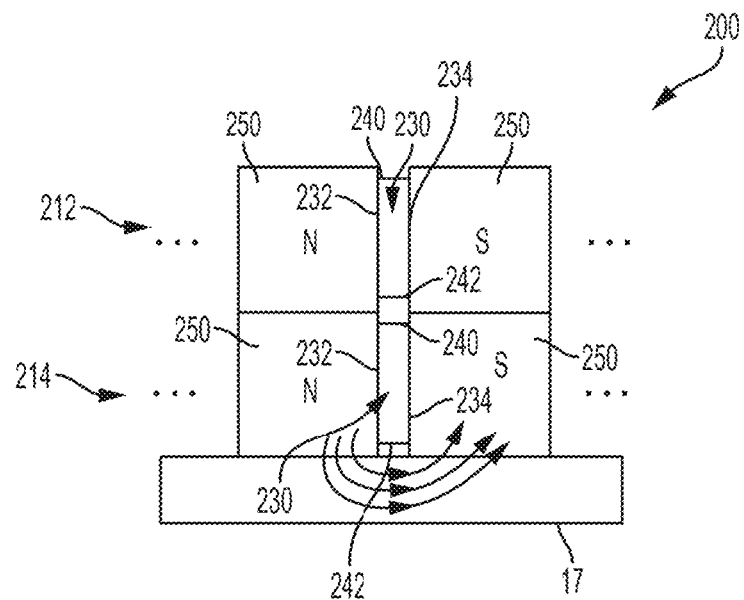
FIG. 29 illustrates the two platters of FIG. 28 oriented in an on state.

Referring to FIG. 29, upper platter 212 and lower platter 214 are arranged in an on-state wherein the south pole portions 250 of upper platter 212 are adjacent the south pole portions 250 of lower platter 214 and the north pole portions 250 of upper platter 212 are adjacent the north pole portions 250 of lower platter 214. In the on-state, a workpiece 27 being made from a ferromagnetic material is held by magnetic coupling device including the upper and lower platters 212, 214 due to a completion of a magnetic circuit from the aligned north pole portions 250 of upper platter 212 and lower platter 214, through the workpiece 27, and to the aligned south pole portions 250 of upper platter 212 and lower platter 214. The lower surfaces of north and south pole portions 250 form the workpiece contact interfaces. Alternatively, instances of pole shoes 38, although of different shape than in FIG. 1, may positioned between the lower surfaces of north and south pole portions 250 and the workpiece 17 to provide the workpiece contact interfaces 44 with workpiece 17. Further, sensors 98 may be positioned adjacent various ones of north pole and south pole portions 250. In embodiments, at least one of the north pole portions 250 and at least one of the south pole portions 250 has a sensor 98 associated therewith to monitor the leakage flux associated with the respective north pole portion and the respective south pole portion. As shown in FIG. 27, a first sensor 98 may be placed proximate to a north pole portion 250, such as directly over north pole portion 250 or radially outward of north pole portion 250, and a second sensor 98 may be placed proximate to a south pole portion 250, such as directly over south pole portion 250 or radially outward of south pole portion 250. Logic control circuit 23 may perform calibration runs for permanent magnet assembly 200 in a similar fashion as described herein for magnetic coupling device 10 to store sensor values for determining operating states of the device including permanent magnet assembly 200. Additional types of workpiece contact interfaces that may be used in the embodiments disclosed herein are provided in International Application No. PCT/US2019/015541, filed Jan. 29, 2019, titled MAGNETIC LIFTING DEVICE HAVING POLE SHOES WITH SPACED APART PROJECTIONS, the entire disclosure of which IS expressly incorporated by reference herein for all purposes.

Figure 30:
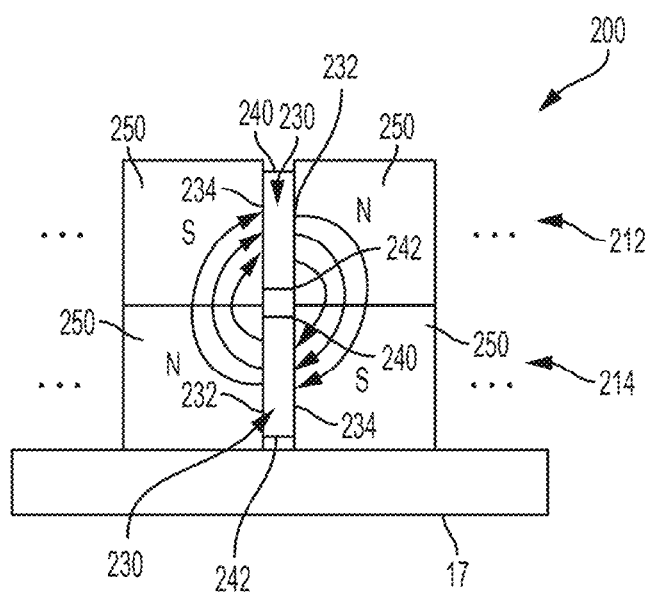
FIG. 30 illustrates the two platters of FIG. 28 oriented in an off state.

Referring to FIG. 30, upper platter 212 and lower platter 214 are arranged in an off-state when the south pole portions 250 of upper platter 212 are adjacent the north pole portions 250 of lower platter 214 and the north pole portions 250 of upper platter 212 are adjacent the south pole portions 250 of lower platter 214. In the off-state, a workpiece 27 being made from a ferromagnetic material is not held by magnetic coupling device including the upper and lower platters 212, 214 due to a completion of a magnetic circuit between the aligned south pole portions 250 of upper platter 212 and the north pole portions 250 of lower platter 214 and between the aligned north pole portions 250 of upper platter 212 and the south pole portions 250 of lower platter 214. In other words, platters 212 and 214 shunt the magnetic circuit within the pole portions 150 causing the external magnetic field to collapse. Upper platter 212 and lower platter 214 may also be arranged to provide one or more partial on states of the magnetic coupling device including upper platter 212 and lower platter 214.

Figure 31:
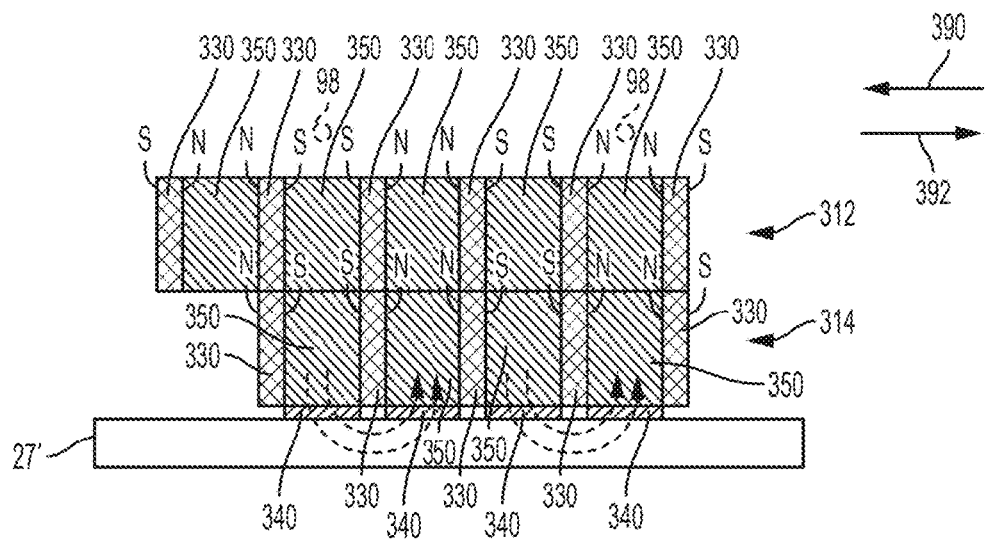
FIG. 31 illustrates a diagrammatical view of an exemplary magnetic coupling device having an upper assembly and a lower assembly, each including a plurality of permanent magnets and pole portions arranged in a linear array, the magnetic coupling device being in an on state.
Figure 32:
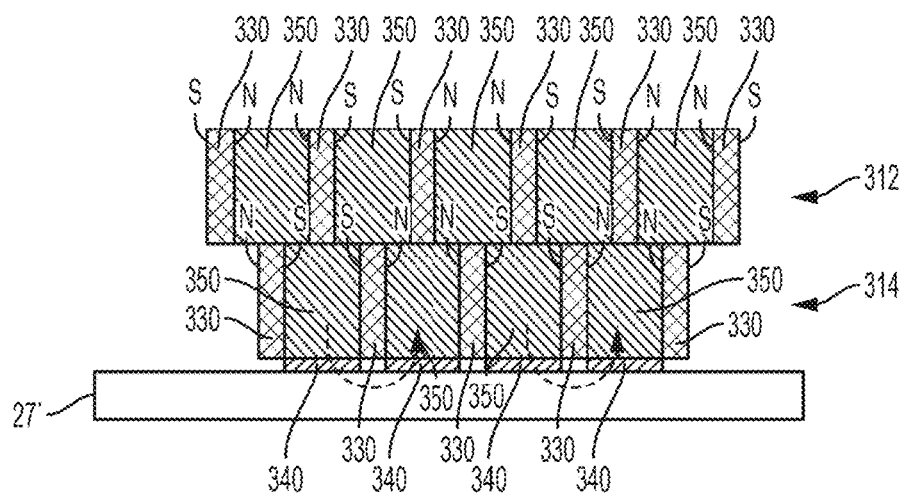
FIG. 32 illustrates the magnetic coupling device of FIG. 31 in a partial on state.
Figure 33:
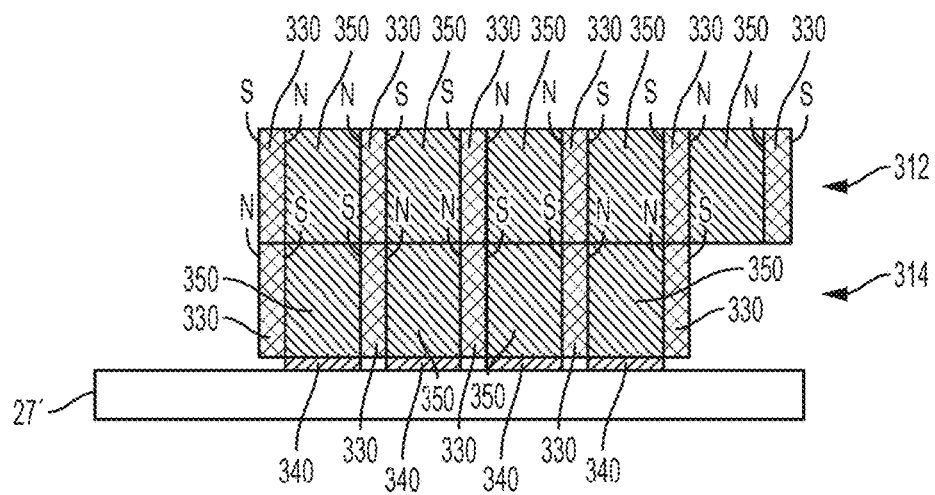
FIG. 33 illustrates the magnetic coupling device of FIG. 31 in an off state.

As mentioned herein other configurations of magnets may be used in place of permanent magnets 30, 32. Referring to FIGS. 31-33, an exemplary switchable permanent magnet assembly 300 of the present disclosure is represented. Switchable permanent magnet assembly 300 may replace magnetic flux source 15. Further, permanent magnet assembly 300 is placed in a non-ferrous housing, as opposed to housing 22 for magnetic coupling device 10. As explained in more detail herein pole portions 350 of permanent magnet system 300 are located at a lower side of the housing and contact workpiece 17 or have pole extension members 340 (see FIGS. 31-33) positioned directly below pole portions 350 and contacting workpiece 17.

Switchable permanent magnet assembly 300 includes an upper assembly 312 and a lower assembly 314. Each of assemblies 312 and 314 include a plurality of spaced-apart permanent magnets 330 and a plurality of pole portions 350. Each of the plurality of spaced-apart permanent magnets 330 are illustratively shown as a single permanent magnet but may comprise multiple permanent magnets and/or at least one permanent magnet positioned within a housing.

Each permanent magnet 330 has a north pole side (N) and a south pole side (S). The permanent magnets 330 and pole portions 350 of assembly 312 and of assembly 314 are each arranged in a linear array wherein one of pole portions 350 is positioned between two of permanent magnets 330. Further, the permanent magnets 330 are arranged so that each of the two permanent magnets 330 contacting the pole portion 350 therebetween have either their north pole sides (N) or their south pole sides (S) contacting the pole portion 350. When the north pole sides (N) of the adjacent permanent magnets 330 are contacting a pole portion 350, the pole portion 350 is referred to as a north pole portion. When the south pole sides (S) of the adjacent permanent magnets 330 are contacting a pole portion 350, the pole portion 350 is referred to as a south pole portion.

In embodiments, lower assembly 314, like magnet 30 in tool 10, is held stationary relative to the housing containing lower assembly 314 and upper assembly 312, like magnet 32 in tool 10, rotates relative to lower assembly 314. Upper assembly 312 is translatable relative to lower assembly 314 in directions 390 and 392 to alter an alignment of the permanent magnets 330 and pole portions 350 of upper assembly 312 relative to the permanent magnets 330 and pole portions 350 of lower assembly 314. Permanent magnets 330 of lower assembly 312 are spaced apart from workpiece 17 due to pole shoes 340 coupled to pole portions 350. Alternatively, pole portions may be extended to provide the spacing. Additionally, a spacer (not shown) is provided between the permanent magnets of upper assembly 312 and lower assembly 314.

Figure 20:
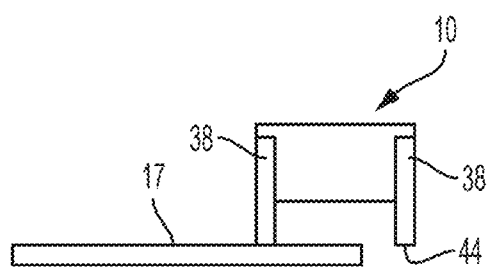
FIG. 20 illustrates a simplified front elevation view of the end of arm magnetic coupling device of FIG. 1 contacting a right edge portion of a workpiece.

Switchable permanent magnet assembly 300 is considered to be in an on state when the south pole portions 350 of lower assembly 314 are aligned with the south pole portions 350 of upper assembly 312 and the north pole portions 350 of lower assembly 314 are aligned with the north pole portions 350 of upper assembly 312 (see FIG. 20). In the on-state, workpiece 17 is held by switchable permanent magnet assembly 300 due to a completion of a magnetic circuit from the aligned north pole portions 350 of upper assembly 312 and lower assembly 314, through the workpiece 27, and to the aligned south pole portions 350 of upper assembly 312 and lower assembly 314.

Switchable permanent magnet assembly 300 is considered to be in an off state when the south pole portions 350 of lower assembly 314 are aligned with the north pole portions 350 of upper assembly 312 and the north pole portions 350 of lower assembly 314 are aligned with the south pole portions 350 of upper assembly 312 (see FIG. 22). In the off state, a workpiece 17 is not held by switchable permanent magnet assembly 300 due to a completion of a magnetic circuit within upper assembly 312 and lower assembly 314 from the aligned north pole portions 350 of upper assembly 312 to the south pole portions 350 of lower assembly 314 and from the aligned north pole portions of upper assembly 312 to the south pole portions 350 of lower assembly 314.

Switchable permanent magnet assembly 300 is considered to be in a partial on state when the south pole portions 350 of upper assembly 312 are partially overlapping the north pole portions 350 of lower assembly 314 and the north pole portions 350 of upper assembly 312 are partially overlapping the south pole portions 350 of lower assembly 314. When in the partial on state, a workpiece 17 may be held by switchable permanent magnet assembly 300 due to a completion of a magnetic circuit from the overlapping north pole portions 350 of upper assembly 312 and lower assembly 314, through the workpiece 17, and to the overlapping south pole portions 350 of upper assembly 312 and lower assembly 314. The strength of the magnetic circuit increases as the degree of overlap of the overlapping north pole portions 350 of upper assembly 312 and lower assembly 314 and the overlapping south pole portions 350 of upper assembly 312 and lower assembly 314 increases.

Further, sensors 98 may be positioned adjacent various ones of north pole and south pole portions 350. In embodiments, at least one of the north pole portions 350 and at least one of the south pole portions 350 has a sensor 98 associated therewith to monitor the leakage flux associated with the respective north pole portion and the respective south pole portion. As shown in FIG. 31, a first sensor 98 may be placed proximate to a north pole portion 350, such as directly over north pole portion 350 or radially outward of north pole portion 350, and a second sensor 98 may be placed proximate to a south pole portion 350, such as directly over south pole portion 350 or radially outward of south pole portion 350. Logic control circuit 23 may perform calibration runs for permanent magnet assembly 300 in a similar fashion as described herein for magnetic coupling device 10 to store sensor values for determining operating states of the device including permanent magnet assembly 200.

Referring to FIGS. 8-12, in embodiments, magnetic coupling tool 10 includes degaussing functionality for removing residual magnetism following handling of workpieces using magnetic coupling tool 10.

In an exemplary embodiment, magnetic coupling device 10 includes an on-off switchable di-pole magnetic flux source 15; a first housing component 22 in which is received the magnetic flux source 15; and a pair of magnetic pole extension shoes 38 having each a workpiece engagement surface 44. The pole extension shoes 38 are mounted to the first housing component 22 such as to receive magnetic flux from the magnetic flux source 15 and make such available at the workpiece engagement surfaces 44. At least one magnetic field sensors 98, but preferably a number of first magnetic field detection sensors equal in number to the number of pole extension shoes and/or workpiece engagement surfaces, are located a predetermined distance away but in close proximity to a flux detection surface 46 preferably at an end opposite the workpiece engagement surface 44 of an associated one of the pole extension shoes. A pair of degaussing electrical windings 110, one each wound about a section of an associated one of the two magnetic pole extension shoes 38, are provided. Logic control circuit 23 is further operative to (i) receive an output signal from the at least one magnetic field detection sensor and determine from said output signal(s) an operating state of the tool indicative of the magnetic flux source being switched off, (ii) in such event switch-on an electric power supply to the degaussing electrical windings and (iii) perform a degaussing cycle wherein the degaussing electrical windings generate an oscillating and alternating magnetic field over a predetermined time.

In embodiments, the degaussing electrical windings 110 and exchangeable pole extension shoe members 38 form modular units attachable to the first housing component 29, wherein the pole extension shoe members 38 form part of a magnetic flux delivery circuit of the EOAMT 10 when used in magnetically coupling the EOAMT 10 with a workpiece 17, as well as, form part with the degaussing windings 110 of an electromagnet which is operated in a degaussing cycle during degaussing of the workpiece 17.

In embodiments, the logic control circuit 23 is devised such that the degaussing cycle will be performed immediately before magnetic coupling device 10 is removed from a workpiece 17 that has previously been handled with magnetic coupling device 10, i.e. when magnetic coupling device 10 is stationary with the workpiece engagement surfaces 44 at the workpiece 17 and the magnetic flux source 15 has been turned off to effect decoupling. By performing the degaussing cycle at that stage, the pole shoes 38 of magnetic coupling device 10 will act as conduits to focus the degaussing operation to the workpiece area which in the first place will exhibit the magnetic remanence after placing magnetic coupling device 10 in the off state.

In embodiments, the pole extension shoes 38 are comprised of at least two components, a first pole extension member 38a secured in removable manner to the first housing component and a second pole extension member 38b removably secured in extension to the first member and defining the workpiece engagement surface 44, wherein the degaussing electrical windings 110 encircle a section of the second pole extension member 38b. This two-part pole shoe lay-out enables the EOAMT 10 to be deployed with or without degaussing functionality, by allowing simple decoupling of the second pole extension member 38b from the first pole extension member 38a, whereby the first pole shoe member 38a will then exhibit/provide the workpiece engagement surface 44. Equally, it allows the second pole shoe member 38b to be exchangeable so as to provide a workpiece engagement surface 44 that is optimized to the geometry of the workpiece 17.

In embodiments, the pole shoes 38 have, in the section covered by the degaussing windings 110, a cross section sufficient to direct a substantial and preferably all of the magnetic flux generated upon the degaussing windings 110 being energized, to the workpiece engagement surface 44. This ensures that all of the magnetic flux provided by the degaussing windings 110 is effectively used in performing degaussing of the workpiece 17 at the contact zone with the pole extension shoes 38. It is of course also possible for the pole shoes 38 to have in the section covered by the degaussing windings 110, a cross section sufficient to direct a substantial portion (but not all) of the magnetic flux generated upon being energized, to the workpiece engagement surface 44 and generate magnetic flux leakage around the workpiece engagement surface 44. This measure will assist in degaussing zones outside the immediate contact zone between pole extension shoes and workpiece.

In embodiments, the logic control circuit 23 further includes an AC driver (hardware or software) for generating a pulse width modulated (PWM) current which as explained in more detail herein is supplied to the degaussing windings 110. Further, in embodiments, functional blocks of the logic control circuit 23 for performing the degaussing cycle.

In embodiments, the degaussing windings 110, in being wrapped about (i.e. encircling) a section of the ferromagnetic pole extension shoes 38, effectively create an electromagnet. The control circuit and the microprocessor of logic control circuit 23 are configured such that the electromagnets are driven to alternate the polarity and magnitude beneath the poles shoes 38. The pole shoes 38 always have their fields in opposite directions during normal (coupling) use of the tool. For different size tools, the parameters of the electromagnets are changed to correlate the strength of the magnetic field to that of the switchable permanent magnet unit deployed in the magnetic coupling device 10 to overcome the residual magnetic field that is left in the workpiece without creating a new residual field.

The two electromagnets performing the degaussing function can be controlled using a typical DC motor driver. In order to minimize the residual magnetism left in the workpiece 17, an alternating magnetic field that decreases in magnitude is used. The alternating magnetic field is controlled by the microcontroller (through the dedicated DC motor drive chip) with a pulse width modulated (PWM) waveform and a direction pin. The direction pin is what alternates the direction of the current supplied to the degaussing windings (coils). The PWM waveform is what controls the actual magnetic field seen through the electromagnets.

There are a number of parameters that affect the PWM waveform, and in turn, the magnetic field, such as frequency, duty cycle, and amplitude. Workpieces 17 with different geometries and steel compositions require different parameters to properly degauss. Therefore, the control circuit can either be provided with suitable memory banks for storing pre-defined parameter tables accessible to the programed microprocessor, or alternatively customized data can be stored which is sampled during calibration runs during which the parameters are cycled and changed, the residual magnetism of the workpiece measured and then an 'optimal' set of parameters for a PWM waveform determined, that achieves a desired degaussing level of the specific workpiece. Exemplary hardware circuits for achieving various forms of PWM drivers are provided in U.S. Pat. Nos. 3,895,270 and 4,384,313, although more generic circuits coupled to a programmable microprocessor may also be employed.

Turning to the Figures exemplary embodiments are illustrated. Referring to FIGS. 8-11, an exemplary embodiment of magnetic coupling device 10 including degaussing functionality is illustrated. Pole shoes 38 include degaussing windings 110 wrapped around each pole shoe 38.

Multi-piece ferromagnetic pole extension shoes 38 are provided. Pole shoes 38 are mounted to the width-ward recessed sides at the lower portion of housing 22 using a pair of fastening screws 40. Pole shoes 38 include an essentially rectangular prismatic first member 38a having chamfered edges along its height, which are mounted to the width-ward sides at the lower portion of housing 22 and complement the shape of the upper portion of housing 22, and a rectangular plate-like second member 38b secured by fastening screws 38c at the lower terminal ends of upright shoe member 38a. Alternative shapes of pole shoes 38' may be used.

The pole extension shoes 38 define at a lower face (i.e. at the second member 38b) respective workpiece engagement surfaces 44 which in the illustrated embodiment are planar but could be of different geometry and/or contoured to form fittingly abut against a curved or uneven target surface of a workpiece to be magnetically coupled to and handled by tool 10. The fit of pole shoes members 38a to the receptacles defined at the lower portion of housing 22 is such as to minimize or indeed essentially avoid magnetic circuit air gaps; in other words, the thick-walled width-ward portions of housing 22 and the pole shoes 38' together form a magnetic flux path from the magnets 30, 32 to the top axial end faces of housing 22 and the lower end of pole shoes 38.

Figure 11:
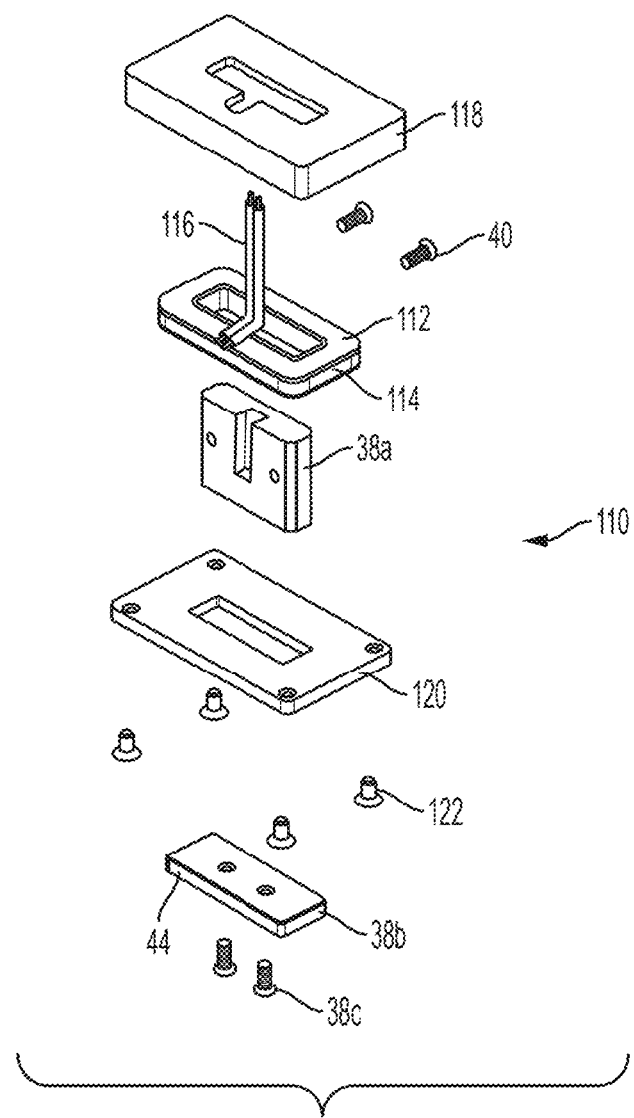
FIG. 11 illustrates an exploded view of one of the degaussing modules shown in FIG. 8.

Referring to FIG. 11, an exploded view of degauss assembly 110 is illustrated. Degauss assembly 110 includes an electric degaussing winding or coil 114 wound about a bobbin 112, with a 2-wire ribbon cable 116 for connection to a control circuit as will be explained below. Coil 114 and bobbin 112 are received within top bobbin cover 118 made of non-ferromagnetic steel or other material, whereby ribbon cable 116 passes through an opening in the top wall of bobbin cover 118. Bottom bobbin cover 120 is then fastened to top bobbin cover 118 via fasteners 122.

The above-mentioned pole extension shoe 38 of the switchable permanent magnet unit 20 is then incorporated into the degaussing module by sliding rectangular prismatic pole shoe component 38a through an appropriately and correspondingly shaped opening in the middle of bottom bobbin cover 120 to extend through bobbin 112 and protrude past the complementary opening in top bobbin cover 118. The customizable pole extension shoe component 38b, which provides the workpiece engagement surface 44, is either already attached to the lower axial end of pole shoe component 38a using fasteners 38c, or can be secured afterwards, and comes to abut against the lower bobbin cover plate 120. As previously noted, pole extension shoe component 38a and degaussing coil 114 effectively provide a dedicated electromagnet for performing the degaussing cycle.

Figure 10:
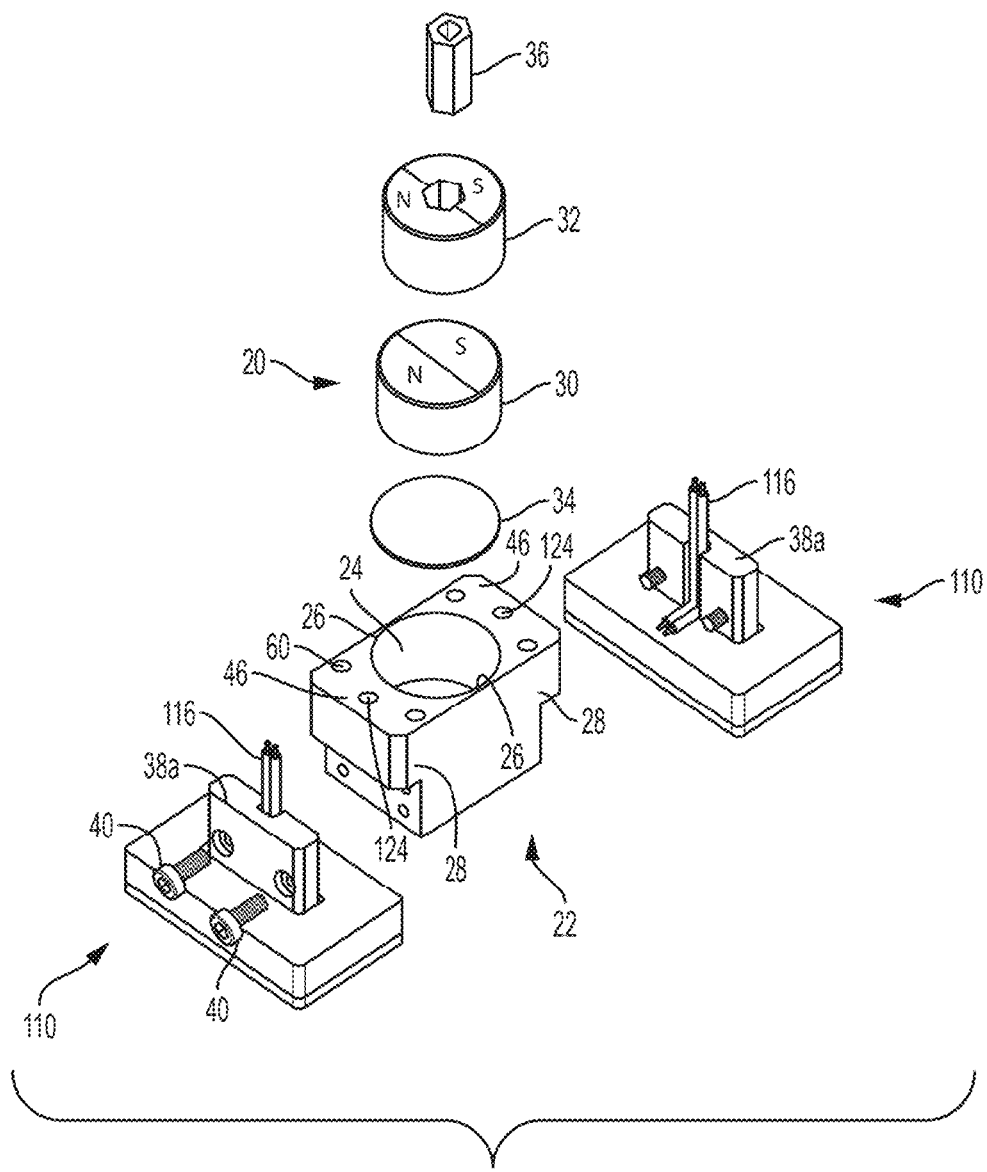
FIG. 10 illustrates an exploded view of the magnetic flux source of the end-of-arm magnetic coupling tool of FIG. 8, being an on/off switchable permanent magnet unit, and two degaussing modules that carry pole extension shoes for the magnetic flux source.

Now referencing FIG. 10, each 2-wire ribbon cable 116 is routed through dedicated degauss wire routing bores 124 extending through the upper portion of housing 22 on either width-ward side of cylindrical bore 24, and the two degauss modules 110 are then attached to housing 22 of switchable magnet unit 20 through the above mentioned fastening bolts 40, thus also securing the pole extension shoes 38 to the unit 22 and thus providing for completion of the switchable magnetic flux source used in normal operation of the tool 10 to attach to a workpiece.

The logic control circuit 23, in particular main PCB 92 incorporates the necessary hardware and software required for operating the degauss modules 110, in particular for generating the degaussing AC (and controlling its waveform) that is sent through the degaussing coils 114. The 2-wire ribbon cables 116 of degaussing modules 110 attach to sockets at pole board PCB 94 which is connected to main control board PCB 92 via board-to-board connectors 102, 104.

Current (which given it is PWM-modulated can appropriately also be described as an operating signal for the degaussing coils 114) going through the ribbon cables 116 to the coils 114 is controlled via the microcontroller and a motor driver on the main control PCB 92. These signals are controlled via a PWM waveform from the microcontroller to provide a high frequency AC signal. The degaussing PWM and direction pin work by alternating positive/negative between the North and South poles and decreasing the magnitude each period. Depending on the material composition and geometry of the workpiece being degaussed, different waveform parameters need to be changed including, but not limited to, frequency, magnitude, and shape.

The PWM signals effectively create a rapidly changing magnetic degaussing circuit with the workpiece which eliminates the residual magnetism. Exemplary processes are disclosed herein.

As regards degaussing coils 114, the wire gage, length, and number of windings (as well as how far those winding are from the pole extension shoe (or core of the electromagnet) of the coil affect the inductance and resistance of the coils. The changes in inductance and resistance affect the ramp up time of the coils, which means different coils (different size units) need different series of PWM waveforms. The ideal ramp up time can be calculated to determine the appropriate frequency. In general, larger degaussing units require more coil mass, which increases the ramp up time meaning that larger units will take longer to degauss.

The way the coils are wired also has an effect on the inductance and resistance of the coils. If the coils are wired in series the resistance is roughly double that of when they are in parallel. Thus, the way the coils are wired also has an effect on the PWM waveform.

In embodiments, five parameters are used by the logic control circuit 23 to alter the operation of degaussing coils 114. These parameters include (a) Prescaler: The prescaler divides the counter clock frequency from the main clock of the main PCB board's STM32F030R8T6. 240 has been the standard used for consistency (when the period is set to 200 the frequency for each pulse is 1 kHz); (b) Period: The period for each individual pulse (positive integer with 1 unit=5 µs when prescaler set to 240); (c) Steps: The number of pulses at each amplitude (positive integer); (d) Cycles: The number of amplitudes used to degauss (positive integer); and (e) Amplitude: The maximum duty cycle used to degauss (float with 0<x<1).

Figure 12:
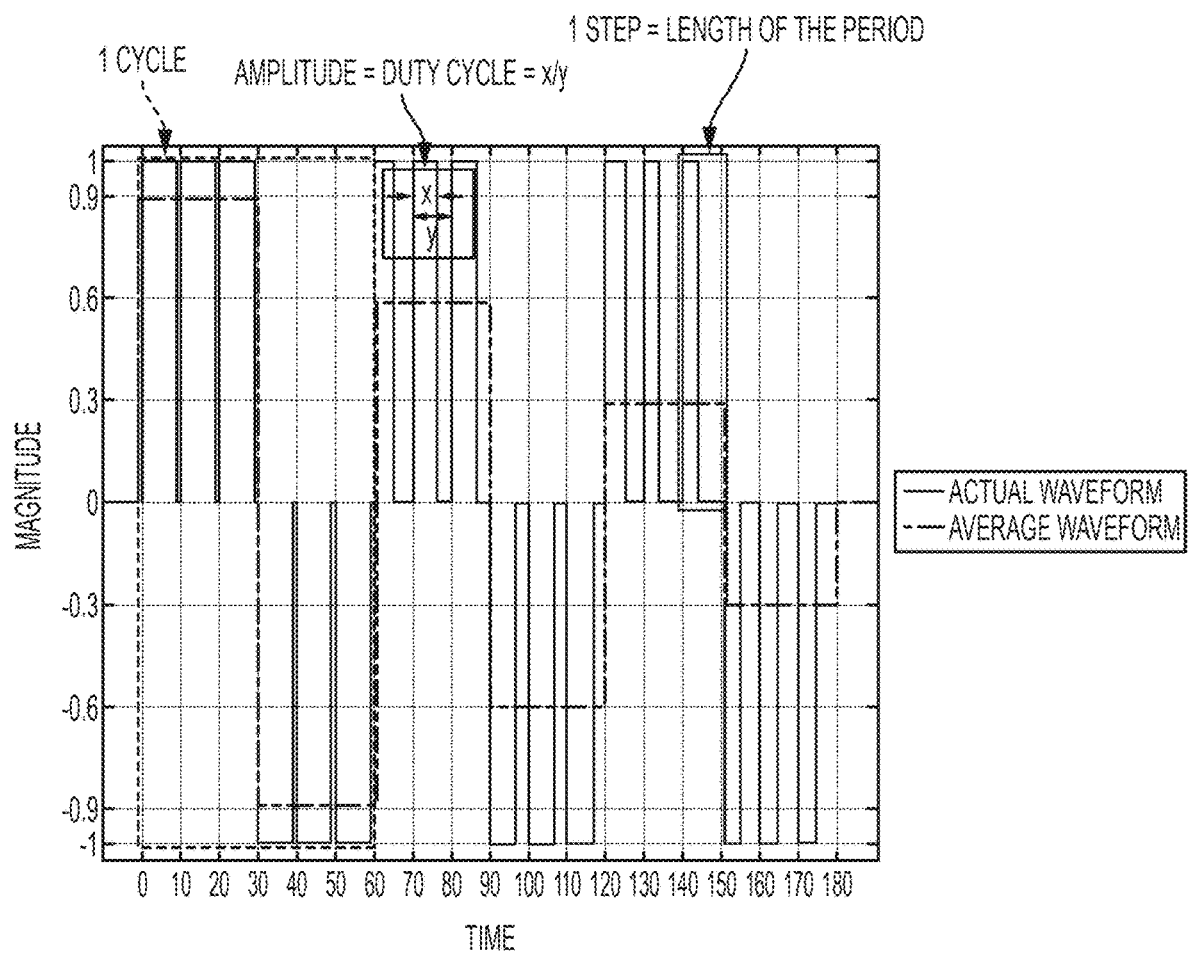
FIG. 12 illustrates an exemplary degauss wave form of use in a degaussing cycle with the degaussing modules of FIG. 11.

An exemplary degauss waveform is shown in FIG. 12. It should be noted though that the step function could be replaced with other type of functions that seek to mimic a sine wave form more closely. The following is the list of parameters used to create the waveform of FIG. 12: (a) Period: 10 (1 time unit on this graph=5 µs when the prescaler is set to 240); (b) Steps: 3 (Note that there are 3 positive steps and 3 negative steps per cycle); (c) Cycles: 3 (Note that the waveform goes positive and then negative a total of 3 times. Further note that the number of cycles is equivalent to the number of different magnitudes); (d) Amplitude: 0.9 (Note that the maximum duty cycle is 0.9 and that the average waveform magnitude is equal to the duty cycle/amplitude. Further note that the magnitudes are determined from the maximum amplitude divided by the number of cycles 0.9/3=0.3 (1st Cycle=±0.9; 2nd Cycle=±0.6; and 3rd Cycle=±0.3)).

By performing calibration runs in varying the above parameters, the degaussing efficiency and efficacy of magnetic coupling tool 10 may be optimized. For example, the table below was prepared using data obtained using a prototype coupling tool with degauss functionality based on a Magswitch AR70 unit. The table compares the performance of different software parameters and the maximum residual gauss level observed. This data was taken on 51200 steel, which is known to retain residual magnetism. This data was taken with the prescaler set to 240.

TABLE 1

AR70 Degauss Data on 51200 Steel

| Test # | Period (1 unit = 5 μs) | Steps | Cycles | Amplitude | Max Residual Observed (G) |
|---|---|---|---|---|---|
| 1 | 400 | 100 | 5 | 0.95 | 12 |
| 2 | 400 | 50 | 10 | 0.95 | 17 |
| 3 | 400 | 50 | 5 | 0.95 | 15 |

The number of steps per cycle was double the amount for the $1^{st}$ test as compared to the $2^{nd}$ and $3^{rd}$ tests. The first test had a lower residual, thus the ramp up for the $2^{nd}$ and $3^{rd}$ test was not long enough (the number of steps directly relates to the ramp up).

Using a different type of magnetic flux unit, a Magswitch J50 unit with degauss capability, different tests were conducted which show the importance of running calibration tests in determining the best degaussing outcomes for a given workpiece.

The following software parameters were used in the generation of a PWM signal supplied to the degaussing coils: Prescaler: 240; Period: 250; Steps: 10; Cycles: 20; and Amplitude: 0.7. With these parameters, the degauss cycle took roughly 200 ms, and the maximum current draw of the coils was about 0.9 A. The coils were wired in parallel for this unit. The total resistance of the coils was roughly 8Ω.

With a change of parameters, different outcomes are observable. The following software parameters were used in the generation of a PWM signal supplied to the degaussing coils for a second test: Prescaler: 240; Period: 300; Steps: 10; Cycles: 20; and Amplitude: 0.7. With these parameters, the degauss cycle takes roughly 200 ms, and the maximum current draw was about 0.3 A. The coils are wired in series for this unit. The total resistance of the coils was roughly 30Ω.

A number of other parameters were tested before narrowing these down. Initially, the number of steps was much greater, but it was creating a more sustained magnetic field that had negative effects on degaussing. The number of cycles was initially much lower, but with a decreased number of steps, the number of cycles could be increased while keeping the degauss cycle under 0.5 s. The amplitude was initially higher, but with the increased frequency on this unit, there were issues with the limits of the transistor switching speeds.

It will be understood that the above provided data is based on prototype development and optimization will yield degaussing cycle times that are acceptable in robotic handling of workpieces.

Figure 24:
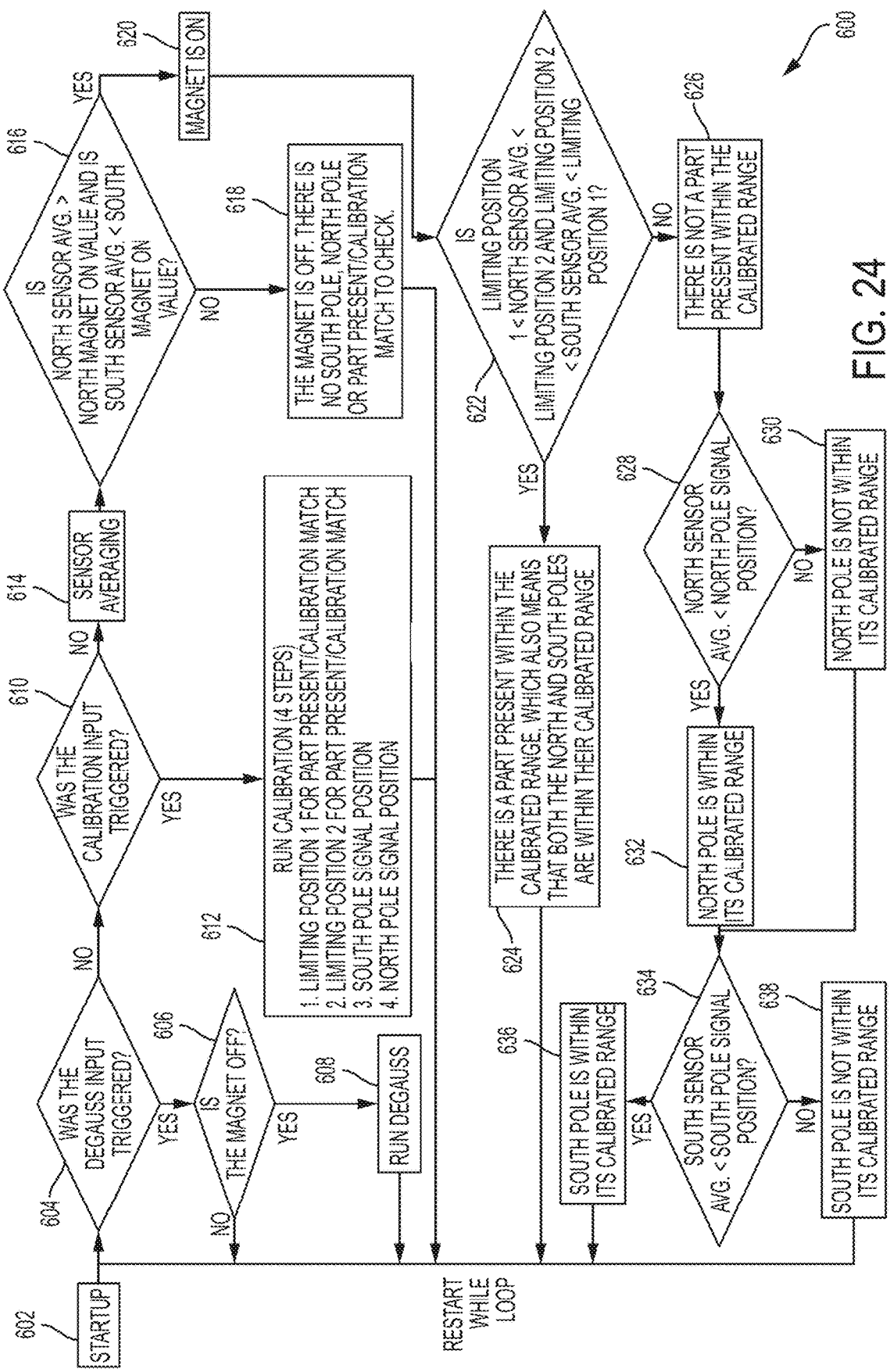
FIG. 24 illustrates an exemplary processing sequence of the control logic, including calibration subroutine, performed by the end-of-arm magnetic coupling tool during operation.

Referring to FIG. 24, a functional processing sequence 600 of logic control circuit 23 is illustrated. The processing sequence shows the various steps which the tool's software is programmed to undertake in employing an initial four calibration process of the tool (as compared to the 3-step outline above) for a given workpiece 17, and the steps performed in determining the various possible status of the tool in its magnetic interaction with the workpiece 17, based on comparison of actual sensor data with calibrated threshold sensor data (averaged). The tool 10 executes a startup routine, as represented by block 602. A check is made to see if a degauss input of the input devices 41 was triggered, as represented by block 604. If triggered a check is made to determine if the magnetic flux source 15 is in an off state, as represented by block 606. If so, a degauss cycle is performed as represented by block 608.

If the degauss input was not triggered, a check is made to determine if a calibration input of the input devices 41 was triggered, as represented by block 610. If so, a four-step calibration run is performed, as represented by block 612. In one example, magnetic coupling device 10 is calibrated to a single sheet thickness (1 mm) that is a small square (100 mm×100 mm). The two Limiting Positions are calibrated for positions of magnetic coupling device 10 near the center of the sheet. The North pole signal is calibrated for the north pole shoe being on an edge of the sheet (not in the corners) and the South pole signal is calibrated for the south pole shoe being on an edge of the sheet (not in the corners).

If the calibration input was not triggered, the sensor values for magnetic sensors 98 are averaged, as represented by block 614. In one example, block 614 entails for each sensor 98 averaging the magnetic field sensor values of the tool sampling magnetic flux data points within a defined (very short) measurement time period and processing these signals by the on-board processor of the magnetic field sensor and sensor signal processing circuit unit, all of which can be performed in a few milliseconds. This of course increases accuracy of data sampling and performance of the tool's sensor suite to determine the different tool status.

A check is made to see if the sampled values indicate that the magnetic flux unit 15 is in an on state (or calibrated partial on state), as represented by block 616. If not, it is determined the magnetic flux circuit is off, as represented by block 618. If so, the magnetic flux circuit is indicated to be on, as represented by block 620.

Next, the averaged sensor values for the magnetic sensor associated with the north pole shoe and the sensor values for the magnetic sensor associated with the south pole are checked to see it is within the range of the limiting position 1 and limiting position 2 calibrated values, as represented by block 622. On the small thin plate mentioned above, the magnetic flux sensor values will start to change rapidly as the magnetic coupling device is moved away from the center of the plate. If both are in range, it is determined that a part is present and engaged in a targeted zone, as represented by block 624. If not, a check of the magnetic flux sensor values for each magnetic sensor 98 is compared to the respective pole position calibration values to determine if either the north pole or the south pole is on the part, as represented by blocks 626-638.

In one embodiment, a six-step calibration procedure is implemented. The following sensor values are calibrated: (1) Limiting position 1 North best flux circuit; (2) Limiting position 1 South best flux circuit; (3) Limiting position 2 North worst flux circuit; (4) Limiting position 2 South worst flux circuit; (5) South pole position; and (6) North pole position. This calibration procedure differs from the four-step calibration sequence above wherein the limit positions corresponded to the center of the sheet. In this procedure, the magnetic coupling device 10 is within the limit ranges as long as both the north pole shoe and the south pole shoe are on the sheet. For sensor values (1) and (2), the magnetic coupling device 10 is located at the center of the sheet, and these values are recorded. For sensor value (3), the magnetic coupling device 10 is located with the north pole shoe adjacent to two edges of the sheet (in a corner) and the value for the north pole shoe sensor is recorded. For sensor value (4), the magnetic coupling device 10 is located with the south pole shoe adjacent to two edges of the sheet (in a corner) and the value for the south pole shoe sensor is recorded. Sensor values (5) and (6) are the same as sensor values (3) and (4) for one example (limit range is whole sheet). If the sensor values for (3) and (4) where for positions not in the corners of the sheet, then sensor values (5)_ and (6) would differ from (3) and (4) because sensor values (5) and (6) are taken with magnetic coupling device in the corners of the sheet. Referring to FIG. 25, an exemplary robotic system 700 is illustrated. The embodiments described in relation to robotic system 700 may be applied to other types of machines, (e.g., mechanical gantries, crane hoists, pick and place machines, etc.).

Robotic system 700 includes electronic controller 770. Electronic controller 770 includes additional logic stored in associated memory 774 for execution by processor 772. A robotic movement module 702 is included which controls the movements of a robotic arm 704. In the illustrated embodiment, robotic arm 704 includes a first arm segment 706 which is rotatable relative to a base about a vertical axis. First arm segment 706 is moveably coupled to a second arm segment 708 through a first joint 710 whereat second arm segment 708 may be rotated relative to first arm segment 706 in a first direction. Second arm segment 708 is moveably coupled to a third arm segment 711 through a second joint 712 whereat third arm segment 711 may be rotated relative to second arm segment 708 in a second direction. Third arm segment 711 is moveably coupled to a fourth arm segment 714 through a third joint 716 whereat fourth arm segment 714 may be rotated relative to third arm segment 711 in a third direction and a rotary joint 718 whereby an orientation of fourth arm segment 714 relative to third arm segment 711 may be altered. Magnetic coupling device 10 is illustratively shown secured to the end of robotic arm 704. Magnetic coupling device 10 is used to couple a workpiece 17 (not shown) to robotic arm 704. Although magnetic coupling device 10 is illustrated, any of the magnetic coupling devices described herein and any number of the magnetic coupling devices described herein may be used with robotic system 700.

In one embodiment, electronic controller 770 by processor 772 executing robotic movement module 702 moves robotic arm 704 to a first pose whereat magnetic coupling device 10 contacts the workpiece at a first location. Electronic controller 770 by processor 772 executing a magnetic coupler state module 776 instructs magnetic device 10 to move upper magnet 32 relative to lower magnet 30 to place magnetic coupling device 10 in one of the on state or a partial on state to couple the workpiece to robotic system 700. In embodiments, magnetic coupler state module 776 includes the functionality of logic control circuit 23. Thus, the functionality of logic control circuit 23 may be located within tool 10 or remote from tool 10. Electronic controller 770 by processor 772 executing robotic movement module 702 moves the workpiece from the first location to a second, desired, spaced apart location. Once the workpiece is at the desired second location, electronic controller 770 by processor 772 executing magnetic coupler state module 776 instructs magnetic device 10 to move upper magnet 32 relative to lower magnet 30 to place magnetic coupling device 10 in the off state to decouple the workpiece from robotic system 700. Electronic controller 770 then repeats the process to couple, move, and decouple another workpiece 17. In one embodiment, prior to moving away from the workpiece 17, controller 770 instructs magnetic coupling device 10 to execute a degauss cycle.

Figure 35:
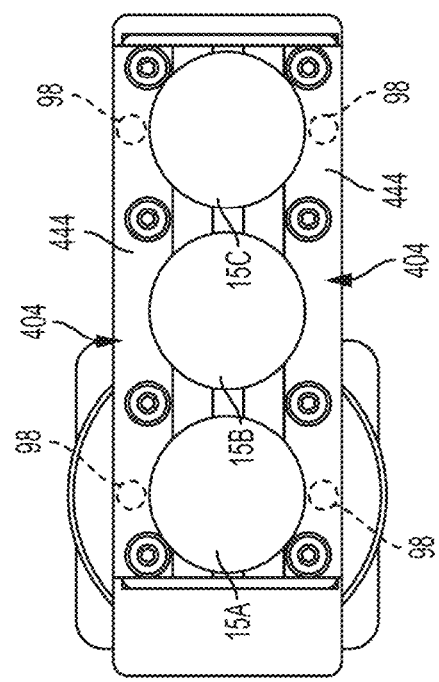
FIG. 35 illustrates a bottom view of the linear array magnetic coupling device of FIG. 34.
Figure 34:
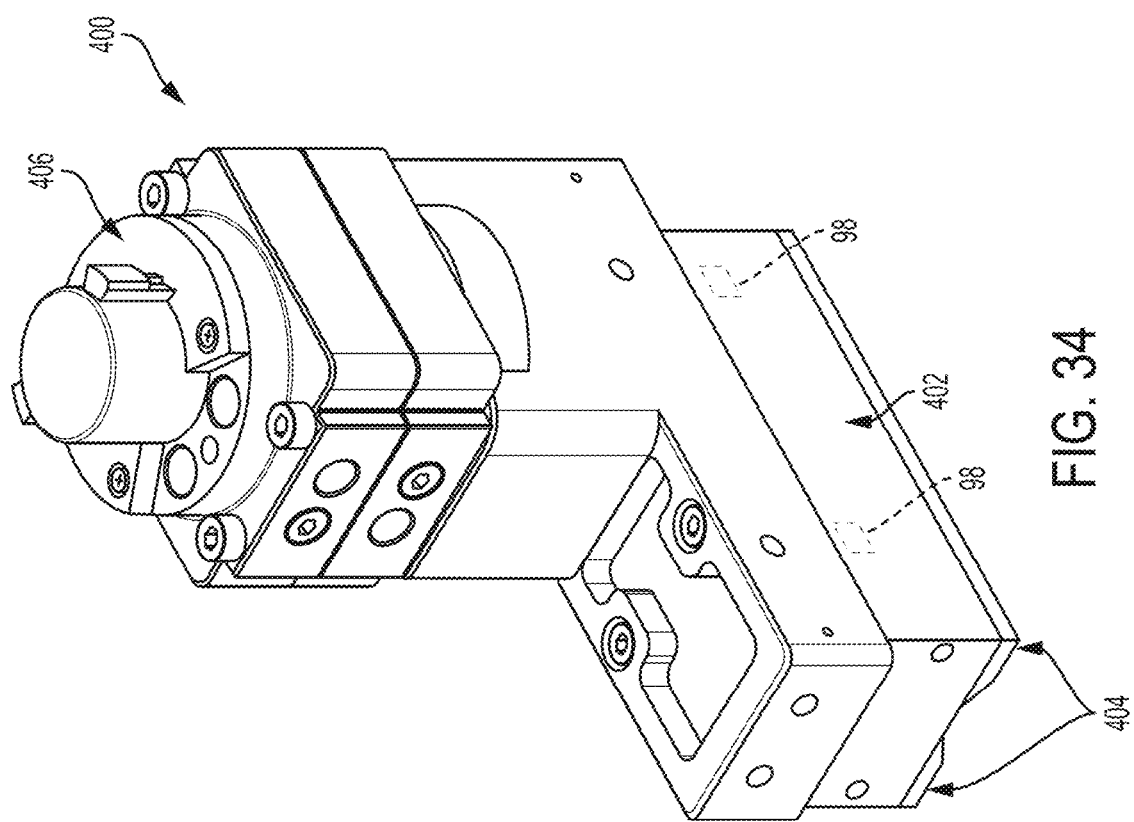
FIG. 34 illustrates a perspective view of an exemplary linear array magnetic coupling device including sensors and logic control circuit for determining operational states of the magnetic coupling device.

In embodiments, magnetic coupling device 10 has an elongated housing to hold multiple instances of magnetic flux source 15 in a linear array. An exemplary device having multiple instances of magnetic flux source 15 is the LAY Series unit as manufactured and sold by Magswitch Technology Inc. Referring to FIGS. 34 and 35, a magnetic coupling device 400 is shown. Magnetic coupling device 400 includes a housing 402 containing multiple instances of magnetic flux source 15, illustratively flux sources 15A-C. Pole extension shoes 404 are provided along a lower side of housing 402. The relative positions of magnet 32 of each instance of magnetic flux source 15 is controlled through an actuator 406. Each instance of magnetic flux source 15 operates in the same manner as for magnetic coupling device 10 and are placeable in any one of an on state, an off state, and a partial on state.

Further, magnetic coupling device 400 includes magnetic field sensors 98 positioned within housing 402. Magnetic field sensors 98 are shown being positioned proximate the pole shoes 404 of two of the magnetic flux sources 15, illustratively flux sources 15A and 15C. In embodiments, magnetic field sensors 98 are associated with only a single flux source 15 of the plurality of magnetic flux sources 15A-C. In embodiments, magnetic field sensors 98 are associated with each flux source 15 of the plurality of magnetic flux sources 15A-C. Logic control circuit 23 by monitoring the magnetic field sensors 98, is able to determine a quality of magnetic circuit formed by workpiece engagement surfaces 444 of pole shoes 404 and a workpiece 17, proximity to a workpiece 17, or other operating states disclosed herein.

Figure 37:
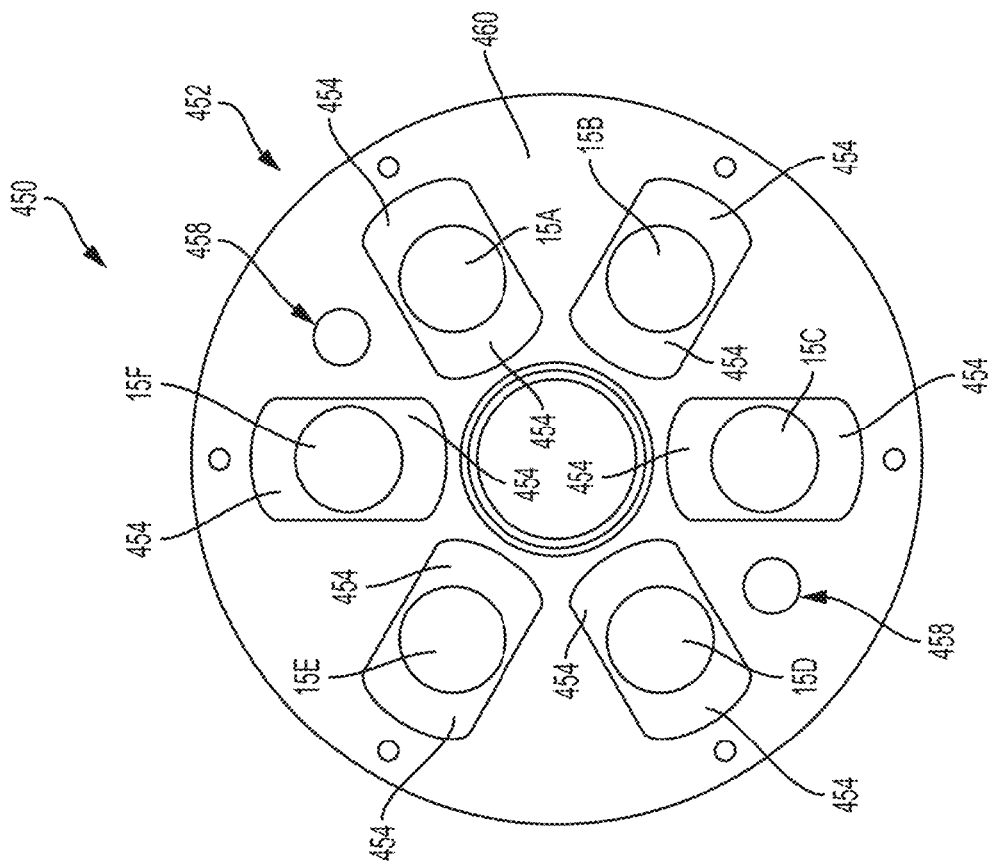
FIG. 37 illustrates a bottom view of the circular array magnetic coupling device of FIG. 36.
Figure 36:
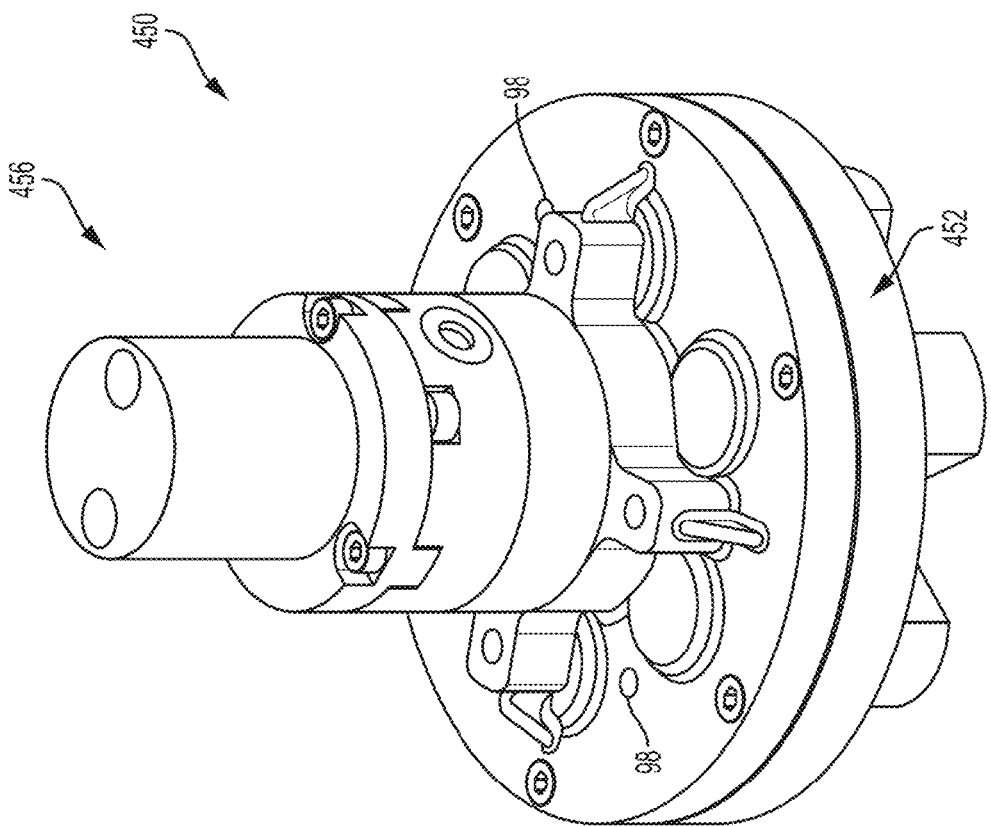
FIG. 36 illustrates a perspective view of an exemplary circular array magnetic coupling device including sensors and logic control circuit for determining operational states of the magnetic coupling device.

In embodiments, magnetic coupling device 10 has an elongated housing to hold multiple instances of magnetic flux source 15 in a circular array. An exemplary device having multiple instances of magnetic flux source 15 is the AY Series unit as manufactured and sold by Magswitch Technology Inc. Referring to FIGS. 36 and 37, a magnetic coupling device 450 is shown. Magnetic coupling device 450 includes a housing 452 supporting multiple instances of magnetic flux source 15, illustratively flux sources 15A-F, each having its own pair of workpiece engagement surfaces 454. The relative position of magnet 32 for each instance of magnetic flux source 15 is controlled through an actuator 456. Each instance of magnetic flux source 15 operates to form magnetic working circuits therebetween through workpiece 17. The operation of magnetic coupling device 450 is described in more detail in U.S. Pat. No. 9,484,137, the entire disclosure of which is expressly incorporated by reference for all purposes.

Further, magnetic coupling device 450 includes magnetic field sensors 98 positioned within housing 452. In embodiments, magnetic field sensors 98 are positioned in cylindrical protrusions 458 extending down from a lower surface 460 of housing 452. In the illustrated embodiment, two magnetic sensors 98 are positioned in respective protrusions 458, one being positioned between magnetic flux source 15F and 15A and the other positioned between magnetic flux sources 15C and 15D. In embodiments, a magnetic field sensor 98 is positioned in a protrusion 458 between any two of magnetic flux sources. In embodiments, magnetic field sensors 98 are positioned in respective protrusions between each pair of adjacent magnetic flux sources 15A-F along a diameter of the circular array. Logic control circuit 23 by monitoring the magnetic field sensors 98, is able to determine a quality of magnetic circuit formed by workpiece engagement surfaces 454 of magnetic flux sources 15A-F and a workpiece 17, proximity to a workpiece 17, or other operating states disclosed herein.

Figure 38:
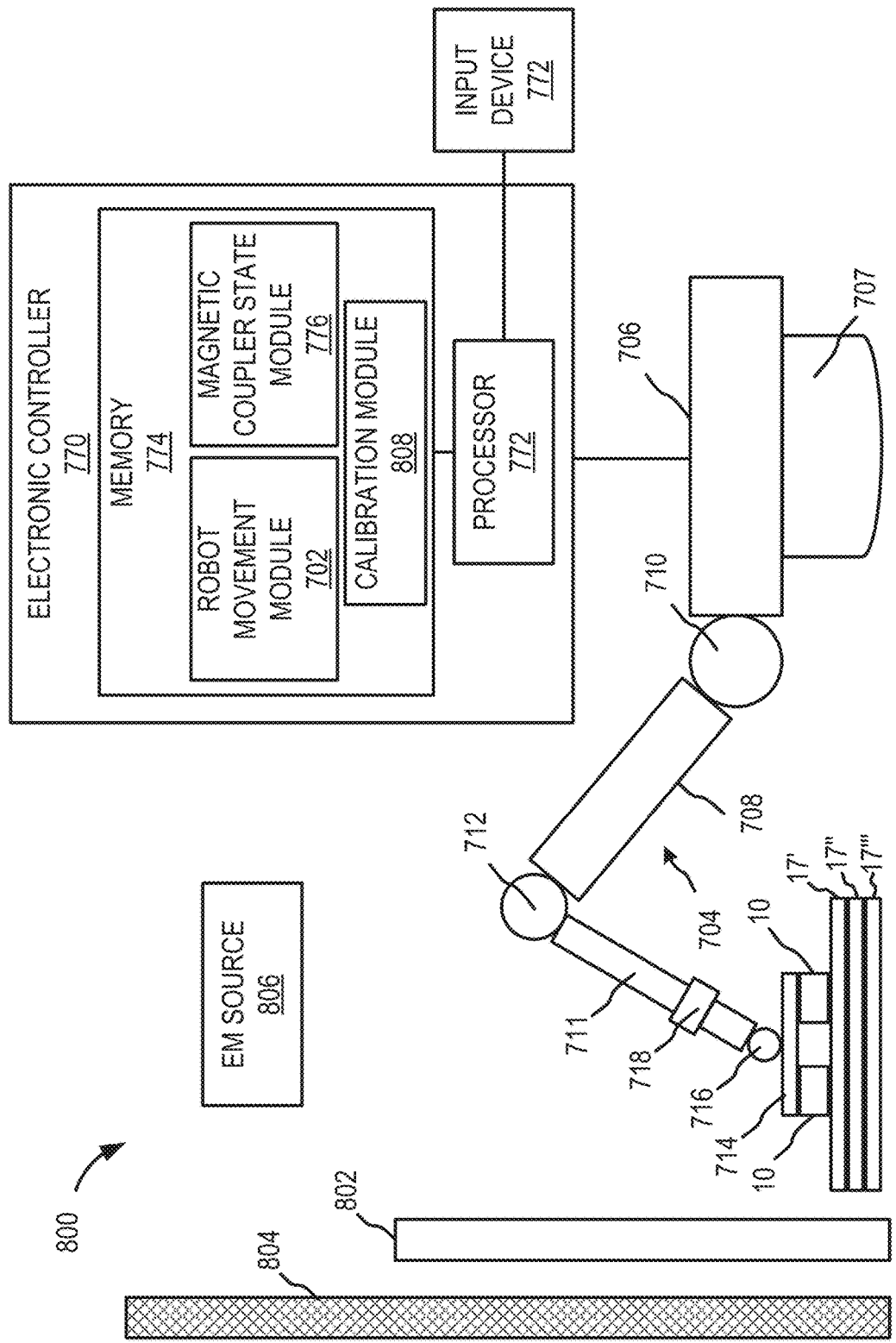
FIG. 38 illustrates a robotic system including two magnetic coupling devices attached as an end of arm coupler in a first position.
Figure 39:
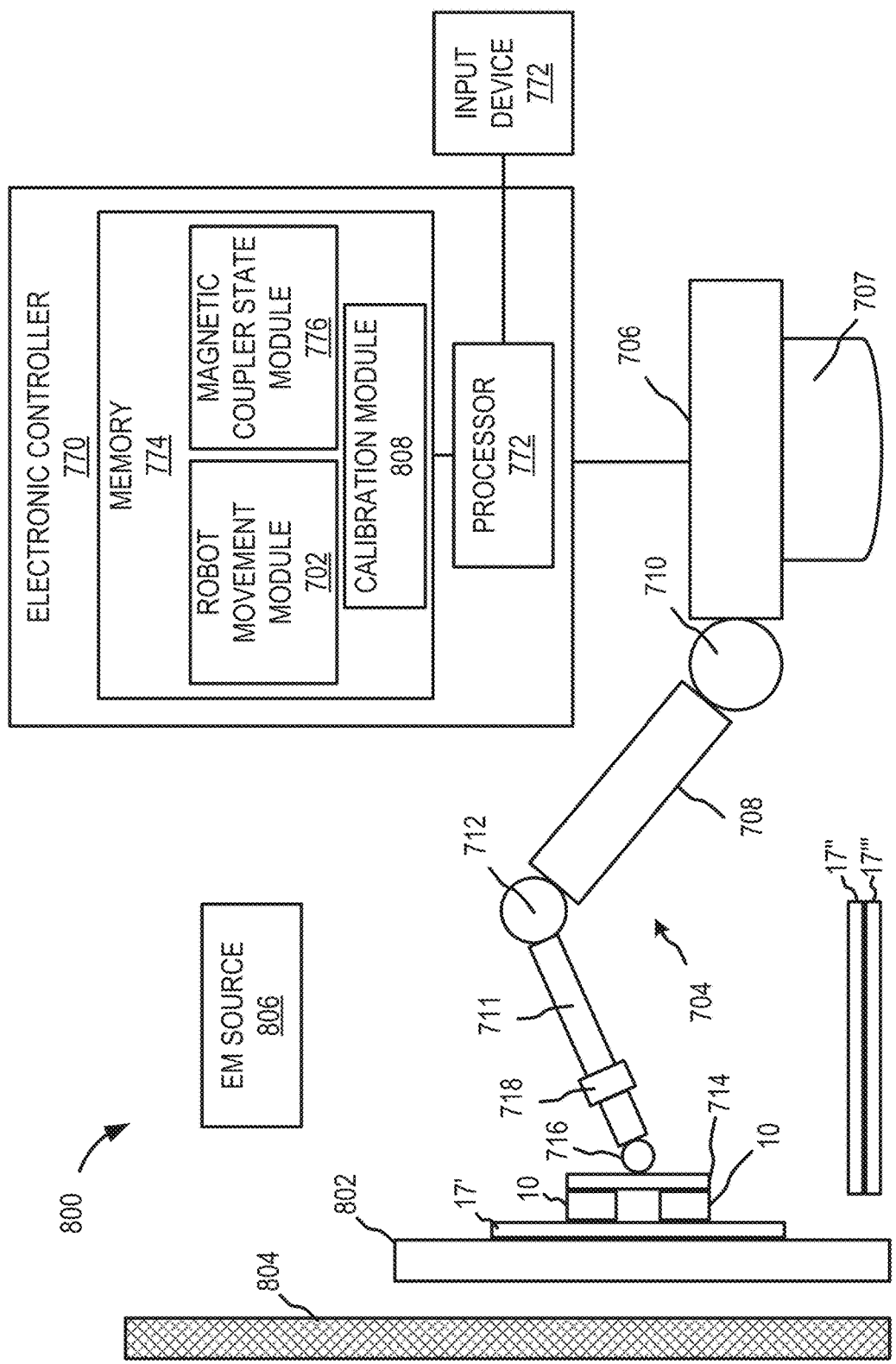
FIG. 39 illustrates the robotic system depicted in FIG. 38 in a second position.

FIG. 38 illustrates a robotic system 800 in a first position and FIG. 39 illustrates the robotic system 800 in a second position. Robotic system 800 includes electronic controller 770. Electronic controller 770 includes logic stored in associated memory 774 for execution by processor 772. A robotic movement module 702 is included which controls the movements of a robotic arm 704. In some exemplary embodiments, the robotic movement module 702 instructs the robotic arm 704 to complete an operational cycle. In at least some exemplary embodiments, the operational cycle is predetermined cycle.

In at least one example of an operational cycle, the robotic movement module 702 sends a signal to the magnetic coupler state module 776 the robotic arm is in the first position as depicted in FIG. 38. Then, the magnetic coupler state module 776 turns on the magnetic coupling devices 10 so the magnetic coupling devices 10 couple to the ferromagnetic workpiece 17'. Once the robotic movement module 702 receives a signal from the magnetic coupler state module 776 that the magnetic coupling devices 10 are turn on, the robotic movement module 702 instructs the robotic arm 704 to move from the first position to the second position depicted in FIG. 39. After the robotic arm 704 is in the second position, one or more processes may be performed on the ferromagnetic workpiece 17' (e.g., welding the ferromagnetic workpiece 17' to another workpiece 802). Once a signal is received by the robotic movement module 702 and/or the magnetic coupler state module 776 the one or more processes performed on the ferromagnetic workpiece 17' are complete, the magnetic coupler state module 776 turn off the magnetic coupling devices 10 and sends a signal to the robotic movement module 702 that the magnetic coupling devices 10 have been turned off. In response, the robotic movement module 702 instructs the robotic arm 704 to move from the second position to the first position.

To move from the first position to the second position and/or to any number of other positions, robotic arm 704 includes a first arm segment 706 which is rotatable relative to a base 707 about a vertical axis. The first arm segment 706 is moveably coupled to a second arm segment 708 through a first joint 710 whereat second arm segment 708 may be rotated relative to first arm segment 706 in a first direction. Second arm segment 708 is moveably coupled to a third arm segment 711 through a second joint 712 whereat third arm segment 711 may be rotated relative to second arm segment 708 in a second direction. Third arm segment 711 is moveably coupled to a fourth arm segment 714 through a third joint 716 whereat fourth arm segment 714 may be rotated relative to third arm segment 711 in a third direction and a rotary joint 718 whereby an orientation of fourth arm segment 714 relative to third arm segment 711 may be altered. In at least one example, the base 707 is fixed and in another example, the base 707 is moveable (e.g., via the electronic controller 770). The illustrated embodiment, however, is only one example of a robotic arm and other types of robotic arms may also be used. In addition, other types of exemplary lifting and transporting systems that may be used in place of the robotic arm 704 or in addition to robotic arm 704 include robotic systems, mechanical gantries, crane hoists and additional systems which lift and/or transport ferromagnetic materials. Additional types of moveable bases 707 that may be used in the embodiments disclosed herein are provided in U.S. Provisional Application Ser. No. 62/755,716, filed Nov. 5, 2018, titled MAGNETIC BASE FOR ROBOTIC ARM, the entire disclosure of which is expressly incorporated by reference herein for all purposes.

In the illustrated embodiment, the fourth arm segment 714 comprises a platform where the magnetic coupling devices 10 are illustratively shown secured thereto. In the illustrated embodiment, the robotic system 800 includes two magnetic coupling devices 10 attached as end of arm couplers. Although two magnetic coupling devices 10 are illustrated, any of the magnetic coupling devices described herein and any number of the magnetic coupling devices described herein may be used with robotic system 800.

Magnetic coupling devices 10 are used to couple one or more ferromagnetic workpieces 17 to robotic arm 704. In the illustrated embodiment, the robotic system 800 is configured to de-stack a ferromagnetic workpiece 17' from a stack of ferromagnetic workpieces 17 and relocate the ferromagnetic workpiece 17' from the first position to the second position so that the ferromagnetic workpiece 17' can be attached to another workpiece 802. In at least one example, the robotic system 800 is incorporated into an assembly line where the robotic arm 704 is attaching a ferromagnetic panel 17 to an automobile 802 and the assembly line is enclosed by a steel fence 804. The surrounding ferromagnetic object 804 may additionally or alternatively represent racks, machines, locating pins, etc.

During this process, one or both of the magnetic coupling devices 10 may experience varying interference from one or more of the following objects: the other magnetic coupling device 10, the other ferromagnetic workpieces 17", 17''' in the workpiece 17 stack, the workpiece 802, a surrounding ferromagnetic object 804, and/or an electromagnetic source 806. The varying interference may be based on the magnetic coupling device's 10 proximity to one or more of the other objects during different phases of the process.

Due to the varying interference caused by one or more of the objects listed above, one or more of the magnetic field sensors (e.g., sensors 98 depicted in FIG. 14) incorporated into the magnetic coupling devices 10 may sense different max or min leakage fluxes while the robotic arm 704 is in different positions. For example, the min leakage flux sensed by a magnetic field sensor in the first position for a given on state or partial on state may be higher than the min leakage flux sensed a magnetic field sensor in the second position for the same on state or partial on state. As a result, max/min leakage fluxes sensed by the magnetic field sensors may erroneously indicate an inadequate coupling between the magnetic coupling devices 10 and a ferromagnetic workpiece 17' and/or degradation of the magnetic coupling device 10. To solve this problem, a calibration module 808 stored on memory 774 is configured to perform a calibration process throughout an entire cycle for the robotic arm 704 in at least one exemplary embodiment.

In an alternative embodiment, the robotic arm 704 is replaced by a stationary machine (e.g., does not include a moveable base 707 and/or does not include moveable segments). Despite the machine being stationary, one or both magnetic coupling devices 10 attached to the stationary machine may experience interference due to other ferromagnetic materials being located near the stationary machine and/or varying interference due to other moveable machines (e.g., a robotic arm 704, clamps, welders, etc.) moving near and/or around the stationary machine. As such, a similar calibration sequence as the calibration sequence 900 described below may apply to a stationary machine.

Figure 40:
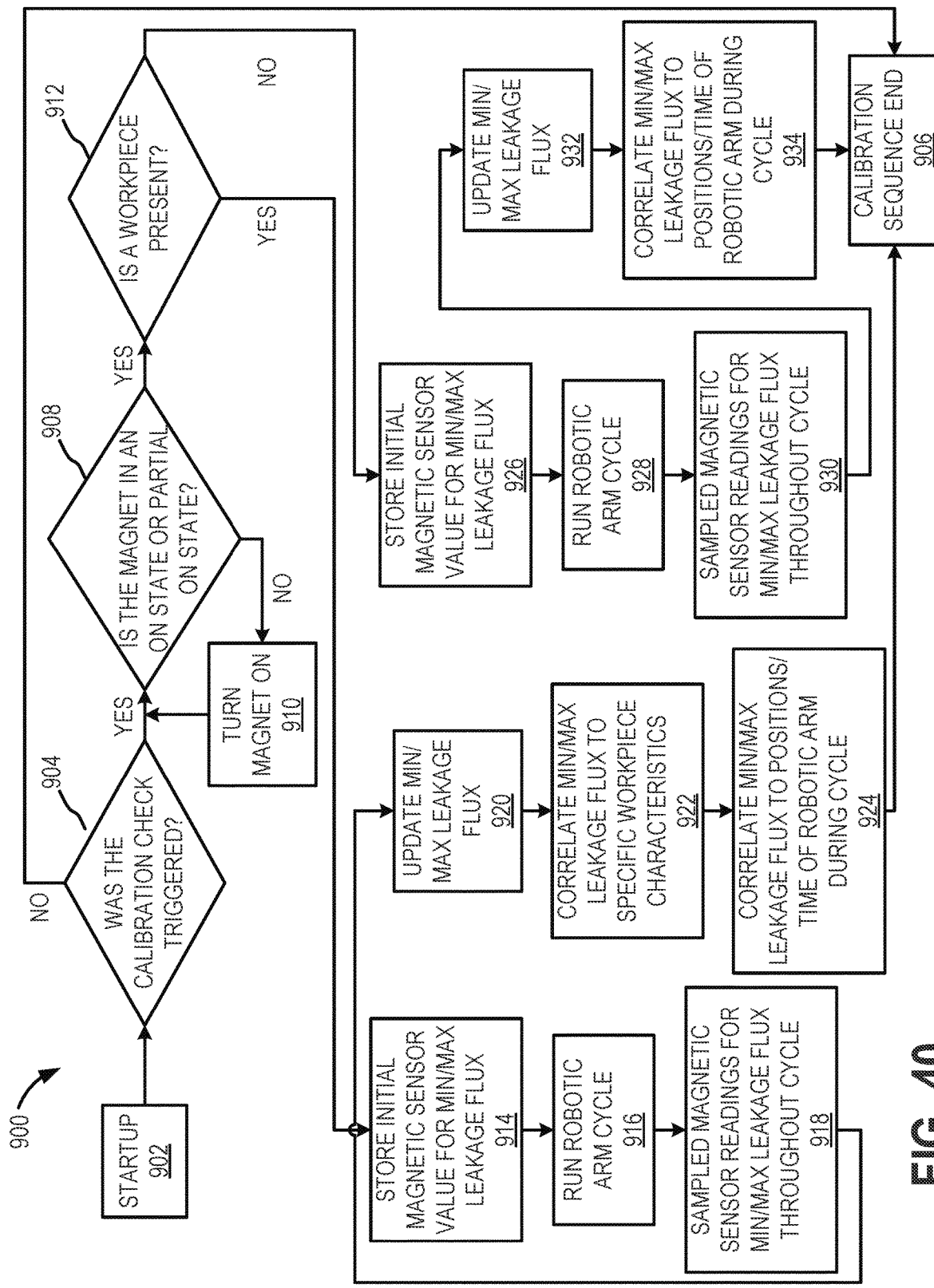
FIG. 40 illustrates an exemplary calibration sequence performed by the robotic system depicted in FIGS. 38 and 39.

FIG. 40 is an exemplary calibration sequence 900 performed by the robotic system 800. The sequence 900 starts by executing a startup routine, as represented by block 902. Next, the sequence 900 determines whether the calibration check 904 is triggered. If the calibration check 904 is not triggered, the calibration sequence 900 ends as represented by block 906. Conversely, if the calibration check 904 is triggered, then the sequence 900 proceeds to block 908 where a determination is made as to whether the magnet coupling devices 10 are in an on state or partial on state. To determine whether the magnetic coupling devices 10 are in an on state or partial on state, the magnetic field sensor values can be sampled. The sampled values can indicate, via a previous correlation, whether the magnetic coupling devices 10 are in an off state, an on state, or a partial state.

If the magnet is not in an on state or partial on state, the magnet is turned on at block 910. Conversely, if the magnet is in an on state or partial on state, the sequence 900 proceeds to block 912 where it is determined whether a workpiece 17 is present. Similar to determining whether the magnetic coupling device 10 is in an on state or partial on state, the sampled values of the magnetic field sensors can indicate whether a workpiece 17 is present via a previous correlation.

If a workpiece 17 is present, the sequence 900 proceeds to block 914 where min/max leakage flux values from the sampled magnetic sensors values for the N and S poles of the magnetic coupling devices 10 are stored to memory 774. In the event the magnetic coupling devices 10 are different types of coupling devices, the min/max leakage flux values can be correlated to the specific type of magnetic coupling device. Furthermore, while the min/max leakage flux values are discussed in relation to multiple magnetic coupling devices 10, more or fewer magnetic coupling devices 10 may be used in the robotic system 800, as stated above. Finally, while the min/max leakage flux values are discussed below, it is to be understood that readings for one or both N and S poles of the magnetic coupling devices 10 may be sampled and stored to memory 774.

Once the initial min/max leakage flux values are stored to memory 774, the robotic arm 704 performs its cycle by, for example, moving a ferromagnetic workpiece 17' from the first position (illustrated in FIG. 38) to the second position (illustrated in FIG. 39). In the event the robotic arm 704 is instead a stationary machine, the stationary machine performs its operational cycle and the sequence 900 similarly proceeds as discussed below.

As stated above, the magnetic coupling devices 10 may experience interference from one or more of the objects 802, 804, 806 and/or one of the other ferromagnetic workpieces 17", 17''' in the ferromagnetic workpiece 17 stack while the robotic arm 704 is running through its cycle, which can change the min/max leakage flux values sensed by the magnetic field sensors. As such, while the robotic arm 704 (or stationary machine) performs its cycle, the sensed values of the magnetic field sensors are sampled (block 918) and the stored min/max leakage flux values are updated (block 920).

In at least some exemplary embodiments, the min/max leakage flux values are correlated to the specific workpiece 17 coupled to the magnetic coupling devices 10 as represented by block 922. The reason being is because a first type of ferromagnetic workpiece 17 having first characteristics (e.g., thickness) may result in different min/max leakage flux values sensed by the magnetic sensors than a second type of ferromagnetic workpiece 17 having second characteristics. And, if the robotic arm 704 (or stationary machine) interchangeably couples to the two different types of ferromagnetic workpieces 17, then it won't be necessary to run the calibration sequence 900 every time the robotic arm 704 switches from the first type of ferromagnetic workpiece 17 to the second type of ferromagnetic workpiece 17 and vice versa.

Additionally or alternatively, the min/max leakage flux values can be correlated to the any number of positions of the robotic arm 704 during the robotic arm's cycle, as represented at block 924. This may be beneficial if there's a specific position where the robotic arm 704 experiences an unusually high amount of interference. That is, in the event the robotic arm 704 experiences an unusually high amount of interference at a position, the min/max leakage flux values experienced at this position may be extreme. And, if they're the only min/max leakage flux values stored to memory 774, other leakage flux values sensed throughout the process, that may be indicative of coupling issues with the magnetic coupling devices 10, may not trigger a warning because they do not surpass the extreme min/max leakage values sensed at the position where an unusually high amount of interference is experienced. As such, the min/max leakage values may be correlated to specific positions of the robotic arm 704 in at least some embodiments.

Additionally or alternatively, the min/max leakage flux values can be correlated to the any number of times during the robotic arm's 704 operational cycle, as represented at block 924. This may be beneficial if there's a specific time where the robotic arm 704 experiences an unusually high amount of interference. For example, the robotic arm 704 may be located in a position where it experiences a low level of interference at a first time, but at another time the robotic arm 704 may experience a high level of interference in the same position due to, e.g., another machine moving near the robotic arm 704. As such, the min/max leakage flux values experienced at a single position may be low at some times and high at other times. And, in the event a single min/max leakage flux is used for this position, a warning may be triggered during the times at which there is a high amount of interference. To reduce the likelihood this occurs, the min/max leakage values may be correlated to times during the operational cycle of the robotic arm 704 in at least some embodiments. In at least some embodiments, the min/max leakage values may be correlated to both times and positions of the operational cycle of the robotic arm 704.

Similarly, if the robotic arm 704 is instead a stationary machine (e.g., does not move and/or does not include any moving parts), the stationary machine may experience high amounts of interference at some times and not other times. As such, the min/max leakage values of the magnetic coupling devices 10 attached to the stationary machine may be correlated to specific times of the operational cycle of the stationary machine to account for these high interferences.

After the min/max leakage values are stored to memory 774, the sequence proceeds to block 906 where the calibration sequence ends, or the sequence can return to block 912 where the calibration sequence 900 is run again without a ferromagnetic workpiece 17.

Alternatively, if a ferromagnetic workpiece is not present at block 912, the sequence 900 proceeds to block 926 where the min/max leakage flux values from the originally sampled magnetic sensors values are stored to memory 774. These min/max leakage flux values are associated with no ferromagnetic workpiece present. Next, the robotic arm 704 performs its cycle by, for example, moving from the first position (illustrated in FIG. 38) to the second position (illustrated in FIG. 39), as represented by block 928. While the robotic arm 704 performs its cycle, the sensed values of the magnetic field sensors are sampled (block 930) and the stored min/max leakage flux values are updated (block 932).

In at least some embodiments, the min/max leakage flux values can be correlated to any number of positions and/or times of the robotic arm 704 during the robotic arm's cycle, as represented at block 934 for similar reasons as the reasons set forth above with respect to block 924. After the min/max leakage values are stored to memory 774, the sequence proceeds to block 906 where the calibration sequence ends or the sequence can proceed to block 912 where the calibration sequence 900 is run again with a ferromagnetic workpiece 17 in the event the calibration sequence 900 hasn't been run with a ferromagnetic workpiece 17 attached to the magnetic coupling devices.

In at least some embodiments, the robotic arm 704 (or stationary machine) may have an operational cycle where the robotic arm 704 (or stationary machine) is couple to a ferromagnetic workpiece 17 for some of the time and the robotic arm 704 (or stationary machine) is not coupled to the ferromagnetic workpiece 17. In these embodiments, the sequence identified as blocks 912-924 may be performed for the portion of the operational cycle when the ferromagnetic workpiece 17 is present and the sequence identified as block 912 and blocks 926-934 may be performed for the portion of the operational cycle when the ferromagnetic piece is not present.

Based on the min/max leakage fluxes, the controller may determine whether one or more of the magnetic coupling devices 10 have a secure couple to a ferromagnetic workpiece 17 and/or whether one or more of the magnetic coupling devices 10 are operating properly. For example, if a sensed leakage flux at a specific position/time is less than the stored/updated min leakage flux for the specific position/time by a threshold amount, for example, on a percentage basis (e.g., exceeds+/−1%) or an absolute basis, when the magnetic coupling device 10 is coupled to a ferromagnetic workpiece 17, it may be determined the magnetic coupling device 10 has coupled to more than one ferromagnetic workpiece 17. As another example, if a sensed leakage flux at a specific position/time is greater than the stored/updated max leakage flux for the specific position/time by a threshold amount, for example, on a percentage basis (e.g., exceeds+/−1%) or an absolute basis, when the magnetic coupling device 10 is coupled to a ferromagnetic workpiece 17, it may be determined the magnetic coupling device 10 is not securely coupled to the ferromagnetic workpiece 17 and/or the magnetic coupling device 10 is operating in a degraded state due to, e.g., degradation of the pole shoes/housing. As a further example, if a sensed leakage flux is below the stored/updated min leakage flux by a threshold amount, for example, on a percentage basis (e.g., exceeds+/−1%) or an absolute basis, when the magnetic coupling device 10 is turned on and no ferromagnetic workpiece 17 is present, it may be determined the magnetic coupling device 10 is operating in a degraded state due to, e.g., failure to activate properly (e.g., not rotated enough or rotated too far, etc.). As even a further example, if a sensed leakage flux is greater than the stored/updated max leakage flux or less than the stored/updated min leakage flux by a threshold amount, for example, on a percentage basis (e.g., exceeds+/−1%) or an absolute basis, when the magnetic coupling device 10 is coupled to a ferromagnetic workpiece 17, it may be determined the magnetic coupling device 10 is coupled to a ferromagnetic workpiece 17 it didn't intend to couple to.

FIG. 41 is a side view of a portion of an exemplary pole shoe 200 which may serve as either pole shoe 38 of magnetic device 10. Pole shoe 200 comprises a first portion 202 that can be positioned proximate the housing of a magnetic device (e.g., the magnetic device 10). Pole shoe 200 may also include bores 204 extending through pole shoe 200 to releasably secure pole shoe 200 to a housing of a magnetic device via a fastening mechanism (e.g., fastening screws, etc.). Furthermore, pole shoe 200 includes a plurality of projections 206 arranged on a bottom portion 208 of pole shoe 200. Each of projections 206 are separated by recess portions 210. Additionally, the plurality of projections 206 collectively form a workpiece contact interface 212 of pole shoe 200.

As stated above, due to the plurality of projections 206 included in pole shoe 200, a magnetic device including pole shoe 200 produces a stronger magnetic field near workpiece contact interface 212 than a magnetic device including a pole shoe having a flush continuous lower profile. The magnetic field produced near workpiece contact interface 212 may be referred to herein as the shallow magnetic field. Furthermore, by including the plurality of projections 206 on pole shoe 200, a magnetic device including pole shoe 200 produces a weaker magnetic field farther away in depth from pole shoe 200 than a magnetic device including a pole shoe with a flush continuous lower profile. The magnetic field produced farther away from the pole shoe 200 may be referred to herein as a far-field or deep magnetic field produced by pole shoe 200. Stated another way, a magnetic device including pole shoe 200 having projections 206 has a stronger holding force near workpiece contact interface 212 than a magnetic device including a pole shoe with a flush continuous interface that doesn't include projections 206.

In embodiments, the shallow magnetic field and the far-field magnetic field of a pole shoe 200 may be dependent on the type of pole shoe 200. In particular, the shallow magnetic field may be the magnetic field produced from the workpiece contact interface 212 to a distance from the workpiece contact interface 212 that is approximately equal to the width 214 of the projections 206. For example, if the widths 214 of the projections 206 are 2 mm, then the shallow magnetic field is the magnetic field produced from the workpiece contact interface 212 to a 2 mm depth from the workpiece contact interface 212. Furthermore, the far-field magnetic field produced in this example is the magnetic field produced at a depth greater than 2 mm from the workpiece contact interface 212.

As a result of a magnetic device 10 producing a stronger shallow magnetic field and a weaker far-field magnetic field because of the projections 206 of pole shoe 200, the magnetic device 10 may be used to de-stack thin ferromagnetic bodies better than a magnetic device 10 having pole shoe without the projections 206. That is, a magnetic device 10 including a pole shoe that doesn't have the projections 206 may produce a stronger far-field magnetic field that will result in multiple thin ferromagnetic bodies being coupled to the magnetic device. When trying to obtain a single thin ferromagnetic body from a stacked array of thin ferromagnetic bodies, this is an undesirable result. As such, instead of using a magnetic device including pole shoe without the projections 206 to de-stack ferromagnetic bodies, a pole shoe 200 including the projections 206 may be used.

In embodiments, varying the widths 214 of the projections 206 result in different shallow magnetic fields produced by the same magnetic device. In embodiments, to produce a preferred shallow magnetic field for a specific ferromagnetic body, the widths 214 of the projections 206 may have a width within approximately +/−25% the thickness of the ferromagnetic body to be de-stacked. For example, when a magnetic device is de-stacking 2 mm thick ferromagnetic sheets, the widths 214 of the projections 206 could be approximately 2 mm (e.g., 2 mm+/−25%). In embodiments, this will produce a strong shallow magnetic field between 0 mm and 2 mm depth from contact interface 212. In at least one embodiment, however, there may be a limit for producing a preferred shallow magnetic field for some ferromagnetic bodies having thicknesses less than the limit. That is, for ferromagnetic bodies having a thickness less than X mm, a preferred shallow magnetic field may be produced by projections 206 having widths 214 that are at a lower limit of X mm but are not less than the lower limit. That is, to produce a preferred magnetic field for a ferromagnetic body having a thickness of ½*X mm, the widths 214 of the projections 206 may be at the lower limit of X mm instead of +/−25% of ½*X mm. If, however, the thickness of the ferromagnetic body is X mm or more, then the widths 214 may approximately equal (e.g., +/−25%) the thickness of the ferromagnetic body. Examples of a lower limit may be in the range of 0 mm to 2 mm. However, this is only an example and not meant to be limiting.

In at least one embodiment, when a magnetic device including a pole shoe 200 is coupling to ferromagnetic bodies having different thicknesses, a pole shoe 200 having widths 214 that is an average of the thickness of the ferromagnetic bodies may be used to reduce the need to change pole shoes. Similar to above, however, a lower limit (e.g., 2.0 mm) may be applied such that if the average thickness of the ferromagnetic bodies is below the lower limit (i.e., <2.0 mm), the widths 214 may be configured to be the lower limit (i.e., 2.0 mm).

In embodiments, varying the depths 216 and/or widths 218 of the recesses 210 result in different shallow magnetic fields produced by the same magnetic device 10. In embodiments, to produce an appropriate shallow magnetic field for a specific ferromagnetic body, the depths 216 and/or widths 218 of the recesses 210 could be approximately the same (e.g., +/−25%) as the widths 214 of the projections 206. For example, if the widths 214 of the projections 206 are 2 mm, then the depths 216 and/or widths 218 of the recesses 210 could be approximately 2 mm (e.g., 2 mm+/−25%). In embodiments, this will produce a strong shallow magnetic field between 0 mm and 2 mm depth from contact interface 212. Similar to above, however, there may be a limit for producing a preferred shallow magnetic field for some ferromagnetic bodies having thicknesses less than the limit. That is, for ferromagnetic bodies having a thickness less than X mm, a preferred shallow magnetic field may be produced by depths 216 and widths 218 that are at a lower limit of X mm but are not less than the lower limit. That is, to produce a preferred magnetic field for a ferromagnetic body having a thickness of ½*X mm, the depths 216 and widths 218 may be at the lower limit of X mm instead of +/−25% of ½*X mm. If, however, the thickness of the ferromagnetic body is X mm or more, then the depths 216 and widths 218 may approximately equal (e.g., +/−25%) the thickness of the ferromagnetic body.

Similar to above, when a magnetic device 10 including pole shoe 200 is coupling ferromagnetic bodies having different thicknesses, a pole shoe 200 having depths 216 and/or widths 218 of recesses 210 that is an average of the thickness of the ferromagnetic bodies may be used to reduce the need to change pole shoes. Moreover, a lower limit (e.g., 2.0 mm) may be applied such that if the average thickness of the ferromagnetic bodies is below the lower limit (i.e., <2.0 mm), the depths 216 and widths 218 may be configured to be the lower limit (i.e., 2.0 mm).

As set forth above, pole shoe 200 may be releasably coupled to a housing of a magnetic device. Therefore, when projections 206 of the pole shoe 200 do not have the appropriate widths 214, depths 216 and/or widths 218 for the ferromagnetic body to which magnetic device 10 is coupling, pole shoe 200 may be replaced by a more appropriate pole shoe 200.

Figure 42A:
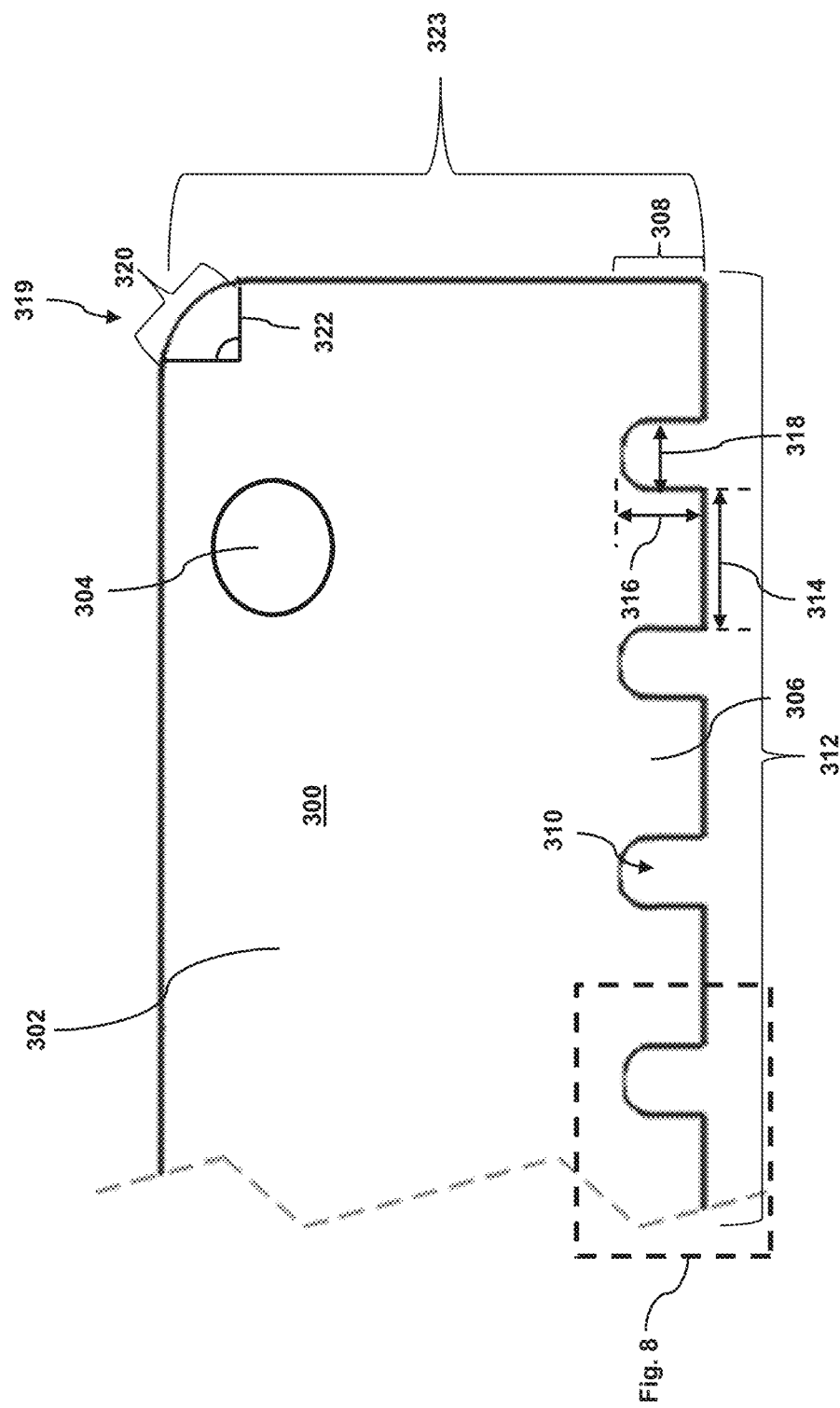
FIG. 42A illustrates a side view of a portion of another exemplary pole shoe and FIG. 42B illustrates a detail view of a portion of the exemplary pole shoe depicted in FIG. 42A.
Figure 42B:
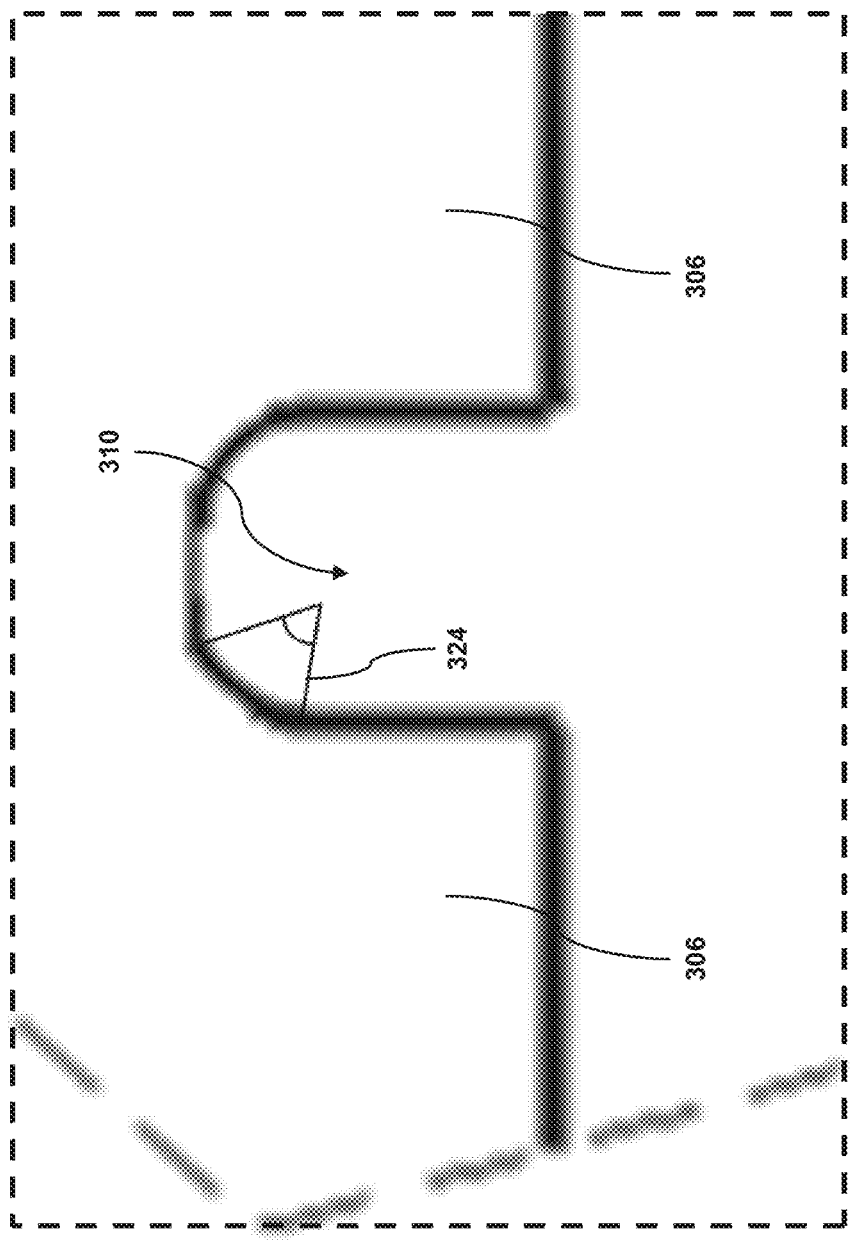

FIG. 42A is a side view of a portion of another exemplary pole shoe 300 which may serve as pole shoe 38 of magnetic device 10 and FIG. 42B illustrates a detail view of a portion of the exemplary pole shoe depicted in FIG. 42A. Similar to pole shoe 200 depicted in FIG. 41, pole shoe 300 comprises a first portion 302 that can be positioned proximate to a housing of a magnetic device (e.g., the magnetic device 10). Pole shoe 300 may also include bores 304 extending through pole shoe 300 to releasably secure pole shoe 300 to housing of magnetic device 10 via a fastening mechanism (e.g., fastening screws, etc.). Furthermore, pole shoe 300 includes a plurality of projections 306 arranged on a bottom portion 308 of the pole shoe 300. Each of projections 306 are separated by a recess portion 310. The plurality of projections 306 collectively form a workpiece contact interface 312 of pole shoe 300.

Similar to above, varying the widths 314 of the projections 306 and/or the depths 316, and/or widths 318 of the recesses 310 result in different shallow magnetic fields produced by the same magnetic device 10. In embodiments, to produce an appropriate shallow magnetic field for a specific ferromagnetic body, the widths 314 of the projections and/or the depths 316, and/or widths 318 of the recesses 310 could be approximately the same (e.g., +/−25%) as the thickness of the ferromagnetic body to be coupled to magnetic device 10. In at least one embodiment, however, there may be a limit for producing a preferred shallow magnetic field for some ferromagnetic bodies having thicknesses less than the limit. That is, for ferromagnetic bodies having a thickness less than X mm, a preferred shallow magnetic field may be produced by widths 314, depths 316, and/or widths 318 that are at a lower limit of X mm but are not less than the lower limit. That is, to produce a preferred magnetic field for a ferromagnetic body having a thickness of ½*X mm, the widths 314, depths 316, and/or widths 318 may be at the lower limit of X mm instead of +/−25% of ½*X mm. If, however, the thickness of the ferromagnetic body is X mm or more, then the widths 314, depths 316, and/or widths 318 may approximately equal (e.g., +/−25%) the thickness of the ferromagnetic body. Examples of a lower limit may be in the range of 0 mm to 2 mm. However, this is only an example and not meant to be limiting.

Alternatively, when a magnetic device including the pole shoe 300 is coupling to ferromagnetic bodies having different thicknesses, a pole shoe 300 having widths 314, depths 316, and/or widths 318 that is about an average of the thickness of the ferromagnetic bodies may be used to reduce the need to change pole shoes. Similar to above, however, a lower limit (e.g., 2.0 mm) may be applied such that if the average thickness of the ferromagnetic bodies is below the lower limit (i.e., <2.0 mm), the widths 314, depths 316, and/or widths 318 may be configured to be the lower limit (i.e., 2.0 mm).

In embodiments, upper portions 319 of pole shoe 300 have a continuous slope profile (the slope is defined at all points, no sharp corners). Illustratively, the upper corners 319 of pole shoe 300 may have a rounded shoulder portion 320. A magnetic device 10 including a pole shoe 300 having a rounded shoulder 320 has been shown to have a higher magnetic flux transfer to a ferromagnetic body than a magnetic device having a pole shoe with sharp corners. Accordingly, in at least one embodiment, the upper corners 319 of the pole shoe 300 include rounded shoulder portions 320. In one example, the radius of curvature 322 of the rounded shoulder portion 320 may preferably range from 1%-75% of the height 323 of the pole shoe 300. In another example, the radius of curvature 322 may preferably range from 25%-75% of the height 323 of the pole shoe 300. In a further example, the radius of curvature 322 may preferably be in the range of 40%-60% of the height 323 of the pole shoe 300.

Referring to FIG. 42B, additionally or alternatively, the recess portions 310 between the projections 306 may have a continuous slope profile (the slope is defined at all points, no sharp corners) at their upper extremes. Similar to having a rounded shoulder 320, magnetic device including a pole shoe 300 having a curved recess portions 310 may have a higher magnetic flux transfer to a ferromagnetic body than a magnetic device including a pole shoe that includes recessed portions with sharp corners. In embodiments, to provide a high magnetic flux transfer, the radius of curvature 324 of the curved recess portions 310 may be approximately ½ the width 318 of the recesses 310. Test data has indicated an improvement greater than 3% may be obtained by including a slope profile of the recess portions 310 that is ½ the width 318 of the recesses 324.

FIG. 43 is a side view of a portion of another exemplary pole shoe 1400 which may serve as pole shoe 38 of magnetic device 10. Similar to pole shoes 200, 300 depicted in FIGS. 41 and 42A-42B, respectively, pole shoe 1400 comprises a first portion 1402 that can be positioned proximate a housing of a magnetic device (e.g., the magnetic device 10). Pole shoe 1400 may also include bores 1404 extending through pole shoe 1400 to releasably secure pole shoe 1400 to a housing of a magnetic device via a fastening mechanism (e.g., fastening screws, etc.). Furthermore, pole shoe 1400 includes a plurality of projections 1406 arranged on a bottom portion 1408 of pole shoe 1400. Each of the projections 1406 are separated by recess portions 1410. The plurality of projections 1406 collectively form a workpiece contact interface 1412 of pole shoe 1400.

Similar to above, varying the widths 1414 of the projections 1406 and/or the depths 1416, and/or widths 1418 of the recesses 1410 result in different shallow magnetic fields produced by the same magnetic device 10. In embodiments, to produce an appropriate shallow magnetic field for a specific ferromagnetic body, the widths 1414 of the projections 1406 and/or the depths 1416, and/or widths 1418 of the recesses 1410 could be approximately the same (e.g., +/−25%) as the thickness of the ferromagnetic body. In at least one embodiment, however, there may be a limit for producing a preferred shallow magnetic field for some ferromagnetic bodies having thicknesses less than the limit. That is, for ferromagnetic bodies having a thickness less than X mm, a preferred shallow magnetic field may be produced by widths 1414, depths 1416, and/or widths 1418 that are at a lower limit of X mm but are not less than the lower limit. That is, to produce a preferred magnetic field for a ferromagnetic body having a thickness of ½*X mm, the widths 1414, depths 1416, and/or widths 1418 may be at the lower limit of X mm instead of +/−25% of ½*X mm. If, however, the thickness of the ferromagnetic body is X mm or more, then the widths 1414, depths 1416, and/or widths 1418 may approximately equal (e.g., +/−25%) the thickness of the ferromagnetic body. Examples of a lower limit may be in the range of 0 mm to 2 mm. However, this is only an example and not meant to be limiting.

Alternatively, when a magnetic device including pole shoe 1400 is coupling to ferromagnetic bodies having different thicknesses, a pole shoe 1400 having widths 1414, depths 1416, and/or widths 1418 that is an average of the thickness of the ferromagnetic bodies may be used to reduce the need to change pole shoes. Similar to above, however, a lower limit (e.g., 2.0 mm) may be applied such that if the average thickness of the ferromagnetic bodies is below the lower limit (i.e., <2.0 mm), the widths 1414, depths 1416, and/or widths 1418 may be configured to be the lower limit (i.e., 2.0 mm).

In embodiments, pole shoe 1400 may also include compressible members 1420 arranged between projections 1406 in the recessed portions 1410. In embodiments, the compressible members 1420 compresses when magnetic device 10 including the pole shoe 1400 couples to a ferromagnetic body. Due to the compression of compressible members 1420, static friction between compressible members 1420 and the ferromagnetic body is created that is potentially greater than the static friction between the projections 1406 and the ferromagnetic body. As such, a ferromagnetic body coupled to a magnetic device 10 including the pole shoe 1400 may be less like to rotate and translate than if the ferromagnetic body was coupled to a pole shoe that didn't include the compressible members 1420. In embodiments, compressible members 1420 may be comprised of an elastic material such as polymers of isoprene, polyurethane, nitrile rubber and/or the like.

Figure 44B:
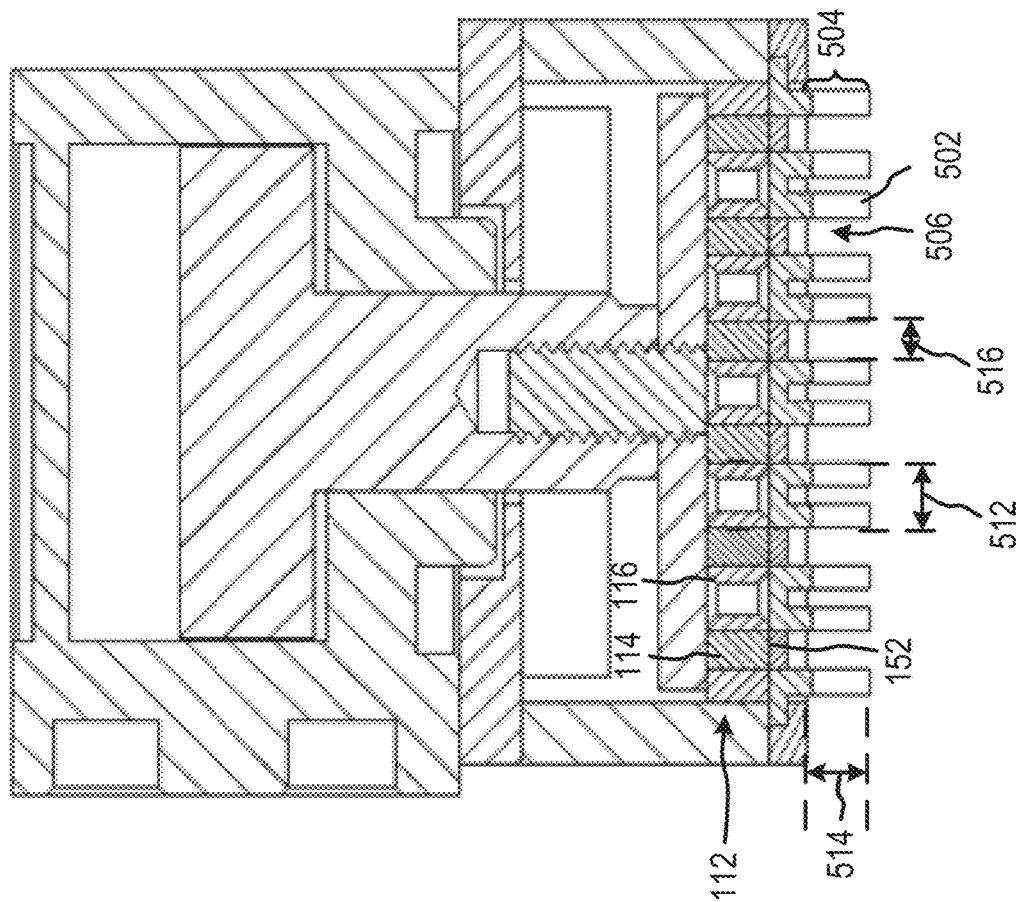
FIGS. 44A-44B illustrates another exemplary pole plate.
Figure 44A:
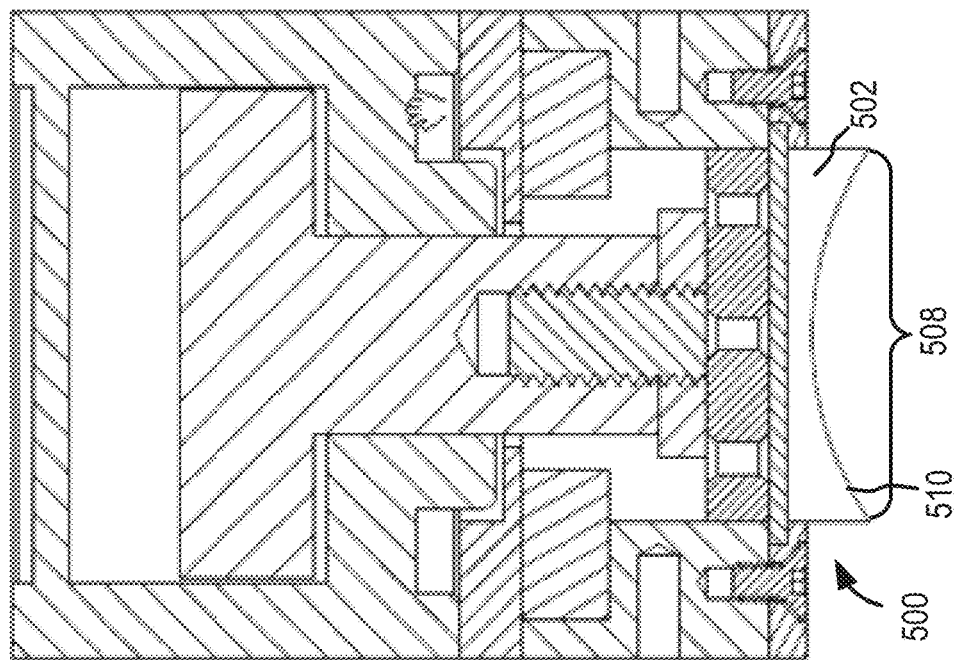

FIGS. 44A-44B depict another exemplary pole plate 500 which can be used as pole shoe 38 of magnetic device 10. Similar to the pole plates 200, 300, 1400 depicted in FIGS. 41, 42A-42B, and 43, pole plate 500 includes a plurality of projections 502 arranged on a bottom portion 504 of pole plate 500. Each of projections 502 are separated by recess portions 506. The plurality of projections 502 collectively form a workpiece contact interface 508 of the pole plate 500.

As illustrated, the workpiece contact interface 508 is non-planar. In embodiments, the non-planar workpiece contact interface 508 may facilitate coupling a magnetic coupling device 10 to a ferromagnetic workpiece having a non-planar surface. For example, a magnetic coupling device 10 including pole plate 500 may be used for coupling magnetic coupling device 10 to one or more types of rods, shafts, etc. (e.g., a cam shaft). While the workpiece contact interface 508 includes a curved surface 510, the workpiece contact interface 508 may have any other type of non-planar surface. For example, the workpiece contact interface 508 may include a similar contour as a ferromagnetic piece to which the magnetic coupling device including the workpiece contact interfaces 508 is intended to couple.

Despite having a non-planar workpiece contact interface 508, varying the widths 512 of the projections 502 and/or the depths 514, and/or widths 516 of the recesses 506 result in different shallow magnetic fields produced by the same magnetic coupling device. In embodiments, to produce an appropriate shallow magnetic field for a specific ferromagnetic workpiece, the widths 512 of the projections 552 and/or the depths 514, and/or widths 516 of the recesses 506 could be approximately the same (e.g., +/−25%) as the thickness of the ferromagnetic workpiece. In at least one embodiment, however, there may be a limit for producing a preferred shallow magnetic field for some ferromagnetic workpieces having thicknesses less than the limit. That is, for ferromagnetic workpieces having a thickness less than X mm, a preferred shallow magnetic field may be produced by widths 512, depths 514, and/or widths 516 that are at a lower limit of X mm but are not less than the lower limit. That is, to produce a preferred magnetic field for a ferromagnetic workpiece 17 having a thickness of ½*X mm, the widths 512, depths 514, and/or widths 516 may be at the lower limit of X mm instead of +/−25% of ½*X mm. If, however, the thickness of the ferromagnetic workpiece is X mm or more, then the widths 512, depths 514, and/or widths 516 may approximately equal (e.g., +/−25%) the thickness of the ferromagnetic workpiece. Examples of a lower limit may be in the range of 0 mm to 2 mm. However, this is only an example and not meant to be limiting.

Alternatively, when a magnetic coupling device including pole plate 500 is coupling to ferromagnetic workpieces having different thicknesses, a pole plate 500 having widths 512, depths 514, and/or widths 516 that is an average of the thickness of the ferromagnetic workpieces may be used to reduce the need to change pole plates. Similar to above, however, a lower limit (e.g., 2.0 mm) may be applied such that if the average thickness of the ferromagnetic workpieces 17 is below the lower limit (i.e., <2.0 mm), the widths 512, depths 514, and/or widths 516 may be configured to be the lower limit (i.e., 2.0 mm).

Figure 45B:
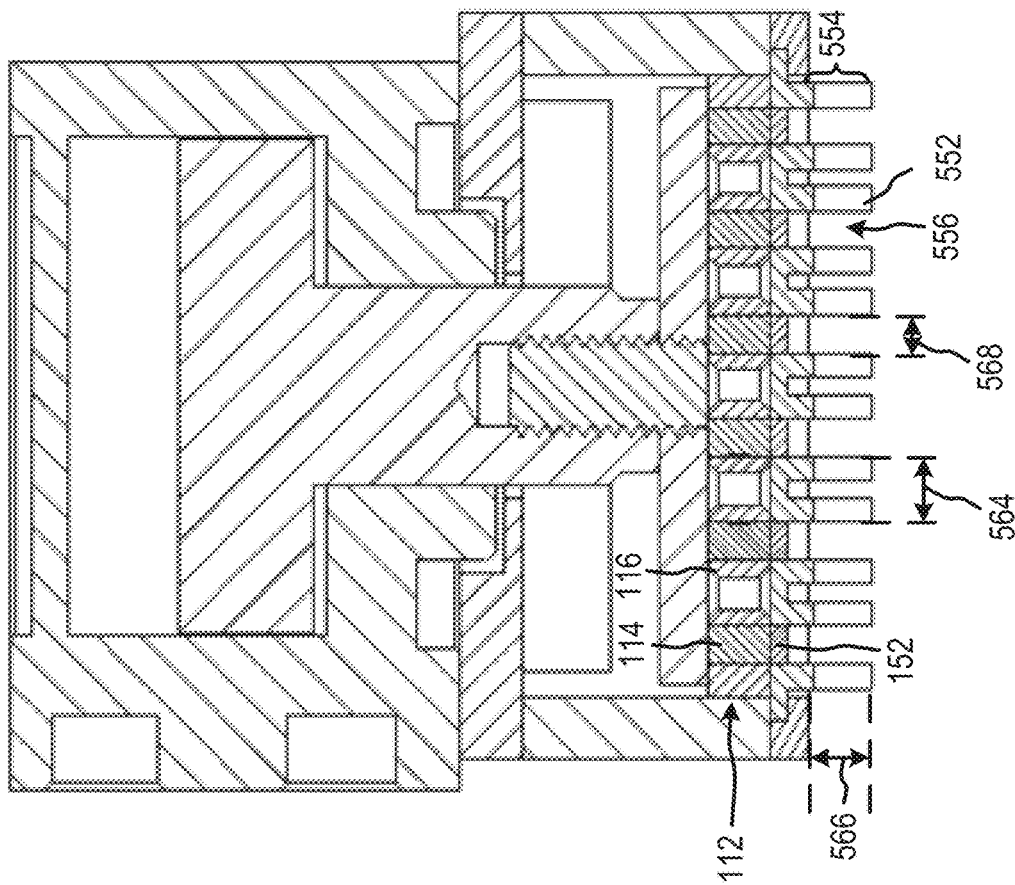
FIGS. 45A-45B illustrates another exemplary pole plate.
Figure 45A:
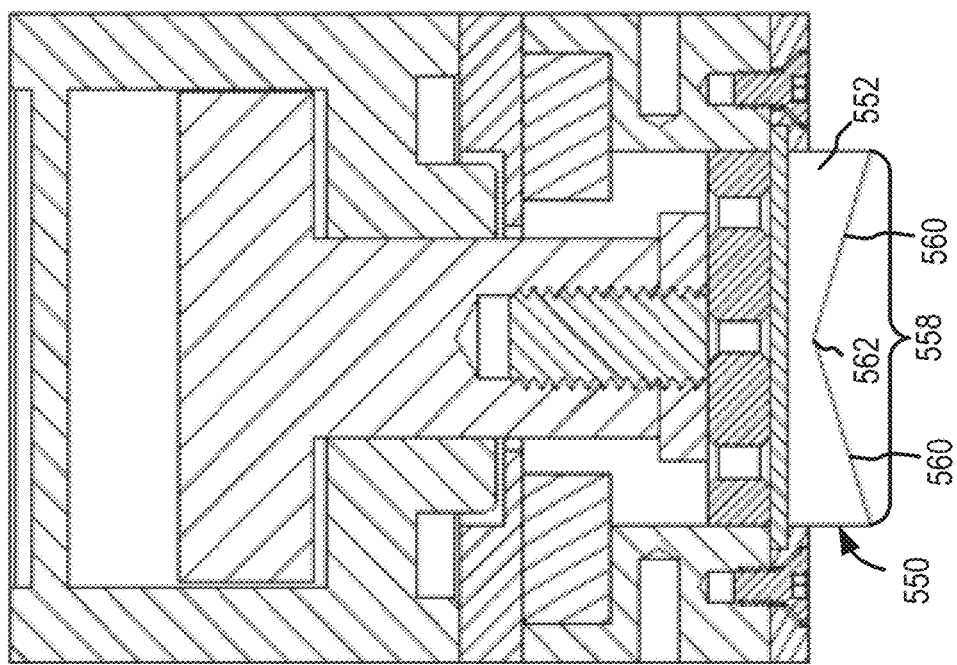

FIGS. 45A-45B depict another exemplary pole plate 550 which can be used as pole shoe 38 of magnetic device 10. Similar to the pole plates 200, 300, 1400, 500 depicted in FIGS. 41, 42A-42B, 43, 44A-44B, pole plate 550 includes a plurality of projections 552 arranged on a bottom portion 554 of pole plate 550. Each of projections 552 are separated by recess portions 556. The plurality of projections 552 collectively form a workpiece contact interface 558 of the pole plate 550.

As illustrated, the workpiece contact interface 558 is non-planar. In embodiments, the non-planar workpiece contact interface 558 may facilitate coupling a magnetic coupling device 10 to a ferromagnetic workpiece having a non-planar surface. For example, a magnetic coupling device including pole plate 550 may be used for coupling magnetic coupling device 10 to one or more edges, corners, etc. of a ferromagnetic workpiece. While the workpiece contact interface 558 includes two downwardly sloping surfaces 560 extending from a center point 562, the workpiece contact interface 558 may have any other type of non-planar surface. For example, the workpiece contact interface 558 may include a similar contour as a ferromagnetic piece to which the magnetic coupling device including the workpiece contact interfaces 558 is intended to couple.

Despite having a non-planar workpiece contact interface 558, varying the widths 564 of the projections 552 and/or the depths 566, and/or widths 568 of the recesses 556 result in different shallow magnetic fields produced by the same magnetic coupling device. In embodiments, to produce an appropriate shallow magnetic field for a specific ferromagnetic workpiece, the widths 564 of the projections 552 and/or the depths 566, and/or widths 568 of the recesses 556 could be approximately the same (e.g., +/−25%) as the thickness of the ferromagnetic workpiece. In at least one embodiment, however, there may be a limit for producing a preferred shallow magnetic field for some ferromagnetic workpieces having thicknesses less than the limit. That is, for ferromagnetic workpieces having a thickness less than X mm, a preferred shallow magnetic field may be produced by widths 564, depths 566, and/or widths 568 that are at a lower limit of X mm but are not less than the lower limit. That is, to produce a preferred magnetic field for a ferromagnetic workpiece having a thickness of ½*X mm, the widths 564, depths 566, and/or widths 568 may be at the lower limit of X mm instead of +/−25% of ½*X mm. If, however, the thickness of the ferromagnetic workpiece is X mm or more, then the widths 564, depths 566, and/or widths 568 may approximately equal (e.g., +/−25%) the thickness of the ferromagnetic workpiece. Examples of a lower limit may be in the range of 0 mm to 2 mm. However, this is only an example and not meant to be limiting.

Alternatively, when a magnetic coupling device including pole plate 550 is coupling to ferromagnetic workpieces 17 having different thicknesses, a pole plate 550 having widths 564, depths 566, and/or widths 568 that is an average of the thickness of the ferromagnetic workpieces may be used to reduce the need to change pole plates. Similar to above, however, a lower limit (e.g., 2.0 mm) may be applied such that if the average thickness of the ferromagnetic workpieces is below the lower limit (i.e., <2.0 mm), the widths 564, depths 566, and/or widths 568 may be configured to be the lower limit (i.e., 2.0 mm).

FIG. 46A is a front view of an exemplary switchable magnetic device 1600 and FIG. 46B is a side view of the switchable magnetic device 1600. Magnetic device 1600 includes pole shoes 1602', 1602" and a housing 1604. In embodiments, magnetic device 1600 may have some or all of the same features and/or functionality as the magnetic device 10 and pole shoes 1602', 1602" may have some or all of the same features and/or functionality as pole shoes 38. Additionally or alternatively, pole shoes 1602', 1602" may have some or all the same features as pole shoes 200, 300, 1400 depicted in FIGS. 41, 42, and 43, respectively. For example, pole shoes 1602', 1602" comprise a first portion 1606 that can be positioned proximate housing 1604. Pole shoes 1602', 1602" may also include bores 1608 extending through pole shoes 1602', 1602" to releasably secure pole shoes 1602', 1602" to housing 1604 via a fastening mechanism (e.g., fastening screws, etc.). Furthermore, pole shoes 1602', 1602" includes a plurality of projections 1610 arranged on a bottom portion 1612 of pole shoes 1602', 1602". Each of the projections 1610 are separated by a recess portion 1614. The plurality of projections 1610 included in pole shoe 1602' collectively form a workpiece contact interface 1616' of pole shoe 1602', and the plurality of projection included in pole shoe 1602" collectively form a workpiece contact interface 1616" of pole show 1602".

Furthermore, varying the widths 1618 of the projections 1622 and/or depths 1620, and/or widths 1622 of the recesses 1614 result in different shallow magnetic fields produced by the same magnetic device 1600. In embodiments, to produce an appropriate shallow magnetic field for a specific ferromagnetic body, the widths 1618 of the projections 1622 and/or the depths 1620, and/or widths 1622 of the recesses 1614 could be approximately the same (e.g., +/−25%) as the thickness of the ferromagnetic body. In at least one embodiment, however, there may be a limit for producing a preferred shallow magnetic field for some ferromagnetic bodies having thicknesses less than the limit. That is, for ferromagnetic bodies having a thickness less than X mm, a preferred shallow magnetic field may be produced by widths 1618, depths 1620, and/or widths 1622 that are at a lower limit of X mm but are not less than the lower limit. That is, to produce a preferred magnetic field for a ferromagnetic body having a thickness of ½*X mm, the widths 1618, depths 1620, and/or widths 1622 may be at the lower limit of X mm instead of +/−25% of ½*X mm. If, however, the thickness of the ferromagnetic body is X mm or more, then the widths 1618, depths 1620, and/or widths 1622 may approximately equal (e.g., +/−25%) the thickness of the ferromagnetic body. Examples of a lower limit may be in the range of 0 mm to 2 mm. However, this is only an example and not meant to be limiting.

Alternatively, when magnetic device 1600 to is used to couple to ferromagnetic bodies having different thicknesses, the widths 1618 of the projections 1622 and/or the depths 1620, and/or widths 1622 of recesses 1614 that is an average of the thickness of the ferromagnetic bodies may be used to reduce the need to change pole shoes. Similar to above, however, a lower limit (e.g., 2.0 mm) may be applied such that if the average thickness of the ferromagnetic bodies is below the lower limit (i.e., <2.0 mm), the widths 1618, depths 1620, and/or widths 1622 may be configured to be the lower limit (i.e., 2.0 mm).

While pole shoes 1602', 1602" depicted do not include rounded shoulders (e.g., the rounded shoulder 320) and/or a curved recess portions (e.g., the curved recess portion 310), in the alterative embodiments, pole shoes 1602', 1602" may include one or both of those features. Additionally or alternatively, while pole shoes 1602', 1602" depicted do not include compressible members (e.g., the compressible members 1420), in alternative embodiments, pole shoes 1602', 1602" may include one or both of those features.

As illustrated, pole shoes 1602', 1602" have respective thicknesses 1624', 1624". In embodiments, different thicknesses 1624', 1624" may produce different shallow magnetic fields and far-field magnetic fields by magnetic device 1600. That is, similar to the widths 1618 of the projections 1610, thicknesses 1624', 1624" approximately the same as the thickness of a ferromagnetic body to which magnetic device 1600 couples to produces an appropriate shallow magnetic field for de-stacking the ferromagnetic body. For example, when magnetic device 1600 is de-stacking 2 mm thick ferromagnetic sheets, the thicknesses 1624', 1624" could be approximately 2 mm (e.g., 2 mm+/−25%). In embodiments, this will produce a strong shallow magnetic field between 0 mm and 2 mm. In embodiments, pole shoes 1602', 1602" may be either comprised of 304 Stainless Steel and/or include aluminium surrounding at least a portion of pole shoes 1602', 1602" to add structural integrity to the pole shoes 1602', 1602". In embodiments, this may be particularly advantageous when pole shoes 1602', 1602" have thin thicknesses 1624', 1624" (e.g., less than or equal to 5 mm).

Additionally or alternatively, housing 1604 may include an offset 1626 from the workpiece contact interfaces 1616', 1616". In embodiments, offset 1626 may be dependent on the magnetic field produced by magnetic device 1600. That is, in embodiments, offset 1626 may be a percentage of the shallow magnetic field depth produced by magnetic device 1600. Additionally or alternatively, the offset 1626 may be a percentage of the thickness of the workpiece. For example, if magnetic device 1600 is configured to produce a shallow magnetic field within the workpiece having a depth of X mm and/or couple to a workpiece that is X mm thick, then offset 1626 may be a percentage (greater or less than 100%) of the X. In one example, offset 1626 may preferably be in the range of 100% to 700% of the depth of the shallow magnetic field. In another example, offset 1626 may preferably be in the range of 200% to 600% of the depth of the shallow magnetic field. In a further example, the offset 1626 may preferably be in the range of 300% to 500% of the depth of the shallow magnetic field. In yet another example, offset 1626 may preferably be in the range of 350% to 400% of the depth of the shallow magnetic field.

Additionally or alternatively, pole shoes 1602', 1602" may extend along direction 1628 by distances 1630, 1632 beyond a front face 1634 and a rear face 1636 of the housing 1604, respectively. Stated another way, the width 1637 of the pole shoes 1602', 1602" may be longer than the depth 1638 of the housing 1604. By extending beyond the front and rear faces 1634, 1636, the contact area between the workpiece contact interfaces 1616', 1616" and a ferromagnetic body. The increased contact area of the workpiece contact interfaces 1616', 1616" may increase the holding force and/or shear force of the magnetic device 1600. In one example, the distance 1630, the distance 1632, and/or the width 1637 may vary depending on the ferromagnetic body that the magnetic device 1600 is coupling. That is, depending on a preferably holding force for a ferromagnetic body, the distance 1630, the distance 1632, and/or the width 1637 may be varied to achieve the preferable holding force. As another example, the distance 1630, the distance 1632, and/or the width 1637 may be a percentage (greater or less than 100%) of the depth 1638 of the housing 1604. In one example, the distance 1630 and/or the distance 1632 may preferably be in the range of 25% to 75% of the depth 1638 of the housing 1604. In another example, the distance 1630 and/or the distance 1632 may preferably be in the range of 35% to 65% of the depth 1638 of the housing 1604. In yet another example, the distance 1630 and/or the distance 1632 may preferably be in the range of 45% to 55% of the 1632 of the depth 1638 of the housing 1604.

The thickness 1640 of the pole shoes 1602', 1602" may also be varied. Similar to increasing the width 1637 of the pole shoes 1602', 1602", increasing the thickness 1640 of the pole shoes 1602', 1602" increases the contact area between the workpiece contact interfaces 1616', 1616" and a ferromagnetic body. The increased contact area of the workpiece contact interfaces 1616', 1616" may increase the holding force and/or shear force of the magnetic device 1600. Accordingly, the thickness 1640 may be varied depending on a desired holding force of the magnetic device 1600. In one example, the thickness 1640 may approximately match the thickness of a ferromagnetic body that the magnetic device 1600 is coupling. In another example, the thickness 1640 may vary in relation to the width 1637. That is, depending on a ferromagnetic body that the magnetic device 1600 is coupling, it may be preferable to maintain a surface area of the contact interface 1616', 1616" and, therefore, a holding force of the magnetic device 1600. As such, as the width 1637 is increased, the thickness 1640 may decreased and vice-versa. Therefore, if a holding force and a wider pole shoe 1616', 1616" are preferable for a ferromagnetic body, the preferred holding force may be maintained by decreasing the thickness 1640 and increasing the width 1637.

In the embodiments provided above, any of the features of the pole shoes 38, 200, 300, 1400, 500, 550, and 1602 may be used in conjunction with one another. Additionally or alternatively, any of the projections and recesses of the pole shoes 38, 200, 300, 1400, 500, 550, and 1602 may be integrated into the housings of the magnetic devices 10, 1600 instead of being coupled thereto.

Furthermore, as described above, when the projection widths and recess depths/widths exceed a lower limit and the projection widths and recess depths/widths of the pole shoes approximately match the thickness of the ferromagnetic body, pole shoes having said characteristics produce the strongest holding force for a ferromagnetic body having approximately the same thickness as the projection widths and recess depths/widths.

Figure 47:
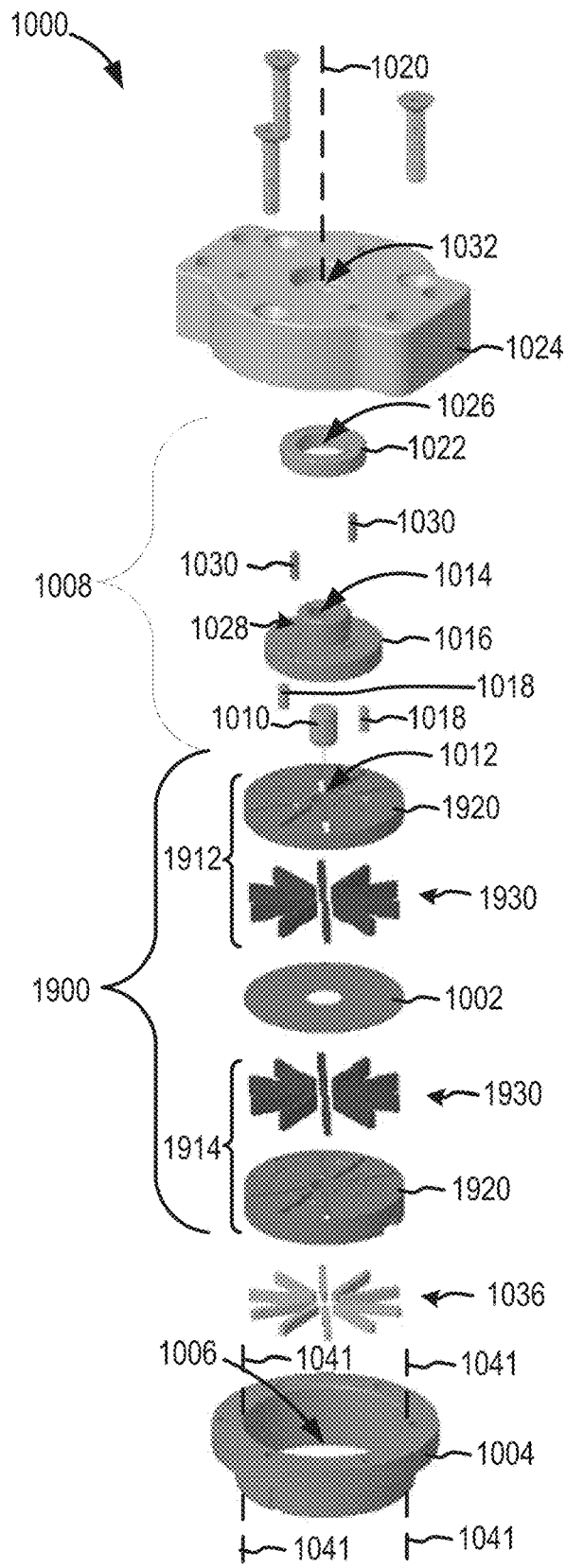
FIG. 47 illustrates an exploded, perspective view of another exemplary magnetic coupling device with pole shoes.

Referring to FIGS. 47-50, another exemplary magnetic coupling device 1000 of the present disclosure is represented. In FIG. 47, an exploded view of the magnetic coupling device 1000 is shown. Magnetic coupling device 1000 includes a similar magnetic assembly 1900 to the magnetic assembly depicted in FIGS. 26-28 with the addition of a spacer 1002 arranged between the permanent magnets of upper platter 1912 and lower platter 1914. Magnetic coupling device 1000 comprises a non-ferromagnetic housing 1004 illustratively having a circular foot print. A circular bore 1006 extends axially from the bottom to the top of housing 1004. The upper platter 1912 and lower platter 1914 are received in bore 1006.

The exemplary magnetic coupling device 1000 includes an actuator assembly 1008 to facilitate rotation of the upper platter 1912 relative to the lower platter 1914. In the illustrated example, the actuator assembly 1008 includes a shaft 1010 that protrudes from a central bore 1012 of the cylindrical base component 1920 of the upper platter 1912 into a central bore 1014 of a rotary actuator 1016 of the actuator assembly 1008. The rotary actuator 1016 is coupled to the cylindrical base component 1920 by pins 1018. As such, when the rotary actuator 1016 is rotated, the rotation of the rotary actuator 1016 is translated to the cylindrical base component 1920 by the pins 1018 and results in rotation of the upper platter 1912 relative to the lower platter 1914. The shaft 1010 facilitates concentric rotation of the rotary actuator 1016 and the second platter 1912 about a central axis 1020.

The actuator assembly 1008 may include an annulus 1022 that facilitates concentric rotation of the rotary actuator 1016 about the central axis 1020. The annulus 1022 fits within a cap component 1024. The annulus 1022 may form a clearance fit with an internal surface of the cap component 1024 to facilitate rotation of the annulus 1022 within the cap component 1024. The annulus 1022 also includes a central bore 1026 that fits over a portion 1028 of the rotary actuator 1016. The annulus 1022 may be coupled to the rotary actuator 1016 via pins 1030. Alternatively, the annulus 1022 may rotate freely relative to the rotary actuator 1016.

Rotation of the rotary actuator 1016 may be accomplished by a torque output shaft (not shown) being inserted into and through a central bore 1031 of the cap component 1024 and received by the central bore 1014 of the rotary actuator 1016. The end of the torque output shaft engages internal ridges (not shown) of the central bore 1014 so that concentric rotation of the torque output shaft translates into concentric rotation of the rotary actuator 1016. As stated above, the rotary actuator 1016 is coupled to the base component 1920 by pins 1018. As such, when the rotary actuator 1016 is rotated by the torque output shaft, the rotation of the rotary actuator 1016 translates to rotation of the upper platter 1920.

Figure 48:
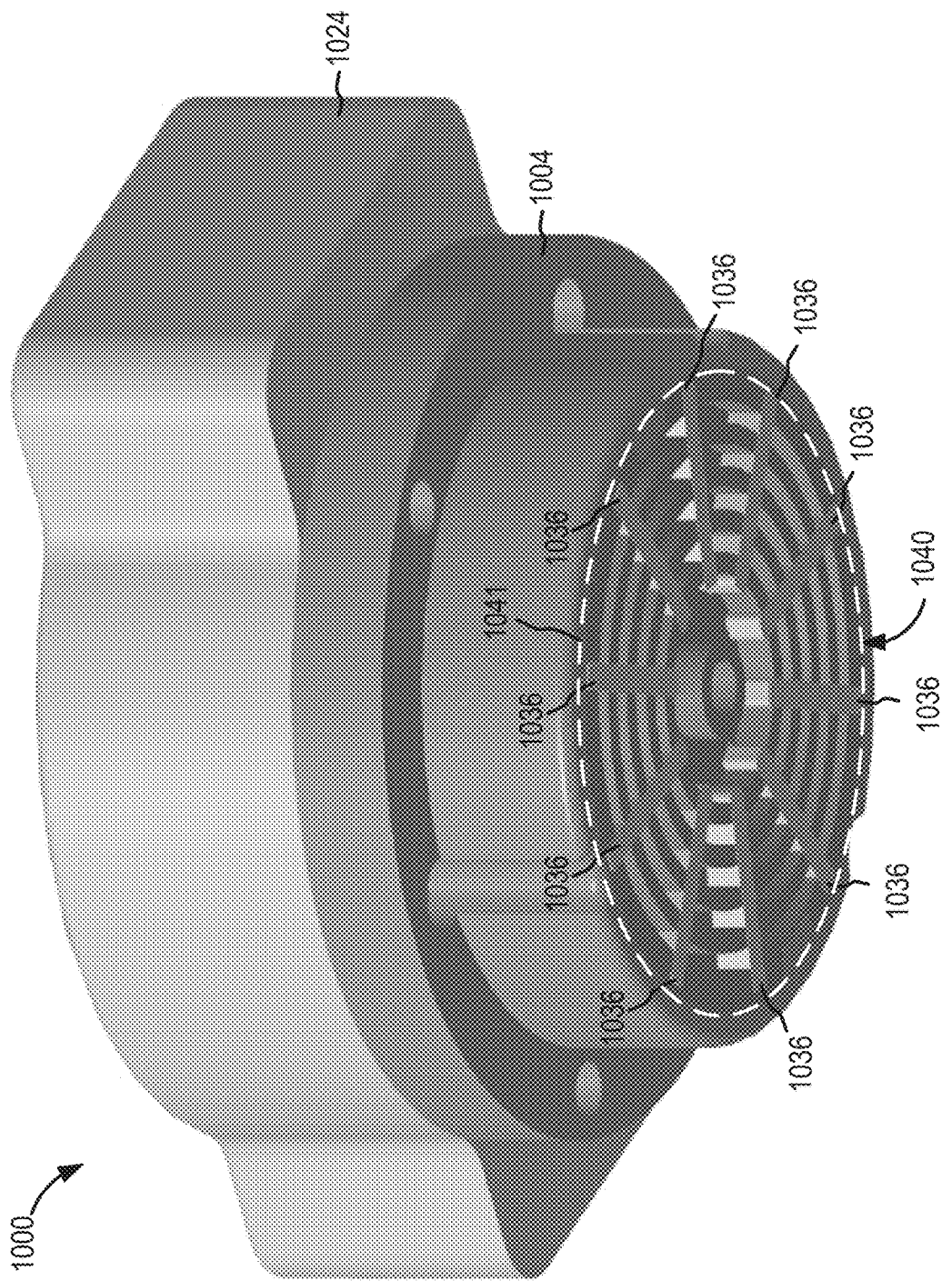
FIG. 48 illustrates a perspective, assembled view of the magnetic coupling device of FIG. 47.
Figure 49:
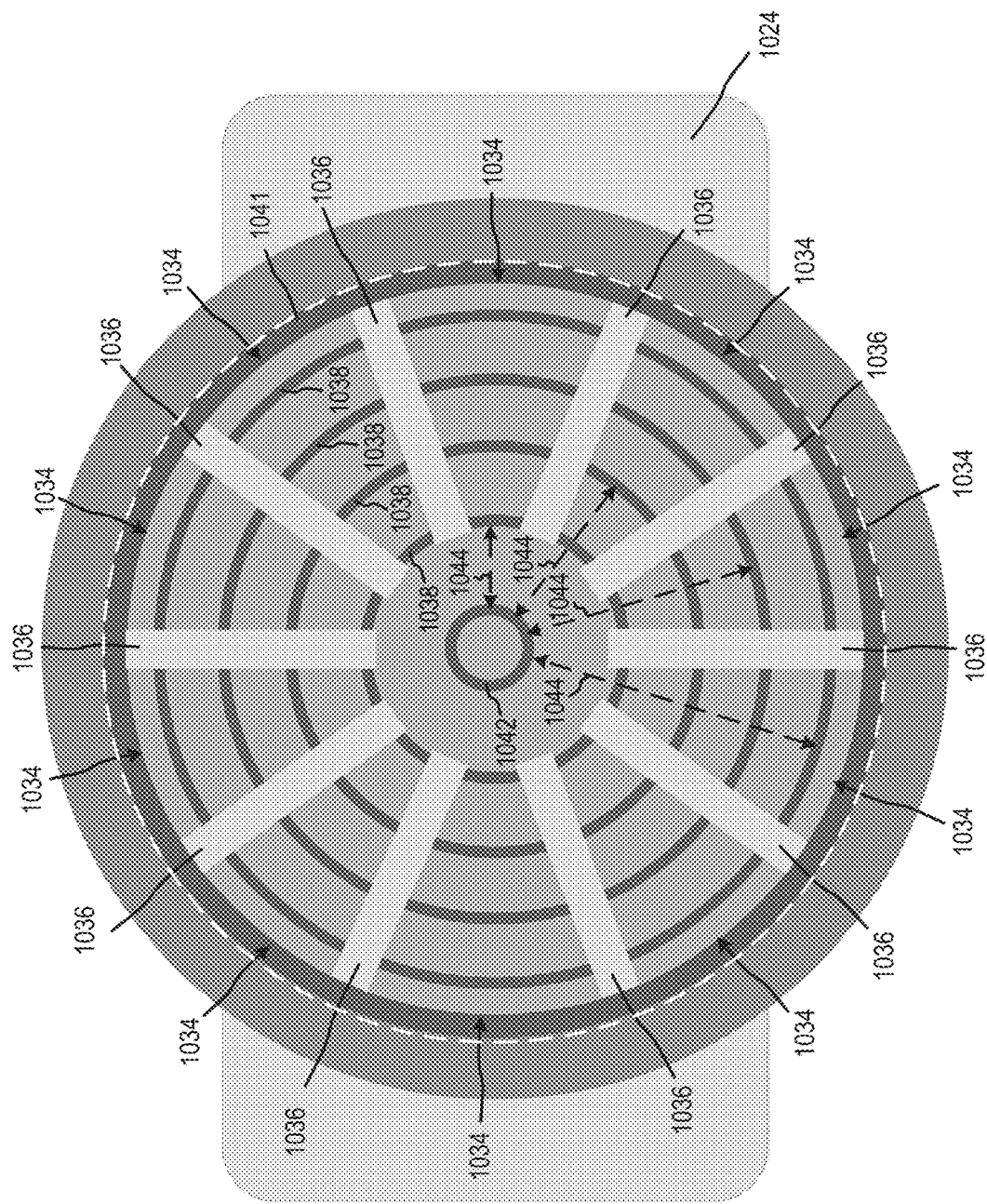
FIG. 49 illustrates a bottom, assembled view of the magnetic coupling device of FIG. 47.
Figure 50:
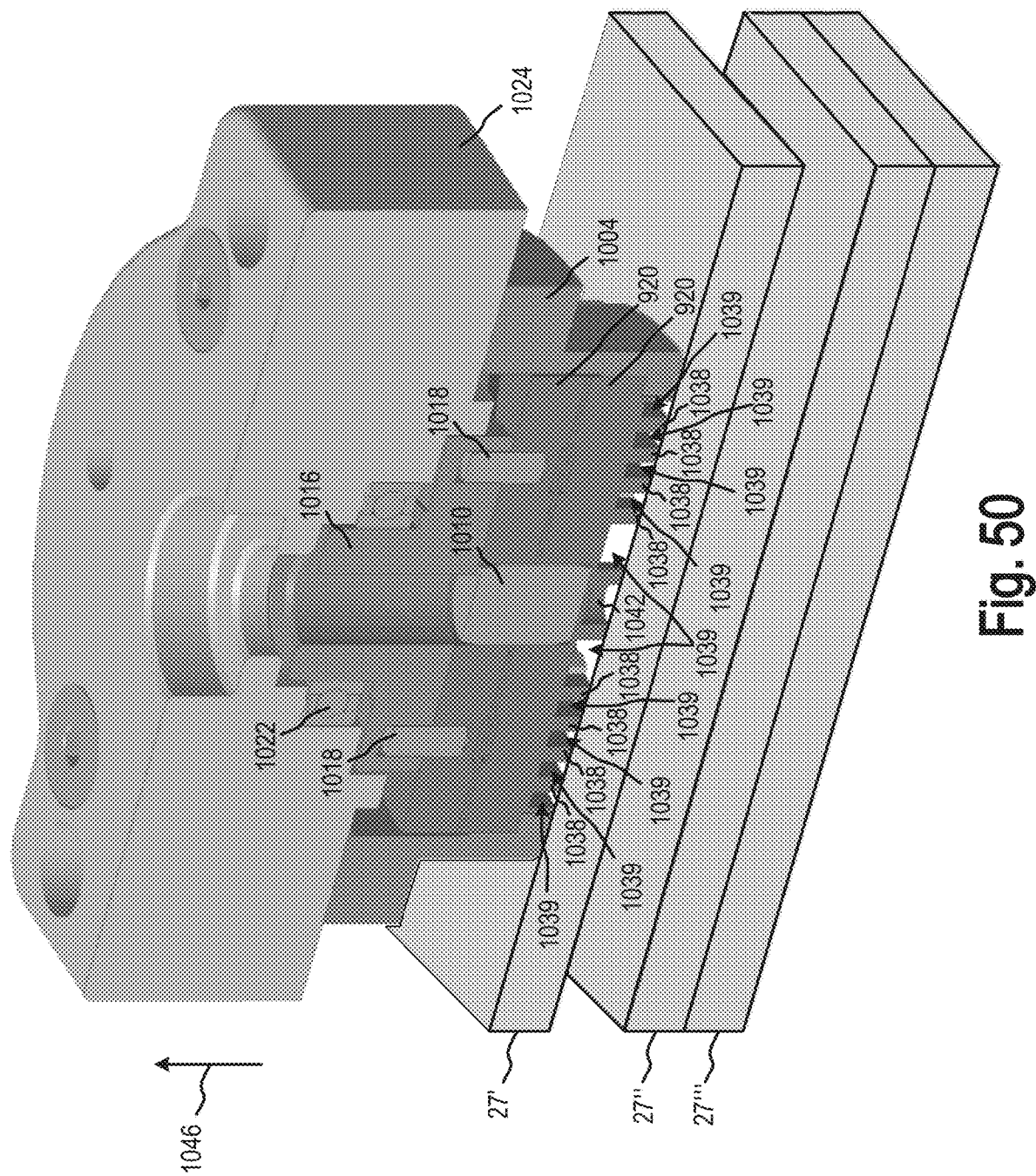
FIG. 50 illustrates a cross-sectional view of the magnetic coupling device of FIG. 47.
Figure 52:
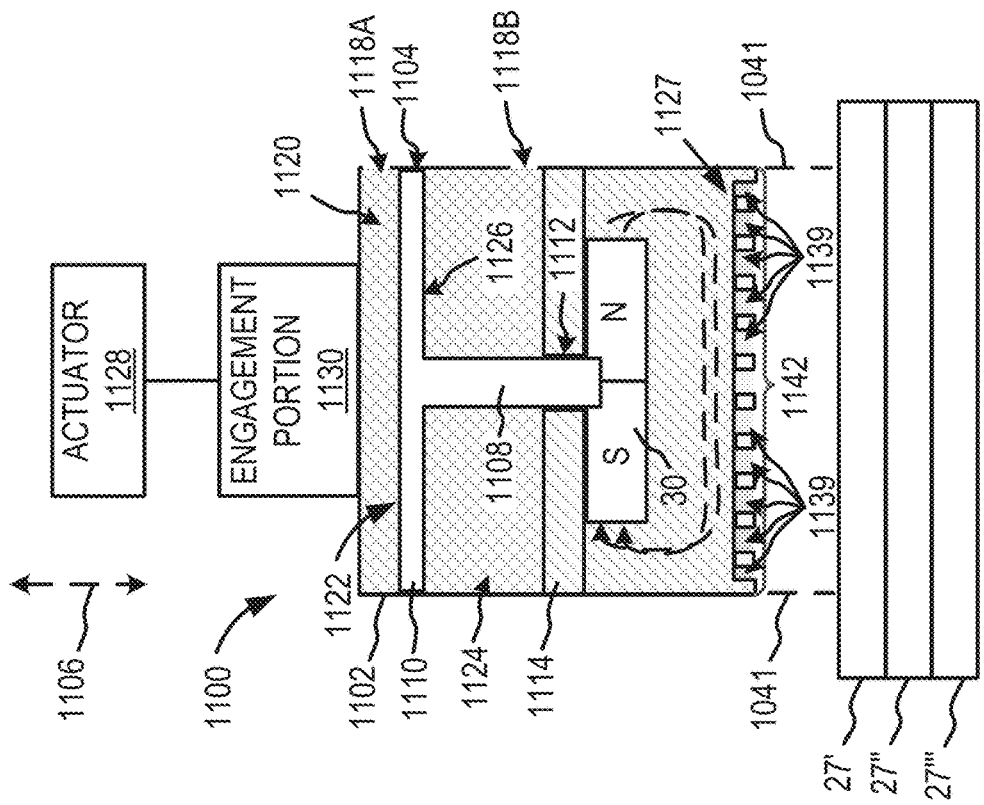
FIG. 52 illustrates a cross-sectional view of the magnetic coupling device depicted in FIG. 51 in an exemplary off state positioned above a stack of a plurality of ferromagnetic workpieces.
Figure 51:
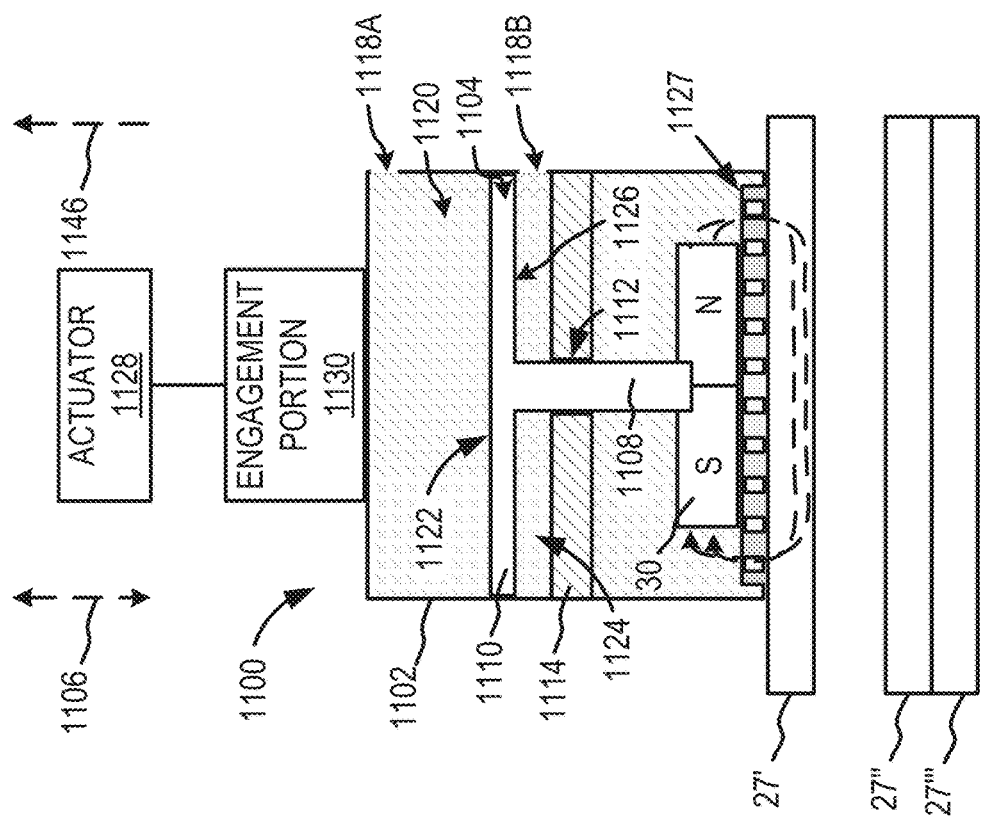
FIG. 51 illustrates a cross-sectional view of another magnetic coupling device with pole portions in an exemplary on state coupled to a ferromagnetic workpiece.

As shown in FIGS. 48-50, the base component 1920 is separated into a plurality of sectors 1034 by non-ferromagnetic pieces 1036. Each sector 1034 of the workpiece contact interface 1040 includes spaced-apart projections 1038 separated by recesses 1039 (see FIG. 50). As illustrated, the spaced-apart projections 1038 are located within a vertical envelope 1041 defined by the central bore 1006. The spaced-apart projections 1038 may be integrally formed as a bottom surface of the pole portions 1950 of the base component 1920. Alternatively, the spaced-apart projections 1038 may be coupled to a bottom surface of the pole portions 1950. While the example depicted illustrates four spaced-apart projections 1038, other embodiments may have two or more spaced-apart projections 1038.

The spaced-apart projections 1038 collectively form a workpiece contact interface 1040. That is, in embodiments, the spaced-apart projections 1038 form the workpiece contact interface 1040 of the pole portions 1950 of the base component 1920. As such, the spaced-apart projections 1038 may also be referred to herein as pole portion workpiece interfaces 1038. In embodiments, a central projection 1042 and/or the non-ferromagnetic pieces 1036 may be included in the workpiece contact interface 1040.

The pole portion workpiece interfaces 1038 are located at different radial distances 1044 from the central projection 1042 of the base component 1920. In embodiments, the radial distances 1044 may be a multiple of the thickness of the workpiece sheets 27. As an example, if the thickness of the workpiece sheets 27 is X mm, then the radial distances 1044 may be n*X (+/−25%), where n is an integer. The pole portion workpiece interfaces 1038 may also have the same or similar characteristics as pole shoes 200, 300, 1400, 500, 1602 (e.g., the same or similar: widths, widths and/or depths of the recesses, rounded shoulder portions, a curved workpiece interface, a compressible member between each of the pole portion workpiece interfaces 1038, etc.).

Due to the pole portion workpiece interfaces 1038 being spaced apart, they may have many of the same advantages as the pole shoes 200, 300, 1400, 500, 1602 described above. That is, they may produce a shallow magnetic field useful for de-stacking the workpiece sheets 27. For example, when the magnetic coupling device 1000 is in an on state, the magnetic circuit produced by the magnetic coupling device 1000 is substantially confined to workpiece sheet 27' of workpiece sheets 27 and of sufficient holding force to vertically lift workpiece sheet 27' in direction 1046 (of FIG. 50) relative to the remainder of workpiece sheets 27. Thus, magnetic coupling device 1000 may function to de-stack workpiece sheets 27. Of course, in some embodiments, a portion of the magnetic flux provided to workpiece sheets 27 by switchable magnet device 10 may enter lower sheet 27" of workpiece sheets 27, but not to a level that results in lower sheet 27" being lifted by switchable magnetic device 1000 along with workpiece sheet 27'. Thus, as used herein, the first magnetic circuit being substantially confined to workpiece sheet 27' of workpiece sheets 27 means that the amount, if any, of the magnetic flux from switchable magnetic lifting device 1000 entering lower sheet 27" is below a level that would result in the lower sheet 27" being vertically lifted in direction 1046 by switchable magnetic lifting device 1000 along with workpiece sheet 27'.

Referring to FIGS. 51-55, another exemplary magnetic coupling device 1100 of the present disclosure is represented. Magnetic coupling device 1100 includes the magnet 30. Alternatively, the magnet 30 could be replaced with the upper permanent magnet 32, the upper platter 1912, the lower platter 1914, or bar magnets. Additionally or alternatively, the magnetic coupling 1100 may be a parallelepiped and/or have a rectangular footprint instead of being cylindrical and/or having a circular footprint.

A housing 1102 of the magnetic coupling device 1100 houses the magnet 30 and an actuator assembly 1104. The actuator assembly 1104 facilitates movement of the magnet 30 along the axis 1106. In particular, in the illustrated embodiment, the actuator assembly 1104 includes a connecting rod 1108 coupling the magnet 30 to a crown 1110. That is, the connecting rod 1108 extends from the magnet 30 through a central bore 1112 of an intermediate element 1114 to the crown 1110. In one example, the connecting rod 1108 and the central bore 1112 form a clearance fit. The crown 1110 and interior walls of the housing 1102 may also form a clearance fit. In at least some embodiments, the intermediate element 1114 acts as a shorting plate, so the magnetic circuit created by the magnet 30 is primarily contained within the housing 1102.

In the exemplary embodiment depicted, the housing 1102 includes two ports 1118. Gas and/or fluid may be provided through the ports 1118 to move the actuator assembly 1104 from a first position shown in FIG. 51 to a second position shown in FIG. 52 and vice versa. In particular, by providing gas and/or fluid through port 1118A into a housing portion 1120 above the crown 1110, the gas and/or fluid exerts pressure on a top surface 1122 of the crown 1110, thereby exerting a downward force on the actuator assembly 1104. In response, the actuator assembly 1104 moves downward along the axis 1106 so the magnet 30 is positioned near the base 1127 of the housing 1102. When the magnet 30 is positioned near the base 1127 of the housing 1102, a magnetic circuit is substantially formed through the workpiece 27' (see FIG. 51), thereby allowing the workpiece sheet 27' to be de-stacked from the workpiece sheets 27", 27''', as discussed in more detail below.

Alternatively, by providing gas and/or fluid through port 1118B and into a housing portion 1124 below the crown 1110, the gas and/or fluid exerts pressure on a bottom surface 1126 of the crown 1110, thereby providing an upward force on the actuator assembly 1104. In response, the actuator assembly moves upward along the axis 1106 so the magnet 30 is positioned away and/or separated from the base 1127 of the housing 1102. When the magnet 30 is positioned away and/or separated from the base 1127 of the housing 1102, a magnetic circuit is substantially internal to the housing 1102 (see FIG. 52), thereby allowing the magnetic coupling device 1110 to be separated from the workpiece sheets 27.

While the illustrated example depicts an intermediate element 1112, in alternative embodiments the magnetic coupling device 1100 may not include an intermediate element 1114. In these embodiments, however, more gas and/or liquid may need to be provided into the housing portion 1124 to result in movement of the actuator assembly 1104 upward away from the base 1127 of the housing 1102.

In alternative embodiments, the actuator assembly 1104 may be moved along the axis 1106 using a linear actuator 1128 coupled to an engagement portion 1130 that is coupled to the actuator assembly 1104. The actuator 1128 and/or a device providing the gas and/or liquid through the ports 1118 may be coupled to a controller (e.g., the controller 34) that controls the operation and hence the position of the actuator assembly 1104. Alternatively, the linear actuator 1128 may be actuated electrically and/or manually.

Figure 53:
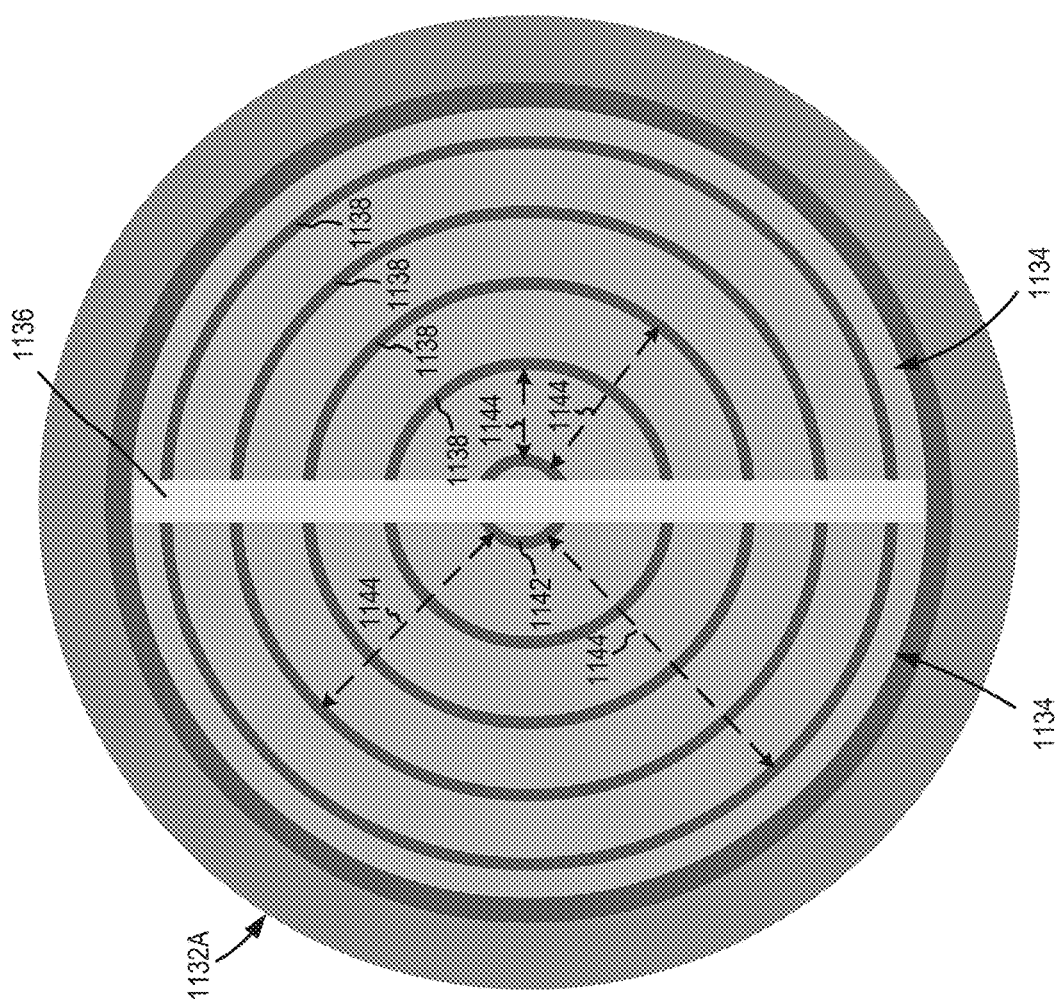
FIG. 53 illustrates a bottom view of the magnetic coupling device of FIG. 51.

As illustrated in FIG. 53, the housing 1102 may have a circular base 1132. Referring to the illustrated embodiment shown in FIG. 53, the base 1132A may be separated into two sectors 1134 by a non-ferromagnetic piece 1136, so there is a sufficient gap between the N-pole and the S-pole to prevent shorting of the magnetic circuit. Each sector 1134 of the base 1132A includes spaced-apart projections 1138 separated by recesses 1139 (see FIG. 52). As illustrated, the spaced-apart projections 1138 are located within a vertical envelope 1141 of the housing 1102. The spaced-apart projections 1138 may be coupled to the base 1127 of the housing 1102. The base 1132A may include two or more spaced-part projections 1138.

The spaced-apart projections 1138 collectively form a workpiece contact interface 1140 (see FIG. 52) of the base 1132A. As such, the spaced-apart projections 1138 may also be referred to herein as pole portion workpiece interfaces 1138. A central projection 1142 and/or the non-ferromagnetic piece 1136 may be included in the workpiece contact interface 1140 of the base 1132A.

The pole portion workpiece interfaces 1138 are located at a different radial distances 1144 from the central projection 1140. In embodiments, the radial distances 1144 may be a multiple of the thickness of the workpiece sheets 27. As an example, if the thickness of the workpiece sheets 27 is X mm, then the radial distances 1144 may be n*X (+/−25%), where n is an integer. The pole portion workpiece interfaces 1138 may also have the same or similar characteristics as pole shoes 38, 200, 300, 1400, 500, 1602 (e.g., the same or similar: widths, widths and/or depths of the recesses, rounded shoulder portions, a curved workpiece interface, a compressible member between each of the pole portion workpiece interfaces 1138, etc.). While the pole portion workpiece interfaces 1138 are depicted as being circularly, alternatively, they may be linear.

Due to the pole portion workpiece interfaces 1138 being spaced apart, they may have many of the same advantages as the pole shoes 200, 300, 1400, 500, 1602 and/or the pole portion workpiece interfaces 1038 described above. That is, they may produce a shallow magnetic field useful for de-stacking the workpiece sheets 27. For example, when the magnetic coupling device 1100 is in an on state (see FIG. 51), the magnetic circuit produced by the magnetic coupling device 1100 is substantially confined to workpiece sheet 27' of workpiece sheets 27 and of sufficient holding force to vertically lift workpiece sheet 27' in direction 1146 (of FIG. 51) relative to the remainder of workpiece sheets 27. Thus, magnetic coupling device 1100 may function to de-stack workpiece sheets 27. In some embodiments, a portion of the magnetic flux provided to workpiece sheets 27 by switchable magnet device 10 may enter lower sheet 27" of workpiece sheets 27, but not to a level that results in lower sheet 27" being lifted by switchable magnetic device 10 along with workpiece sheet 27'. Thus, as used herein, the first magnetic circuit being substantially confined to workpiece sheet 27' of workpiece sheets 27 means that the amount, if any, of the magnetic flux from switchable magnetic lifting device 1100 entering lower sheet 27" is below a level that would result in the lower sheet 27" being vertically lifted in direction 1146 by switchable magnetic lifting device 1100 along with workpiece sheet 27'.

As stated above, the magnet 30 may be replaced with the upper permanent magnet 32, the upper platter 1912, or the lower platter 1914. In embodiments where the magnet 30 is replaced by the upper platter 1912 or the lower platter 1914, the base 1132A may be replaced by the base depicted in FIG. 49.

Figure 55:
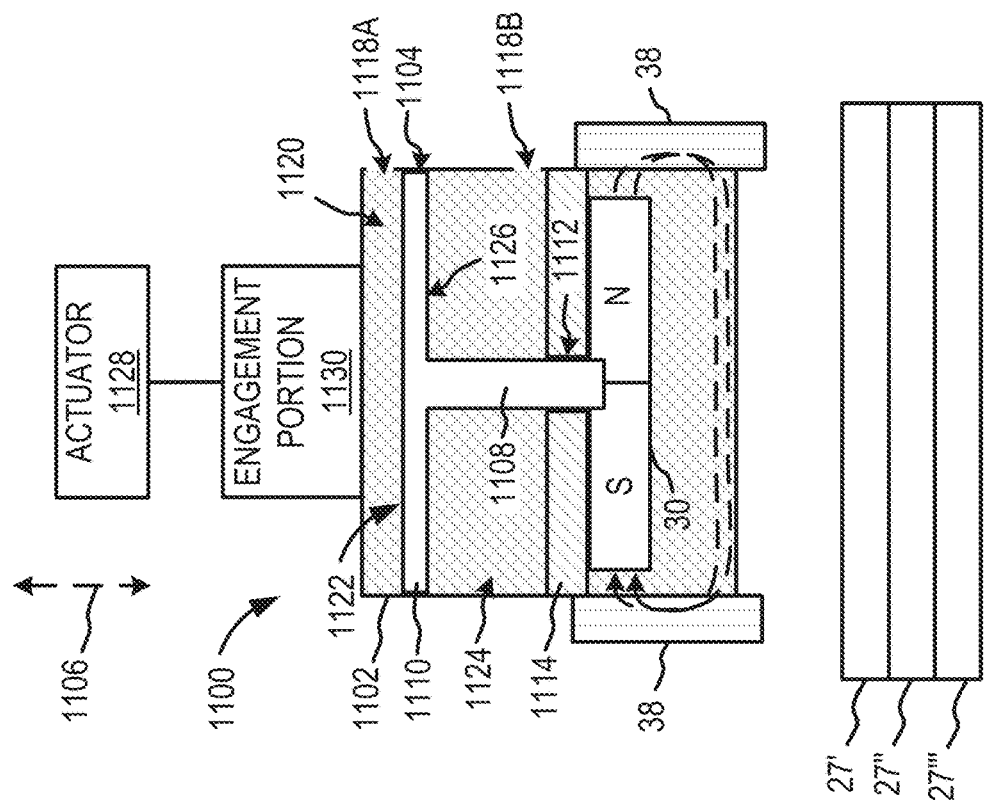
FIG. 55 illustrates a cross-sectional view of the magnetic coupling device depicted in FIG. 54 in an exemplary off state positioned above a stack of a plurality of ferromagnetic workpieces.
Figure 54:
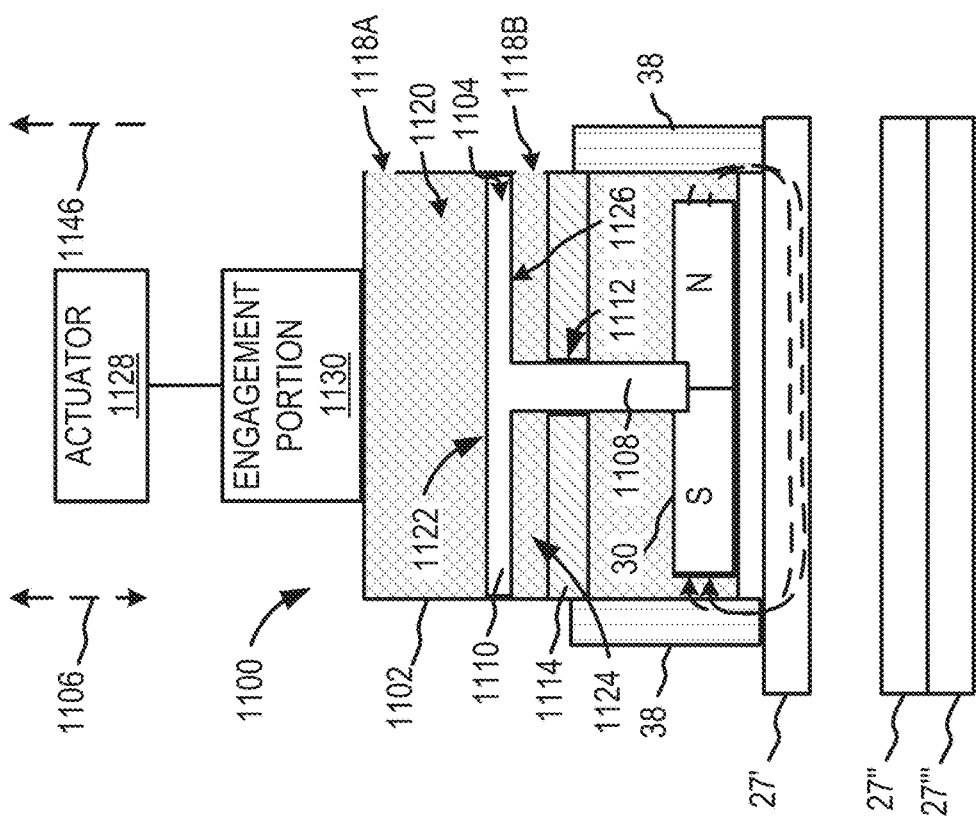
FIG. 54 illustrates a cross-sectional view of the magnetic coupling device of FIG. 51 with pole shoes in an exemplary on state coupled to a ferromagnetic workpiece.

In even other embodiments, the pole portion workpiece interfaces 1138 of the magnetic coupled device 1100 may be replaced by the pole shoes 38, as shown in FIGS. 54 and 55. In embodiments, the pole shoes 38 may also have the same or similar characteristics as pole shoes 200, 300, 1400, 500, 1602 (e.g., the same or similar: widths, widths and/or depths of the recesses, rounded shoulder portions, a curved workpiece interface, compressible member between each of the spaced-part projections, etc.).

Figure 56A:
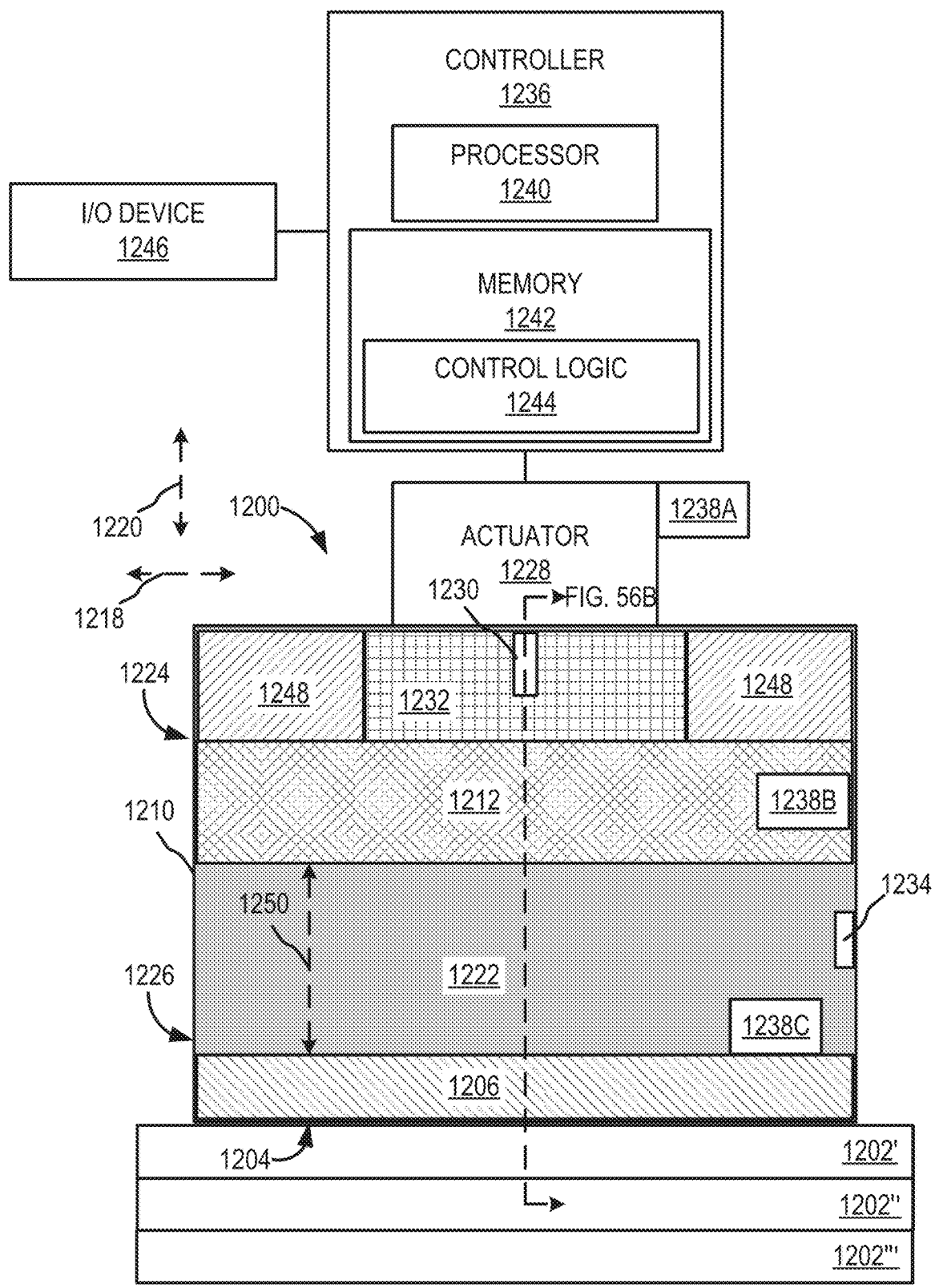
FIG. 56A illustrates a side-sectional view of another exemplary magnetic coupling device in an exemplary first, off state positioned on a stack of ferromagnetic workpieces.
Figure 56B:
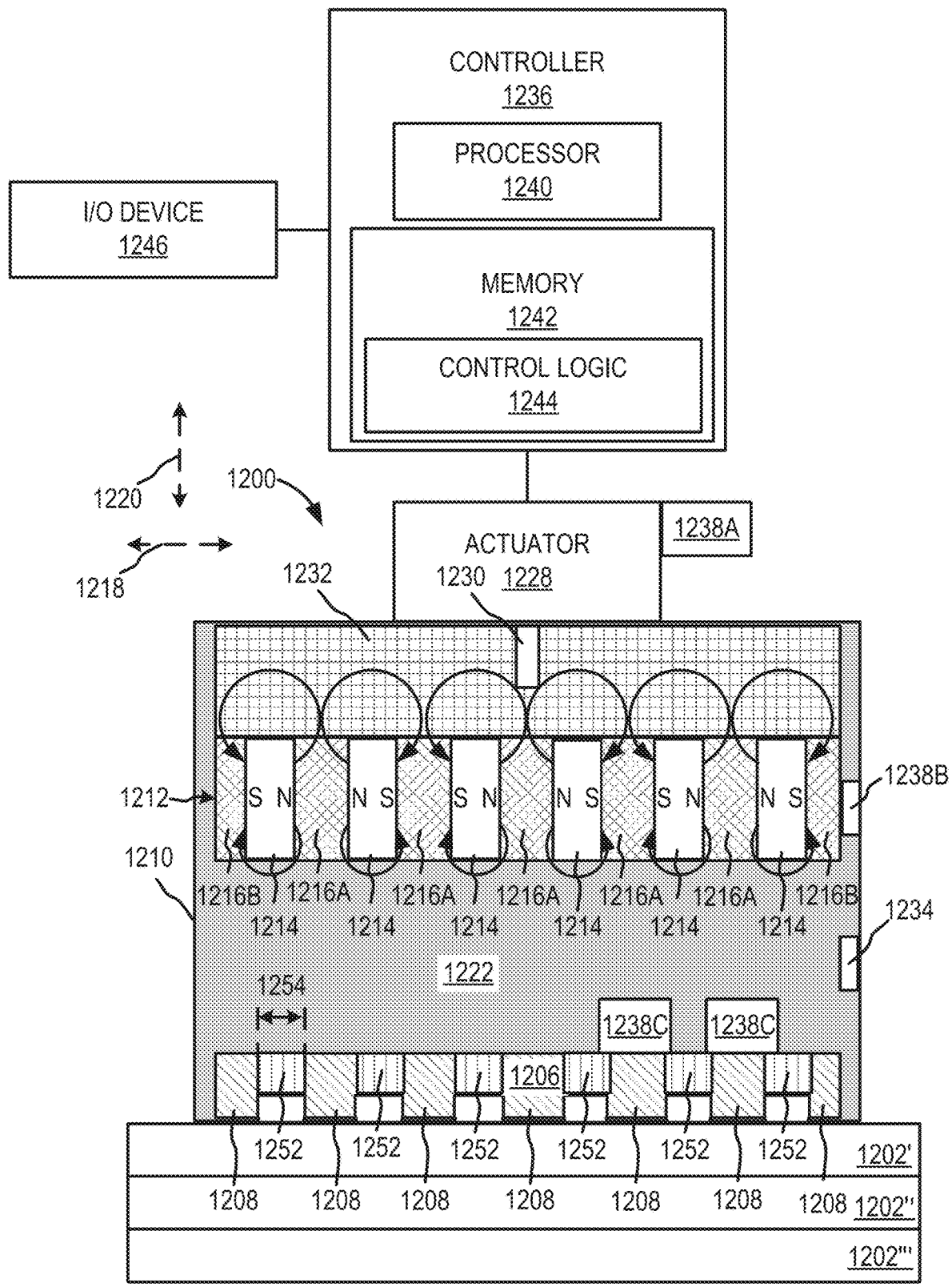
FIG. 56B illustrates a front sectional view of the magnetic coupling device of FIG. 56A.
Figure 57:
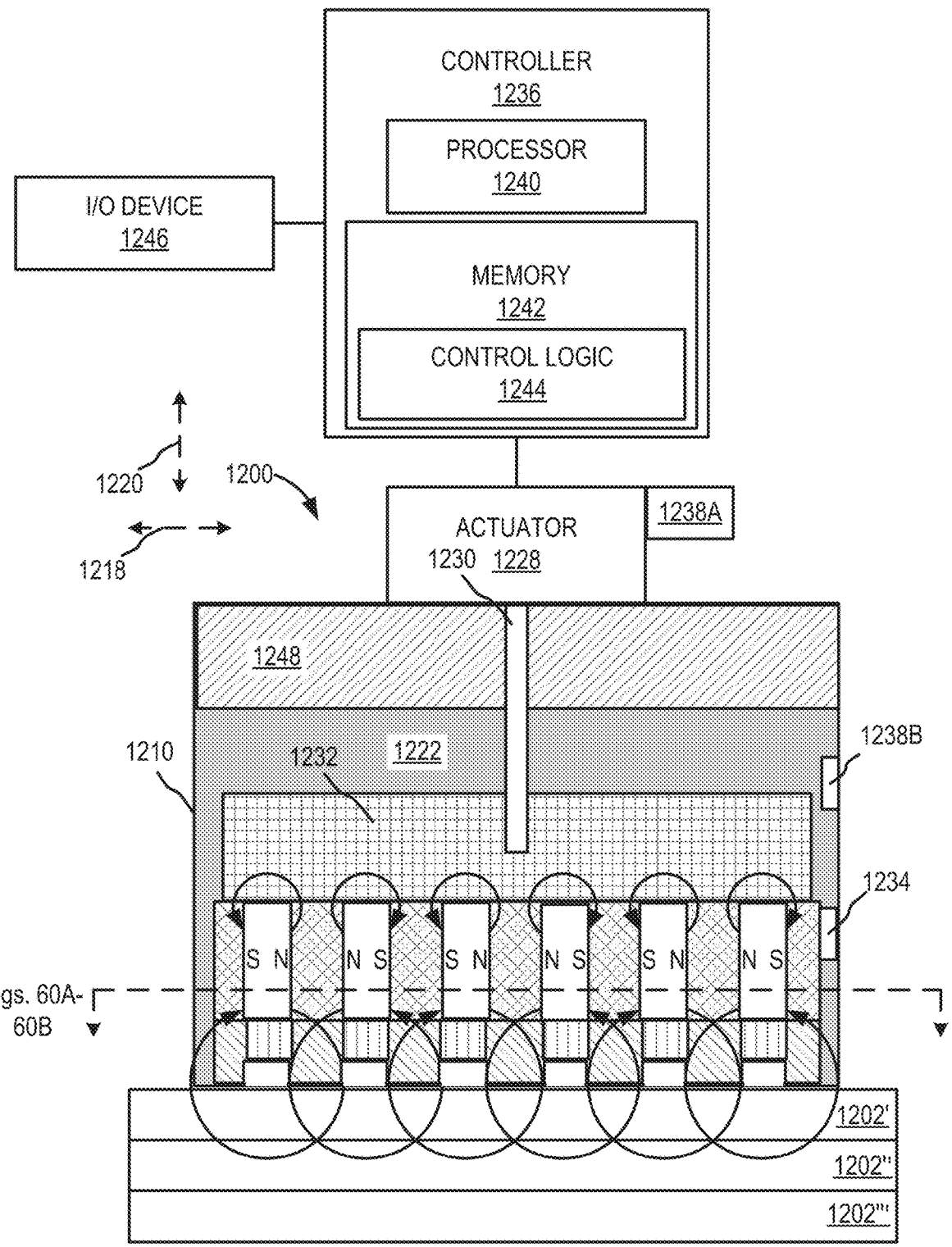
FIG. 57 illustrates a front sectional view of the magnetic coupling device of FIGS. 56A-56B in a second, on state.
Figure 58:
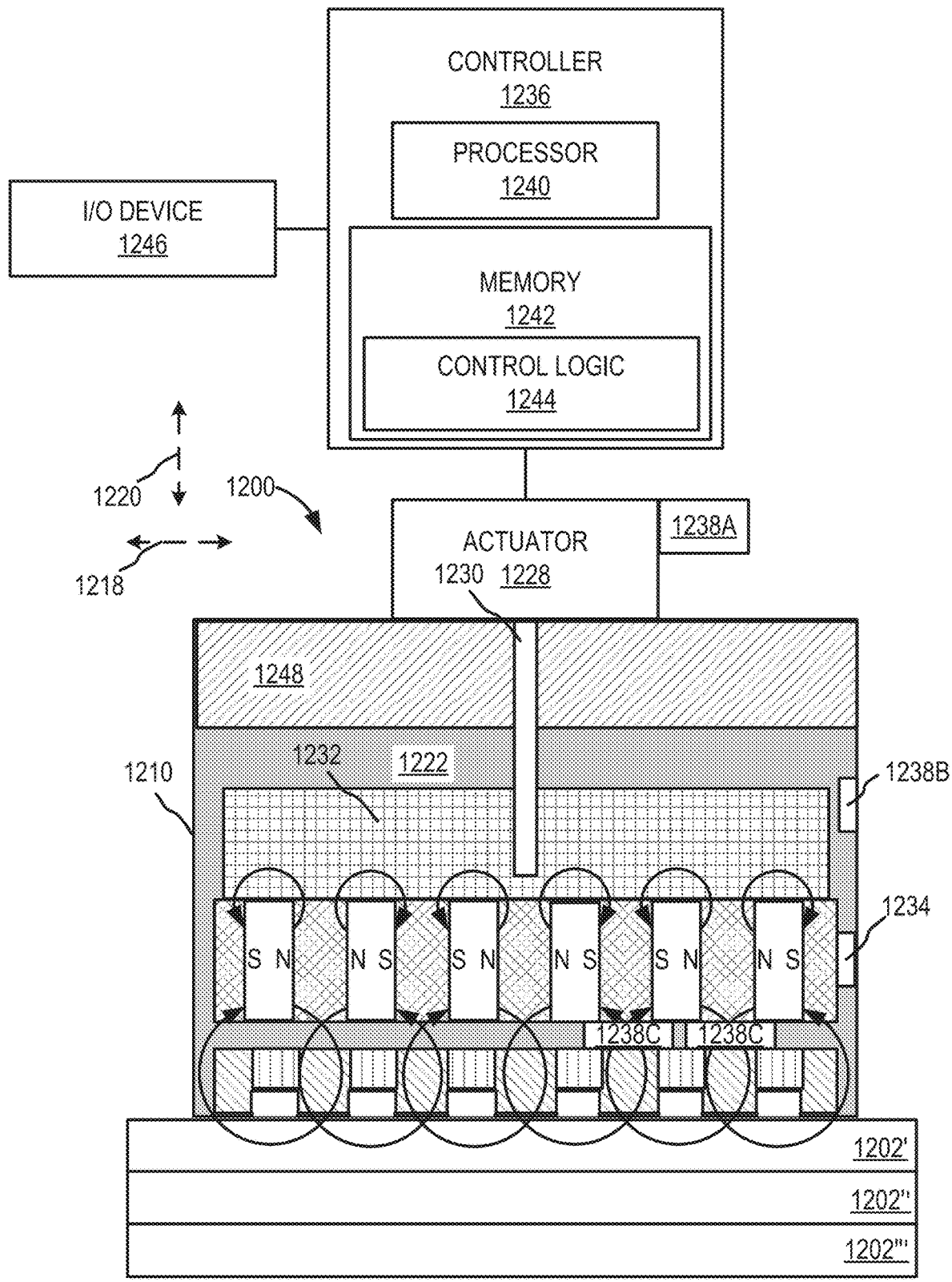
FIG. 58 illustrates a front sectional view of the magnetic coupling device of FIGS. 56A-56B in a third, on state.

Another exemplary magnetic coupling device 1200 of the present disclosure is represented in FIGS. 56A-58. FIG. 56A illustrates a side sectional view of an exemplary switchable magnetic coupling device 1200 in a first, off state and FIG. 56B illustrates a front sectional view of magnetic coupling device 1200. FIG. 57 illustrates a front sectional view of the magnetic coupling device of FIGS. 56A-56B in a second, on state. FIG. 58 illustrates a front sectional view of the magnetic coupling device of FIGS. 56A-56B in a third, on state.

Magnetic coupling device 1200 may be switched between a first, off state (depicted in FIGS. 56A-56B), a second, on state (depicted in FIG. 57), and/or a third, on state. When magnetic coupling device 1200 is switched to an on state, a magnetic field produced by magnetic coupling device 1200 passes through one or more ferromagnetic workpieces 1202 and couples magnetic coupling device 1200 to one or more of the ferromagnetic workpieces 1202. When magnetic coupling device 1200 is switched to an off state, magnetic field produced by magnetic coupling device 1200 is primarily confined within magnetic coupling device 1200 and, therefore, magnetic coupling device 1200 no longer couples to one or more of the ferromagnetic workpieces 1202. The off state and the on states are discussed in more detail below.

Magnetic coupling device 1200 may be used as an end of arm ("EOAMT") unit for a robotic system, such as robotic system 700 (see FIG. 25) and/or robotic system 800 (see FIGS. 38, 39), but may also be used with other lifting, transporting, and/or separating systems for ferromagnetic workpieces 1202. Exemplary lifting and transporting systems include robotic systems, mechanical gantries, crane hoists and additional systems which lift and/or transport ferromagnetic workpieces 1202. Additionally, magnetic coupling device 1200 may also be used as part of a stationary fixture for holding at least one part for an operation, such as welding, inspection, and other operations.

Referring to FIG. 56A, magnetic coupling device 1200 is positioned on top of ferromagnetic workpieces 1202 and includes a workpiece contact interface 1204 configured to contact and engage the ferromagnetic workpieces 1202. Workpiece contact interface 1204 may be a pole plate 1206. In at least one embodiment, the pole plate 1206 includes a plurality of spaced-apart projections 1208 as illustrated in FIG. 56B. In other embodiments, the pole plate 1206 does not include spaced-apart projections 1208. The spaced-apart projections 1208 may facilitate concentrating more magnetic flux near the workpiece contact interface 1204 so that when magnetic coupling device 1200 is in an on state, the magnetic flux of the magnetic coupling device 1200 primarily passes through the first ferromagnetic workpiece 1202'. Exemplary aspects of the pole plate 1206 and the projections 1208 are discussed below.

Magnetic coupling device 1200 also includes a housing 1210 that supports a magnetic platter 1212. Magnetic platter 1212 produces the magnetic field that allows magnetic coupling device 1200 to couple to ferromagnetic workpieces 1202 when the magnetic coupling device 1200 is in an on state. In at least one embodiment, magnetic platter 1212 is a laminated magnetic platter that includes a plurality of spaced-apart permanent magnet portions 1214 and a plurality of pole portions 1216, as shown in FIG. 56B. Each of the plurality of spaced-apart permanent magnet portions 1214 includes one or more permanent magnets. In one embodiment, each permanent magnet portion 1214 includes a single permanent magnet. In another embodiment, each permanent magnet portion 1214 includes a plurality of permanent magnets. Each permanent magnet portion 1214 is diametrically magnetized and has a north-pole side and a south-pole side.

Each pole portion 1216A is positioned between two of permanent magnet portions 1214 and pole portions 1216B are arranged adjacent to one permanent magnet portion 1214. Further, the permanent magnet portions 1214 are arranged so that each of the two permanent magnet portions 1214 contacting the pole portion 1216A therebetween have either their north pole sides or their south pole sides contacting the pole portion 1216A. When the north-pole sides of the adjacent permanent magnet portions 1214 are contacting a pole portion 1216A, the pole portion 1216A is referred to as a north-pole portion. When the south-pole sides of the adjacent permanent magnet portions 1214 are contacting a pole portion 1216A, the pole portion 1216A is referred to as a south-pole portion. Similarly, for pole portions 1216B, when the south-pole side of a permanent magnet portion 1214 contacts the pole portion 1216B, the pole portion 1216B is referred to as a south-pole portion. Conversely, when the north-pole side of a permanent magnet portion 1214 contacts the pole portion 1216B, the pole portion 1216B is referred to as a north-pole portion.

In the embodiments shown, the permanent magnet portions 1214 are arranged along a horizontal axis 1218. However, in other embodiments, the permanent magnet portions 1214 may be arranged in a circular configuration. Furthermore, while the embodiment illustrates magnetic platter 1212 including six permanent magnet portions 1214 and seven pole portions 1216, other embodiments may include more or fewer permanent magnet portions 1214 and pole portions 1216. For example, in one embodiment, magnetic platter 1212 may include one permanent magnet portion 1214 and two pole portions 1216, where one pole portion 1216 is arranged on each side of permanent magnet portion 1214.

Due to the configuration of magnetic platter 1212 and magnetic coupling device 1200, magnetic coupling device 1200 may be have a greater magnetic flux transfer to one or more of the ferromagnetic pieces 1202 than conventional embodiments. This results in magnetic coupling device 1200 being able to lift more and/or heavier ferromagnetic workpieces 1202 per magnetic volume included in magnetic coupling device 1200. For example, the magnetic coupling device 1200 may have a holding force of greater than or equal to 0.35 grams of ferromagnetic workpieces 1202 per cubic mm of volume of the magnetic coupling device 1200. As another example, the magnetic coupling device 1200 may have a holding force of greater than or equal to 0.8 grams of ferromagnetic workpieces 1202 per cubic mm of volume of the housing 1210 of the magnetic coupling device 1200.

To switch magnetic coupling device 1200 between a first, off state and a second, on state, magnetic platter 1212 is linearly translatable along an axis 1220 within an interior cavity 1222 of the housing 1204. In embodiments, the axis 1220 is a vertical axis 1220. Alternatively, the axis 1220 is an axis other than a vertical axis. The axis 1220 extends between a first end portion 1224 of the housing 1204 and a second end portion 1226 of the housing 1210. In at least some embodiments, the first end portion 1224 is an upper portion of the housing 1210 and the second end portion 1226 is a lower portion of the housing 1210 and may be referred to herein as such. However, in at least some other embodiments, the first end portion 1224 is a portion of the housing 1210 other than the upper portion of the housing 1210 and the second end portion 1226 is a portion of the housing 1210 other than the lower portion of the housing 1210. When magnetic platter 1212 is arranged near the upper portion 1224 of the housing 1210, magnetic coupling device 1200 is in a first, off state. When magnetic platter 1212 is arranged near the lower portion 1226 of the housing 1210, magnetic coupling device 1200 is in a second, on state. In addition to a first, off state and a second, on state, magnetic platter 1212 may be arranged at one or more intermediate positions between the upper portion 1224 and the lower portion 1226, as shown in FIG. 58. An intermediate position may be referred to herein as a third, on state. The third, on state may produce less magnetic flux at the workpiece contact interface 1204 than the second, on state, as discussed below.

To translate the magnetic platter 1212 along the vertical axis 1220 to transition to magnetic coupling device 1200 between an on state and off state and vice-versa, magnetic coupling device 1200 includes an actuator 1228. In at least one embodiment, actuator 1228 is coupled to magnetic platter 1212 via an engagement portion 1230 and a non-ferromagnetic mounting plate 1232. That is, actuator 1228 is coupled to engagement portion 1230 which is coupled to the non-ferromagnetic mounting plate 1232; and, non-ferromagnetic mounting plate 1232 is coupled to and in contact with magnetic platter 1212. Actuator 1228 is configured to impart a force on engagement portion 1230 and, in response, engagement portion 1230 translates along vertical axis 1220 to transition magnetic coupling device 1200 from an off state to an on state and vice versa. That is, to transition magnetic coupling device 1200 from an off state to an on state, actuator 1228 imparts a downward force on engagement portion 1230, which translates to non-ferromagnetic mounting plate 1232 and magnetic platter 1212. In response, magnetic platter 1212 translates from the upper portion 1224 to the lower portion 1226. Conversely, to transition magnetic coupling device 1200 from an on state to an off state, actuator 1228 imparts an upward force on engagement portion 1230, which translates to non-ferromagnetic mounting plate 1232 and magnetic platter 1212. In response, magnetic platter 1212 and non-ferromagnetic mounting plate 1232 translate from the lower portion 1226 to the upper portion 1224.

To arrange magnetic platter 1212 at a third, on state, actuator 1228 may produce a force on engagement portion 1230 to translate magnetic platter 1212 from the upper portion 1224 to the lower portion 1226 or vice versa. Then, when the magnetic platter 1212 is transitioning from the upper portion 1224 to the lower portion 1226 or vice versa, a brake 1234 arranged within housing 1210 and/or within actuator 1228 may engage magnetic platter 1212, non-ferromagnetic mounting plate 1232 and/or engagement portion 1230 and stop magnetic platter 1212 at a third, on state, as depicted in FIG. 58.

Figure 59:
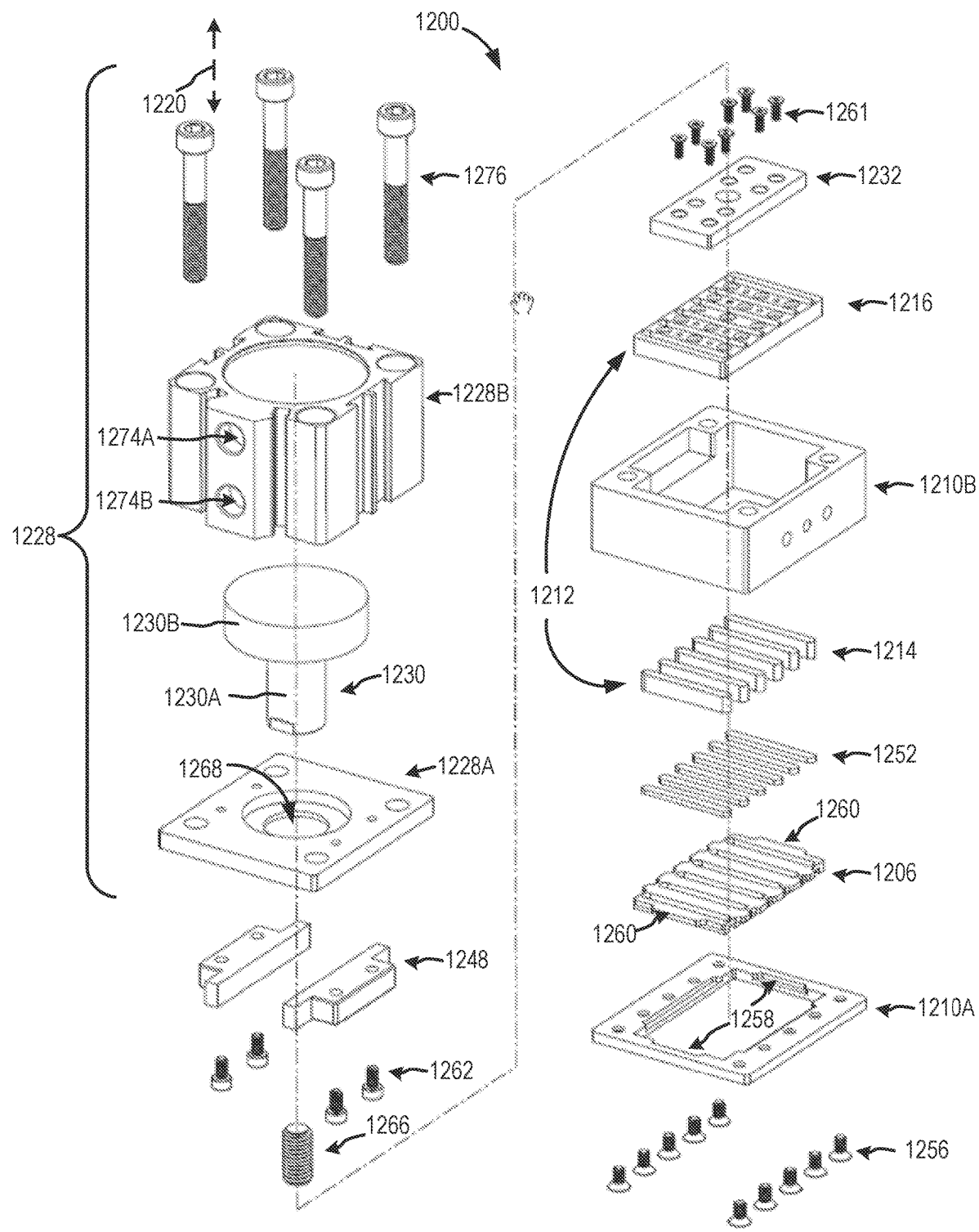
FIG. 59 illustrates an exploded view of the magnetic coupling device of FIGS. 56A-56B.

Exemplary actuators 1228 include electrical actuators, pneumatic actuators, hydraulic actuators, and other suitable devices which impart a force on engagement portion 1230. An exemplary pneumatic linear actuator is depicted in FIG. 59 and discussed in more detail in relation thereto. An exemplary electrical actuator is an electric motor with an "unrolled" stator and rotor coupled to the engagement portion 1230. Other exemplary engagement portions and actuators are disclosed in U.S. Pat. No. 7,012,495, titled SWITCHABLE PERMANENT MAGNETIC DEVICE; U.S. Pat. No. 7,161,451, titled MODULAR PERMANENT MAGNET CHUCK; U.S. Pat. No. 8,878,639, titled MAGNET ARRAYS, U.S. Provisional Patent Application No. 62/248,804, filed Oct. 30, 2015, titled MAGNETIC COUPLING DEVICE WITH A ROTARY ACTUATION SYSTEM; and U.S. Provisional Patent Application No. 62/252,435, filed Nov. 7, 2015, titled MAGNETIC COUPLING DEVICE WITH A LINEAR ACTUATION SYSTEM, the entire disclosures of which are herein expressly incorporated by reference.

Additionally or alternatively, actuator 1228 may include a controller 1236 and/or sensor 1238A. Controller 1236 includes a processor 1240 with an associated computer readable medium, illustratively memory 1242. Memory 1242 includes control logic 1244 which when executed by processor 1240 causes electronic controller 1236 to instruct actuator 1228 to move magnetic platter 1212 so that magnetic coupling device 1200 is in an off state, second on state and/or third on state. For example, sensor 1238A may sense a position of actuator 1228 and, in response to a predetermined position sensed by sensor 1238A, which translates to a position of magnetic platter 1212, control logic 1244 instructs actuator 1228 to stop exerting a force on magnetic platter 1212 when magnetic platter 1212 reaches a desired position.

In at least one embodiment, actuator 1228 is a stepper motor and rotary motion of actuator 1228 is translated to linear motion of engagement portion 1230 via a coupling (e.g., gear) between a shaft of actuator 1228 and engagement portion 1230. In these embodiments, sensor 1238A counts the pulses used to drive the stepper motor and determines a position of the shaft of the stepper motor, which is translated to a position of magnetic platter 1212, based on the number of pulses. The position of the shaft, i.e., angle, is then translated into the height of the gap 1250. That is, magnetic platter 1212 is moved relative along the vertical axis 1220 to a defined position by the steps the motor moves by counting the number of pulses. In another example, a stepper motor is provided that integrates an encoder with the stepper to check that the proper actuation angle is maintained.

As another example, magnetic coupling device 1200 may include sensor 1238B. Sensor 1238B may measure the position of magnetic platter 1212 within the housing 1210. Exemplary sensors 1238B include optical sensors which monitor reflective strips affixed to magnetic platter 1212. Other sensor systems may be used to determine a position of magnetic platter 1212.

As even another example, magnetic coupling device 1200 may include one or more sensors 1238C (illustrated in FIG. 56B). Sensors 1238C may be magnetic flux sensors and positioned adjacent the interface between the magnetic platter 1212 and the pole plate 1206 (e.g., adjacent one or both of the short sides of the interface between the magnetic platter 1212 and the pole plate 1206). In another exemplary embodiment, the sensor 1238C may be positioned at one or more positions over pole plate 1206. These examples, however, are not meant to be limiting.

Exemplary magnetic flux sensors include Hall-effect sensors. Sensors 1238C measure the leakage flux proximate to one or more north and south poles of pole plate 1206. The amount of leakage flux at each sensor 1238C varies based on the position of magnetic platter 1212 relative to pole plate 1206 and based on the amount of flux passing through the north and south poles of pole plate 1206, workpiece contact interface 1204 to ferromagnetic workpiece 1202. By monitoring the magnetic flux at locations opposite workpiece interface 1204 of north and south poles of pole plate 1206, the relative position of magnetic platter 1212 may be determined. Additionally or alternatively, the relative position of the magnetic platter 1212 can also be determined using an encoder as stated above. Also, as discussed above, the monitored magnetic flux can also be used to identify different ferromagnetic parts, positions, multiple parts, interference, coupling strengths, etc.

In embodiments, magnetic coupling device 1200 is positioned on top of ferromagnetic workpieces 1202 and the magnetic fluxes measured by sensors 1238C as magnetic platter 1212 moves from an off state to a second, on state are recorded as a function of position of magnetic platter 1212. Each of the magnetic fluxes are assigned to a desired position of magnetic platter 1212. An exemplary sensing system having sensors 1238C is disclosed in U.S. patent application Ser. No. 15/964,884, titled Magnetic Coupling Device with at Least One of a Sensor Arrangement and a Degauss Capability, filed Apr. 27, 2018, the entire disclosure of which is expressly incorporated by reference herein.

In embodiments, the controller 1236 changes the state of magnetic coupling device 1200 in response to an input signal received from an I/O device 1246. Exemplary input devices include buttons, switches, levers, dials, touch displays, pneumatic valves, soft keys, and communication module. Exemplary output devices include visual indicators, audio indicators, and communication module. Exemplary visual indicators include displays, lights, and other visual systems. Exemplary audio indicators include speakers and other suitable audio systems. In embodiments, device 1200 includes simple visual status indicators, in the form of one or more LEDs, which are driven by the processor 1240 of control logic 1244, to indicate when a predefined magnetic coupling device 1200 status is present or absent (e.g. Red LED on when magnetic coupling device 1200 is in a first, off state, Green LED blinking fast when magnetic coupling device 1200 is in a second, on state and proximity of ferromagnetic workpiece 1202 is detected, Green LED slower blinking with Yellow LED on when contacting ferromagnetic workpiece 1202 outside intended specific area on ferromagnetic workpiece 1202 (e.g. partially complete magnetic working circuit) and Yellow LED off with steady Green LED on, showing magnetic coupling device 1200 engagement within threshold limits, showing safe magnetic coupling state.

For example, in one embodiment, magnetic coupling device 1200 is coupled to an end of arm of a robotic arm and I/O device 1246 is a network interface over which controller 1236 receives instructions from a robot controller on when to place magnetic coupling device 1200 in one of a first off-state, second on-state, or third on-state. Exemplary network interfaces include a wired network connection and an antenna for a wireless network connection. While the embodiments discussed above relate to electronic, pneumatic, or hydraulic actuation, in alternative embodiments, the magnetic coupling device 1200 may be actuated manually by a human operator.

Magnetic coupling device 1200 may also include one or more ferromagnetic pieces 1248 arranged at or near an upper portion 1224 of the housing 1200, as illustrated in FIG. 56A. In at least one embodiment, non-ferromagnetic mounting plate 1232 and ferromagnetic pieces 1248 are arranged within housing 1210 so that non-ferromagnetic mounting plate 1232 is located between and in contact with ferromagnetic pieces 1248 when magnetic coupling device 1200 is in the first, off position. Furthermore, top portions of magnetic platter 1212 may be in contact with bottom portions of ferromagnetic pieces 1248. In another exemplary embodiment, the ferromagnetic pieces 1248 may extend down the sides of the magnetic platter 1212. In these embodiments, the ferromagnetic pieces 1248 may reduce leakage of the magnetic platter 1212 by providing additional absorption of the magnetic field generated by the magnetic platter 1212.

Non-ferromagnetic mounting plate 1232 is made of a non-ferromagnetic material (e.g., aluminum, austenitic stainless steels, etc.). When magnetic coupling device 1200 is in a first, off state and magnetic platter 1212 and non-ferromagnetic mounting plate 1232 are positioned at or near the upper portion 1218 of the housing 1204, one or more circuits between the non-ferromagnetic mounting platter 1212, ferromagnetic pieces 1248 and non-ferromagnetic mounting plate 1232 is created, as illustrated in FIG. 56B. Furthermore, when magnetic coupling device 1200 is in a first, off state, a gap 1250 (of FIG. 56A) that comprises air and/or another substance having a low magnetic susceptibility in the interior cavity 1216 is between and separates pole plate 1206 and magnetic platter 1212. As a result, little or no magnetic flux from the magnetic platter 1212 extends to the workpiece contact interface 1204 and through the ferromagnetic workpieces 1202 when the magnetic coupling device 1200 is in the first, off state. Therefore, magnetic coupling device 1200 can be separated from ferromagnetic workpieces 1202. Furthermore, most if not all the magnetic flux from the magnetic platter 1212 is contained within the housing 1210 due to the circuits between the non-ferromagnetic mounting platter 1212, ferromagnetic pieces 1248 and non-ferromagnetic mounting plate 1232.

An additional advantage of including ferromagnetic pieces 1248 is that the distance of the gap 1250 between the bottom of magnetic platter 1212 and pole plate 1206 can be less than if magnetic coupling device 1200 didn't include a non-ferromagnetic mounting plate 1232 and ferromagnetic pieces 1248. That is, one or more circuits created between magnetic platter 1212, ferromagnetic pieces 1248 and non-ferromagnetic mounting plate 1232, facilitates confining most if not all the magnetic flux from magnetic platter 1212 within the housing 1210, near the magnetic platter 1212 and away from the pole plate 1206. As such, the magnetic flux transferred to the ferromagnetic workpieces 1202 by the magnetic coupling device 1200 is insufficient to lift one or more of the ferromagnetic workpieces 1202. Stated another way, the magnetic flux may be effectively zero at the bottom of the pole plate 1206 and, therefore, effectively no magnetic flux is transferred to the ferromagnetic workpieces 1202 by the magnetic coupling device 1202, which reduces the overall required height the magnetic platter 1212 needs to travel (see height 1282 below) when the magnetic coupling device 1202 transitions between an off state and one or more on states.

Conversely, if non-ferromagnetic mounting plate 1232 and ferromagnetic pieces 1248 weren't included in the magnetic coupling device 1202, less of the magnetic flux from the magnetic platter 1212 would be confined within housing 1210 and/or near magnetic platter 1212. And, because less magnetic flux would be confined near magnetic platter 1212, the gap 1250 between the bottom of magnetic platter 1212 and pole plate 1206 would have to be greater in order for the magnetic flux not to extend down through the pole plate 1206 and couple magnetic coupling device 1200 to one or more of the ferromagnetic workpieces 1202. Due to the gap 1250 being smaller in the illustrated embodiment, magnetic coupling device 1200 can be smaller than other magnetic coupling devices not having these features.

As an example, the gap 1250 the magnetic platter 1212 may travel to transition between the first, off state to the second, on state may be less than or equal to 8 mm.

Conversely, to transition from the second, on state to the first, off state, the magnetic platter 1212 may travel less than or equal to 8 mm.

Another advantage of the illustrated embodiment is that less energy can be used by actuator 1228 to translate magnetic platter 1212 along the vertical axis 1220 within the housing 1210 due to the gap 1250 being smaller. Even another advantage of the illustrated embodiment, is that it will be less likely magnetic platter 1212 will break when actuator 1228 translates magnetic platter 1212 from the first, off position to the second, on position and magnetic platter 1212 comes into contact with pole piece 1206. This is a result of magnetic platter 1212 building less momentum during the transition due to the reduced gap 1250. As even another advantage of the illustrated embodiment, in the event magnetic coupling device 1200 fails while magnetic coupling device 1200 is in an off state, magnetic coupling device 1200 will not transition to an on state due to the non-ferromagnetic mounting plate 1232 and the ferromagnetic pieces 1248. As such, the magnetic coupling device 1200 is safer than a magnetic coupling device that transitions from an off state to an on state when the magnetic coupling device fails. Conversely, in the event magnetic coupling device 1200 didn't include a non-ferromagnetic mounting plate 1232 and/or ferromagnetic pieces 1248, magnetic platter 1212 may be more likely to transition to an on state due to the lack of magnetic circuit created in the off position.

As stated above, when the magnetic platter 1206 is positioned at or near the lower portion 1226 of the housing 1204, magnetic coupling device 1200 is in a second, on state. As illustrated in FIG. 57, magnetic flux from the magnetic platter 1206 extends through one or more of the ferromagnetic workpieces 1202 when the magnetic coupling device 1200 is in the second, on state. As such, the magnetic coupling device 1200 is configured to couple to one or more ferromagnetic workpieces 1202 when the magnetic coupling device 1200 is in the first, on state. While the magnetic flux lines are illustrated as passing through both ferromagnetic workpieces 1202', 1202", in some embodiments the magnetic flux lines primarily pass only through the ferromagnetic workpiece 1202'. When the magnetic flux lines primarily pass through the first ferromagnetic workpiece 1202', the magnetic coupling device 1200 can be used to de-stack and separate the ferromagnetic workpieces 1202 from one another.

To facilitate the magnetic flux lines primarily passing through only the first ferromagnetic workpiece 1202' when magnetic coupling device 1200 is in a second, on state, the magnetic platter 1212 may be removable and replaceable, which allows different strength, height, and/or width magnetic platters 1212 to be used with the magnetic coupling device 1200. The strength, height, and/or width of the magnetic platter 1212 may be selected based on the thickness of the ferromagnetic workpiece 1202 so that the ferromagnetic workpieces 1202 can be adequately de-stacked and separated from one another when magnetic coupling device 1200 is in the second, on position.

Additionally or alternatively, the pole plate 1206 may be removable and replaceable, which allows different types of pole plates 1206 to be used with the magnetic coupling device 1200. For example, the pole plate 1206 may be selected based on the type of ferromagnetic workpiece 1202 to which the magnetic coupling device 1200 is being coupled. For example, the magnetic coupling device 1200 may be handling class-a surfaces that cannot be scratched or marred. As a result, a pole plate 1206 having rubber (or another material that reduces the likelihood the ferromagnetic workpiece 1202 is scratched or marred) arranged on the workpiece contact interface may be selected and incorporated into the magnetic coupling device 1200. As another example, a pole plate 1206 having different projections and/or gaps may be selected based on the thickness of the ferromagnetic workpiece 1202 to which the magnetic coupling device 1200 is being coupled. Additional examples of the relevance of the projections and/or gaps is explained in more detail above in relation to FIGS. 41-46B.

As discussed in more detail below in relation to FIG. 59, the housing 1204 is configured in a manner that allows the magnetic platter 1212 and/or the pole plate 1206 to be easily removable and replaceable.

Additionally or alternatively, magnetic coupling device 1200 may be transition to one or more intermediate states as stated above. For example, magnetic coupling device 1200 may transition to a third, on state, as illustrated in FIG. 58. The third, on state is when magnetic platter 1212 is located along the vertical axis 1220 between the location of the magnetic platter 1212 when the magnetic coupling device 1200 is in the first, off state and the location of the magnetic platter 1212 when the magnetic coupling device 1200 is in the second, on state. In embodiments where the same magnetic platter 1212 is being used, less magnetic flux passes through the workpiece contact interface 1204 and into the ferromagnetic workpieces 1202 when magnetic coupling device 1200 is in the third, on state than when the magnetic coupling device 1200 is in the second, on state, as illustrated in FIG. 58. That is, assuming the same strength magnetic platter 1212 is being used in the embodiments depicted in FIG. 57 and FIG. 58, magnetic flux lines pass through both ferromagnetic workpieces 1202', 1202" in FIG. 57, whereas magnetic flux lines pass through only ferromagnetic workpiece 1202' in FIG. 58. By being able to be in a third, on state, magnetic coupling device 1200 may be able to de-stack different thickness of ferromagnetic workpieces 1202 without having to replace magnetic platter 1212 with a different strength magnetic platter 1212.

As stated above, the pole plate 1206 includes a plurality of projections 1208. Each of the projections 1208 acts as a pole extension for a respective pole portion of the pole portions 1216. That is, when the magnetic coupling device 1200 is in a second or third, on state, the respective north or south pole of the pole portions 1216 extends down through a respective projection 1208. A magnetic circuit is then created that goes from a N pole portion 1216 through a respective N-pole projection 1208, through one or more ferromagnetic workpieces 1202, through a S-pole projection 1208, and through a S pole portion 1216. Each permanent magnetic portion creates one of these magnetic circuits when the magnetic coupling device 1200 is in an on state. As explained in more detail above in relation to FIGS. 41-46B, the size of the projections 1208 and the distance therebetween affect the flux transfer to the ferromagnetic workpieces 1202 and allow more effective de-stacking of ferromagnetic materials 1202 and an increased holding force. For example, in at least some embodiments, to achieve the highest concentration of magnetic flux being transferred through a ferromagnetic piece 1202' of the ferromagnetic workpieces 1202 and therefore have the greatest likelihood of being able to de-stack the ferromagnetic workpiece 1202' from the ferromagnetic workpieces 1202", 1202'", the size of the projections (e.g., width and height) and the gap therebetween should approximately match the thickness of the ferromagnetic workpieces 1202.

To separate the N and S projections 1208, the pole plate 1206 may include slots configured to receive one or more non-ferromagnetic pieces 1252 (depicted in FIG. 56B). The non-ferromagnetic pieces 1252 may be arranged within respective envelopes 1254 (depicted in FIG. 56B) between each of the projections 1208. Due to the non-ferromagnetic pieces 1252, the magnetic circuit created by the permanent magnet portions 1214 does not extend substantially through the non-ferromagnetic pieces 1252 and, therefore, the N and S projections are separated from one another. Furthermore, as stated above, the projections 1208 result in magnetic flux from magnetic platter 1212 being nearer the workpiece contact interface 1204 than if the pole plate 1206 did not include a plurality of projections 1208. Different aspects of the projections 1208 facilitating magnetic flux from magnetic platter 1212 to be concentrated nearer the workpiece contact interface 104 are discussed above in relation to FIGS. 41-46B. In alternative embodiments, the projections 1208 and recesses therebetween may be integrated directly into the housing 1210.

Referring to FIG. 59, an exploded view of the magnetic coupling device 1200 is illustrated. As illustrated, the housing 1210 includes a lower portion 1210A releasable securable to an upper portion 1210B. The lower portion 1210A may be secured to the upper portion 1210B using one or more screws 1256. The screws 1256 may provide easy access to components of magnetic coupling device 1210 arranged within the housing 1210, as explained below.

Prior to joining the lower portion 1210A and the upper portion 1210B, the lower portion 1210A receives a pole plate 1206. In at least one embodiment, the lower portion 1210A includes recesses/cutouts 1258 configured to receive tabs 1260 of the pole plate 1206. The tabs 1260 facilitate proper positioning of the pole plate 1206 within the lower portion 1210A. Proper positioning of the pole plate 1206 may facilitate easy replacement of the pole plate 1206 in the event a pole plate 1206 with different projections 1208 than a currently installed pole plate 1206 is desired. For example, the lower portion 1210A of the housing 1210 can be separated from the upper portion 1210B by removing the screws 1256. Then, the pole plate 1206 can be removed from the lower portion 1210A. After which, another pole plate 1206 having different projections 1208 can be inserted into the lower portion 1210A so that the tabs 1260 are received by the recesses/cutouts 1258. Finally, the screws can 1256 be used to secure the lower portion 1210A to the upper portion 1210A. The tabs 1260 may be comprised of a ferromagnetic material.

In addition to or in alternative to replacing the pole plate 1206, the design of magnetic coupling device 1200 also facilitates easy removal and replacement of magnetic platter 1212. For example, as illustrated, the non-ferromagnetic mounting plate 1232 is coupled to the magnetic platter 1212 via one or more screws 1261. After removing the lower portion 1210A from the upper portion 1210B, the magnetic platter 1212 can be lowered along the vertical axis 1220 so the screws 1261 can be accessed. Once the screws 1261 are unscrewed, the magnetic platter 1212 can be separated from the non-ferromagnetic mounting plate 1232 and exchanged for another magnetic platter 1212. The new magnetic platter 1212 can be secured to the non-ferromagnetic mounting plate 1232 using the screws 1261. After which, the lower portion 1210A and the upper portion 1210B can be coupled together using the screws 1256.

In some instances, the magnetic platter 1212 may need to be replaced in the event the magnetic platter 1212 is broken or damaged. In other instances, the magnetic platter 1212 may need to be replaced with a magnetic platter 1212 that produces a stronger or weaker magnetic field. As discussed above, replacing the magnetic platter 1212 with a magnetic platter 1212 having a stronger or weaker magnetic may facilitate de-stacking the ferromagnetic workpieces 1202. For example, a first magnetic platter 1212 may produce enough magnetic flux through the first and second ferromagnetic workpieces 1202', 1202" to lift both ferromagnetic workpieces 1202', 1202". However, separating the first ferromagnetic workpiece 1202' from the second ferromagnetic workpiece 1202" may be desirable. In these instances, a second magnetic platter 1212 that is weaker than the first magnetic platter 1212 and only produce enough magnetic flux through the ferromagnetic workpieces 1202 to lift the first ferromagnetic workpiece 1202' may replace the first magnetic platter 1212.

In the illustrated embodiment, a lower portion 1228A of the actuator 1228 is coupled to the housing 1210 using one or more screws 1262. As such, the lower portion 1228A acts as a cover to the housing 1210. Further, ferromagnetic pieces 1248 are coupled to a bottom portion 1228A of the actuator 1228 using the one or more screws 1262. As such, when the magnetic platter 1212 and non-ferromagnetic mounting plate 1232 are moved to an upper portion of the housing 1210 and magnetic coupling device 1200 is in the first, off position, magnetic platter 1212 is arranged in contact with the ferromagnetic pieces 1248. That is, there contact between the outside portions of the magnetic platter 1212 and the ferromagnetic pieces 1248, as illustrated.

Magnetic circuits are then formed from N pole portions 1216 of the magnetic platter 1212 through one of the ferromagnetic workpieces 1248, through the non-ferromagnetic mounting plate 1232, through the other ferromagnetic workpiece 1248 and to S pole portions 1216 of the magnetic platter 1212. The circuit results in a number of advantages for the magnetic coupling device 1200, which are discussed above.

As illustrated, non-ferromagnetic mounting plate 1232 is coupled to the engagement portion 1230 with a screw 1266. The engagement portion 1230 includes a first portion 1230A and a second portion 1230B, wherein in at least some embodiments, the first portion 1230A has a smaller cross-ssectional area than the second portion 1230B. In at least one embodiment, the first portion 1230A extends through a conduit 1268 in the bottom portion 1228A and coupled to the non-ferromagnetic mounting plate 1232 via the screw 1266. Due to the coupling of the engagement portion 1230 to the non-ferromagnetic mounting plate 1232, translation of the engagement portion 1230 along the vertical axis 1220 will translate the non-ferromagnetic mounting plate 1232 and magnetic platter 1212 along the vertical axis 1220.

To translate the engagement portion 1230 along the vertical axis 1220, the actuator 1228 may be pneumatically actuated. For example, the actuator's housing 1228B may include ports 1274 including a first port 1274A and a second port 1274B. When air is provided into port 1274A, via an air compressor or otherwise, the pressure within the actuator's housing 1228B and above the second portion 1230B increases, which results in the engagement portion 1230 moving downward along the vertical axis 1220. The translation of the engagement portion 1230 results in the magnetic platter 1212 moving downward along the vertical axis 1220 so the magnetic coupling device 1200 is transitioned from a first, off state to a second, on state or a third, on state or from a third, on state to a second, on state. To confine air provided into port 1274A within the actuator's housing 1228B and above engagement portion 1230, actuator 1228 may include a cover (not shown) secured to the actuator's housing 1228B via one or more screws 1276. Additionally or alternatively, air may be withdrawn from port 1274B to reduce the pressure below the second portion 1230B relative to the pressure above the second portion 1230B, which results in the engagement portion 1230 moving downward along the vertical axis 1220.

Conversely, when air is provided into the port 1274B, the pressure within the actuator's housing 1228B and below the second portion 1230B increases, which results in the plate moving upward along the vertical axis 1220. The translation of the engagement portion 1230 results in the magnetic platter 1212 moving upward along the vertical axis 1220 so the magnetic coupling device 1200 is transitioned from a second, on state to a third, on state or a first, off state or from a third, on state to a first, off state. Additionally or alternatively, air may be withdrawn from port 1274A to reduce the pressure above the second portion 1230B relative to the pressure below the second portion 1230B, which results in the engagement portion 1230 moving upward along the vertical axis 1220.

In at least some other embodiments, the ports 1274A, 1274B may be formed through the housing 1210B and pressure or a reduction in pressure may be applied to the top of the magnetic platter 1212 or the bottom of the magnetic 1212 to translate the magnetic platter 1212 along the vertical axis 1220.

Figure 60A:
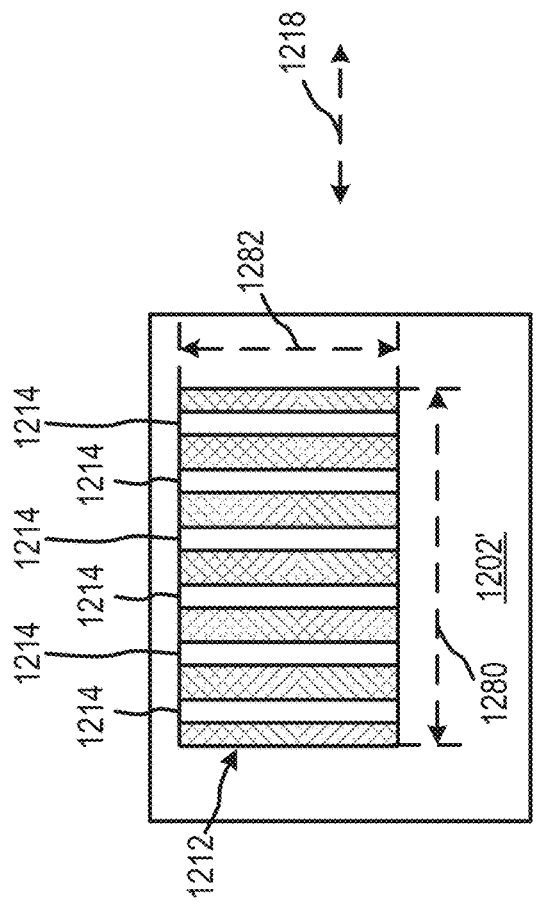
FIGS. 60A-60B illustrate a top sectional view of the magnetic coupling device of FIGS. 56A-56B in different positions on a ferromagnetic workpiece.
Figure 60B:
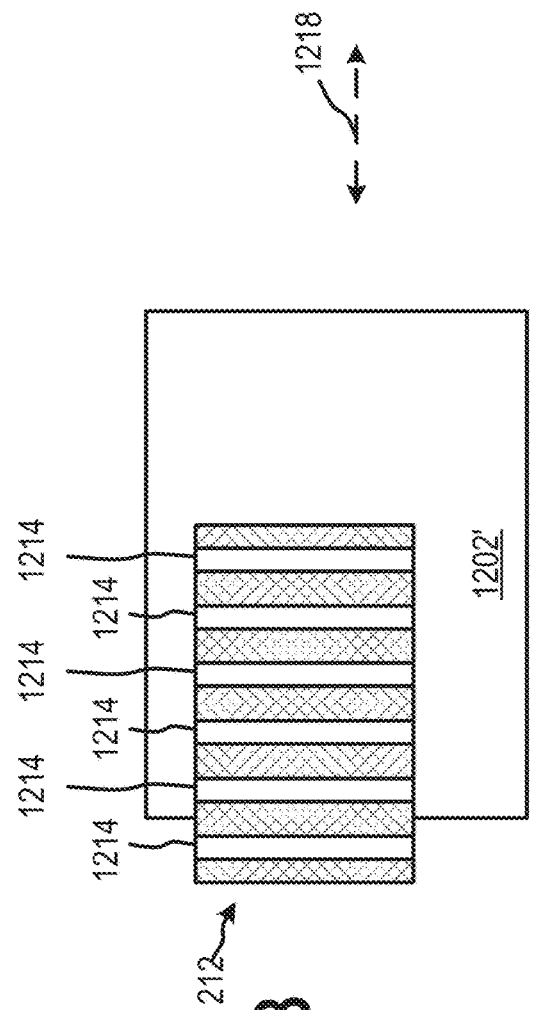

FIGS. 60A-60B illustrate a top sectional view of the magnetic coupling device of FIGS. 56A-56B in different positions on a ferromagnetic workpiece 1202. Referring to FIG. 60A, the non-ferromagnetic magnetic platter 1212 is shown on ferromagnetic workpiece 1202'. As illustrated, the entirety of the footprint of the magnetic platter 1212 has been placed on ferromagnetic workpiece 1202'. As used herein, the term footprint may be defined as the surface area of the magnetic platter 1212, i.e., the width 1280 times the height 1282. It is preferable to have the entire footprint of the magnetic platter 1212 to be placed on the ferromagnetic workpiece 1202' because the most amount of flux will be transferred from magnetic platter 1212 to ferromagnetic workpiece 1202'. When the entire footprint of the magnetic platter 1212 is placed on ferromagnetic workpiece 1202', magnetic coupling device 1200 may be configured to lift greater than or equal to 22.0 grams of ferromagnetic workpieces 1202 per square mm of area of footprint of the magnetic platter 1212.

While it is preferable to have the entire footprint of the magnetic platter 1212 places on the ferromagnetic workpiece 1202', oftentimes magnetic platter 1212 will be placed on ferromagnetic workpiece 1202' as shown in FIG. 60B. This can occur when magnetic coupling device 1200 is attached to an end of arm unit for a robotic system, such as robotic system 700 (of FIG. 25) and/or robotic system 800 (of FIGS. 38, 39), where placement of magnetic platter 1212 on ferromagnetic workpiece 1202' is being performed using computer vision or some other automated process.

In the event magnetic platter 1212 is placed on ferromagnetic workpiece 1202' as shown in FIG. 60B, the configuration of magnetic platter 1212 may offer some advantages. Specifically, there may be a lower likelihood magnetic platter 1212 will peel away from ferromagnetic workpiece 1202' when magnetic platter 1212 lifts ferromagnetic workpiece 1202' compared to other magnetic coupling devices. That is, due to multiple permanent magnetic portions 1214 being included in the magnetic platter 1212, when the magnetic platter 1212 is placed on ferromagnetic workpiece 1202' as shown in FIG. 60B, only the left most permanent magnetic portion 1214 is off of ferromagnetic workpiece 1202'. Therefore, five other magnetic circuits are still formed between the magnetic platter 1212 and the ferromagnetic workpiece 1202'. As such, the magnetic platter 1212 may still be operating at approximately an 83% capacity (⅚=0.83). Comparatively, if the magnetic platter 1212 only included one permanent magnetic portion 1214, one-third of the magnetic circuit wouldn't be formed with the ferromagnetic workpiece 1202' due to 12/3 of the pole portion being off the ferromagnetic workpiece 1202'. As such, magnetic platter 1212 may be operating at approximately 66% capacity.

Each of the disclosed magnetic coupling devices described above may be used in combination with a mechanical lifting apparatus that lift and transport a ferromagnetic workpiece from a first location to a second location. Exemplary mechanical lifting apparatuses include mechanical gantries, crane hoists, stationary fixtures, robotic fixtures, etc.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

The invention claimed is:

1. A magnetic system comprising:
   a machine including a base that is configured to perform an operational cycle;
   at least one magnetic coupling device operatively coupled to the machine at a first end of the machine opposite the base, wherein each magnetic coupling device of the at least one magnetic coupling device comprises:
      a housing including a switchable magnetic flux source supported by the housing;
      a plurality of workpiece engagement surfaces supported by the housing and magnetically coupled to the switchable magnetic flux source, the plurality of workpiece engagement surfaces adapted to contact a ferromagnetic workpiece, a first workpiece engagement surface of the plurality of workpiece engagement surfaces corresponding to a north pole of the magnetic coupling device and a second workpiece engagement surface of the plurality of workpiece engagement surfaces corresponding to a south pole of the magnetic coupling device; and
      at least one magnetic field sensor supported by the housing, wherein a first magnetic field sensor of the at least one magnetic field sensor is positioned to monitor a first magnetic flux associated with the first workpiece engagement surface or a second magnetic flux associated with the second workpiece engagement surface; and
   a logic control circuit operatively coupled to the first magnetic field sensor and the machine, the logic control circuit configured to perform a calibration sequence for the at least one magnetic coupling device using an output from the first magnetic field sensor during the operational cycle, wherein to perform the calibration sequence, the logic control circuit is configured to:

store initial values of minimum and maximum leakage fluxes for the first magnetic flux or the second magnetic flux prior to the machine performing the operational cycle; and replace the initial values of the minimum and maximum leakage fluxes with updated values of minimum and maximum leakage fluxes sensed by the first magnetic field sensor during the operational cycle.

2. The system of claim 1, wherein the logic control circuit is configured to correlate the initial values of the minimum and maximum leakage fluxes and the updated values of the minimum and maximum leakage fluxes to a type of ferromagnetic workpiece.

3. The system of claim 1, wherein different minimum and maximum leakage fluxes are sensed by the first magnetic field sensor at different positions during the operational cycle and wherein the logic control circuit is configured to correlate the different minimum and maximum leakage fluxes to the different positions.

4. The system of claim 1, wherein different minimum and maximum leakage fluxes are sensed by the first magnetic field sensor at different times during the operational cycle and wherein the logic control circuit is configured to correlate the different minimum and maximum leakage fluxes to the different times.

5. The system of claim 1, wherein different minimum and maximum leakage fluxes are sensed by the first magnetic field sensor at different times for a specific position during the operational cycle and wherein the logic control circuit is configured to correlate the different minimum and maximum leakage fluxes to the different times for the specific position.

6. The system of claim 1, wherein the calibration sequence is performed when the at least one magnetic coupling device is coupled to a ferromagnetic workpiece and when the at least one magnetic coupling device is not coupled to the ferromagnetic workpiece.

7. The system of claim 1, wherein the logic control circuit is configured to determine when the at least one magnetic coupling device is not securely coupled to the ferromagnetic workpiece based on the updated values of minimum and maximum leakage fluxes.

8. The system of claim 1, wherein the logic control circuit is configured to determine when the at least one magnetic coupling device is operating in a degraded mode based on the updated values of minimum and maximum leakage fluxes.

9. The system of claim 1, wherein the logic control circuit is configured to determine at least one operating state of the at least one magnetic coupling device based on the calibration sequence.

10. The system of claim 1, wherein the switchable magnetic flux source is switched via an electromagnetic pulse delivered via coils to a magnet included in the switchable magnetic flux source.

11. The system of claim 1, wherein the magnetic flux source comprises: a second permanent magnet rotatable relative to a first permanent magnet about an axis intersecting with the second permanent magnet to alter a position of the second permanent magnet relative to the first permanent magnet.

12. The system of claim 1, wherein the magnetic flux source comprises: a second permanent magnet rotatable relative to a first permanent magnet about an axis in a non-intersecting relationship with the second permanent magnet to alter a position of the second permanent magnet relative to the first permanent magnet.

13. The system of claim 1, wherein the first magnetic field sensor is positioned to monitor the first magnetic flux and the at least one magnetic field sensor comprises a second magnetic field sensor positioned to monitor the second magnetic flux; and wherein the logic control circuit is configured to perform the calibration sequence for the at least one magnetic coupling device using the output from the first magnetic field sensor and an output from the second magnetic field sensor during the operational cycle.

14. The system of claim 1, wherein the magnetic flux source comprises a first magnetic platter supported by the housing and a second magnetic platter supported by housing, the second magnetic platter being rotatable relative to the first magnetic platter about an axis in a non-intersecting relationship with the second magnetic platter to alter a position of the second permanent magnet relative to the first permanent magnet, the first magnetic platter comprising:
a first plurality of spaced apart permanent magnets including the first permanent magnet, each of the first plurality of spaced apart permanent magnets has a north pole side and a south pole side, and
a first plurality of pole portions interposed between adjacent permanent magnets of the first plurality of permanent magnets, wherein the first plurality of permanent magnets are arranged so that each pole portion of the first plurality of pole portions is one of a north pole portion which is adjacent the north pole side of two permanent magnets of the first plurality of permanent magnets and a south pole portion which is adjacent the south pole side of two permanent magnets of the first plurality of permanent magnets;

the second magnetic platter comprising:
a second plurality of spaced apart permanent magnets including the second permanent magnet, each of the second plurality of spaced apart permanent magnets has a north pole side and a south pole side, and
a second plurality of pole portions interposed between adjacent permanent magnets of the second plurality of permanent magnets, wherein the second plurality of permanent magnets are arranged so that each pole portion of the first plurality of pole portions is one of a north pole portion which is adjacent the north pole side of two permanent magnets of the second plurality of permanent magnets and a south pole portion which is adjacent the south pole side of two permanent magnets of the second plurality of permanent magnets, wherein the first magnetic sensor is associated with one of the north pole portions of the second magnetic platter and the second magnetic sensor is associated with one of the south pole portions of the second magnetic platter.

15. The system of claim 1, wherein the machine includes a plurality of moveable segments.

16. The system of claim 15, wherein the machine is a robotic arm, a mechanical gantry, a crane hoist, or a pick and place machine.

17. The system of claim 1, wherein the machine is a stationary machine.

18. The system of claim 1, wherein the switchable magnetic flux source comprises a magnetic platter including a plurality of permanent magnet portions interposed between a plurality of ferromagnetic pole piece portions, the magnetic platter being linearly translatable within the housing along an axis extending between a first end portion of the housing and a second end portion of the housing to at least each of a first state and a second state, the magnetic platter being arranged adjacent to a ferrous piece such that the magnetic coupling device establishes a first magnetic circuit through the ferrous piece and provides a first magnetic field at a workpiece contact interface of the magnetic coupling device when the magnetic platter is in the first state and the magnetic platter being arranged spaced apart from the ferrous piece such that the magnetic coupling device provides a second magnetic field at the workpiece contact interface when the magnetic platter is in the second state, the second magnetic field being a non-zero magnetic field strength.

19. The system of claim 18, wherein the magnetic coupling device is linearly translatable to a third state, the magnetic platter being arranged between the first state and the second state when the magnetic platter is in the third state.

20. The system of claim 18, wherein the workpiece contact interface comprises a plurality of spaced-apart projections.

21. A method for calibrating a magnetic system of claim 1, the method comprising:
sensing, by at least one magnetic field sensor, at least one magnetic flux associated with a first workpiece engagement surface of a magnetic coupling device, a second magnetic flux associated with a second workpiece engagement surface of a magnetic coupling device, or both, wherein the magnetic coupling device is coupled to a machine at a first end opposite a base of the machine and wherein the machine is configured to perform an operational cycle;
store initial values of minimum and maximum leakage fluxes of the first magnetic flux and the second magnetic flux prior to the machine performing the operational cycle; and
replace the initial values of the minimum and maximum leakage fluxes with updated values of minimum and maximum leakage fluxes sensed by the at least one magnetic field sensor during the operational cycle.

22. The method of claim 21, further comprising correlating the initial values of the minimum and maximum leakage fluxes and the updated values of the minimum and maximum leakage fluxes to a type of ferromagnetic workpiece.

23. The method of claim 21, wherein different minimum and maximum leakage fluxes are sensed at different positions during the operation cycle and the method further comprises correlating the different minimum and maximum leakage fluxes to the different positions.

24. The method of claim 21, wherein different minimum and maximum leakage fluxes are sensed at different times during the operation cycle and the method further comprises correlating the different minimum and maximum leakage fluxes to the different times.

25. The method of claim 21, wherein different minimum and maximum leakage fluxes are sensed by the magnetic field sensor at different times for a specific position during the operational cycle and the method further comprises correlating the different minimum and maximum leakage fluxes to the different times for the specific position.

26. The method of claim 21, wherein the method is performed when the magnetic system is coupled to a ferromagnetic workpiece and when the magnetic system is not coupled to the ferromagnetic workpiece.

27. The method of claim 21, further comprising determining when the magnetic system is not securely coupled to a ferromagnetic workpiece based on the updated values of minimum and maximum leakage fluxes.

28. The method of claim 21, further comprising determining when the magnetic system is operating in a degraded mode based on the updated values of minimum and maximum leakage fluxes.

29. The method of claim 21, further comprising determining at least one operating state of the magnetic coupling device based on the calibration sequence.

30. A magnetic system comprising:
a machine including a base that is configured to perform an operational cycle;
at least one magnetic coupling device operatively coupled to the machine at a first end of the machine opposite the base, wherein each magnetic coupling device of the at least one magnetic coupling device comprises:
a housing including a switchable magnetic flux source supported by the housing;
a plurality of workpiece engagement surfaces supported by the housing and magnetically coupled to the switchable magnetic flux source, the plurality of workpiece engagement surfaces adapted to contact a ferromagnetic workpiece, a first workpiece engagement surface of the plurality of workpiece engagement surfaces corresponding to a north pole of the magnetic coupling device and a second workpiece engagement surface of the plurality of workpiece engagement surfaces corresponding to a south pole of the magnetic coupling device; and
at least one magnetic field sensor supported by the housing, wherein a first magnetic field sensor of the at least one magnetic field sensor is positioned to monitor a first magnetic flux associated with the first workpiece engagement surface or a second magnetic flux associated with the second workpiece engagement surface; and
a logic control circuit operatively coupled to the first magnetic field sensor and the machine, the logic control circuit configured to perform a calibration sequence for the at least one magnetic coupling device using an output from the first magnetic field sensor during the operational cycle, wherein the magnetic flux source comprises: a second permanent magnet rotatable relative to a first permanent magnet about an axis intersecting with the second permanent magnet to alter a position of the second permanent magnet relative to the first permanent magnet.

31. The system of claim 30, wherein the first magnetic field sensor is positioned to monitor the first magnetic flux and the at least one magnetic field sensor comprises a second magnetic field sensor positioned to monitor the second magnetic flux; and
wherein the logic control circuit is configured to perform the calibration sequence for the at least one magnetic coupling device using the output from the first magnetic field sensor and an output from the second magnetic field sensor during the operational cycle.

32. A magnetic system comprising:
a machine including a base that is configured to perform an operational cycle;
at least one magnetic coupling device operatively coupled to the machine at a first end of the machine opposite the base, wherein each magnetic coupling device of the at least one magnetic coupling device comprises:
a housing including a switchable magnetic flux source supported by the housing;
a plurality of workpiece engagement surfaces supported by the housing and magnetically coupled to the switchable magnetic flux source, the plurality of workpiece engagement surfaces adapted to contact a ferromagnetic workpiece, a first workpiece engagement surface of the plurality of workpiece engagement surfaces corresponding to a north pole of the magnetic coupling device and a second workpiece engagement surface of the plurality of workpiece engagement surfaces corresponding to a south pole of the magnetic coupling device; and at least one magnetic field sensor supported by the housing, wherein a first magnetic field sensor of the at least one magnetic field sensor is positioned to monitor a first magnetic flux associated with the first workpiece engagement surface or a second magnetic flux associated with the second workpiece engagement surface; and a logic control circuit operatively coupled to the first magnetic field sensor and the machine, the logic control circuit configured to perform a calibration sequence for the at least one magnetic coupling device using an output from the first magnetic field sensor during the operational cycle, wherein the magnetic flux source comprises: a second permanent magnet rotatable relative to a first permanent magnet about an axis in a non-intersecting relationship with the second permanent magnet to alter a position of the second permanent magnet relative to the first permanent magnet.

33. The system of claim 32, wherein the first magnetic field sensor is positioned to monitor the first magnetic flux and the at least one magnetic field sensor comprises a second magnetic field sensor positioned to monitor the second magnetic flux; and wherein the logic control circuit is configured to perform the calibration sequence for the at least one magnetic coupling device using the output from the first magnetic field sensor and an output from the second magnetic field sensor during the operational cycle.

34. A magnetic system comprising:

a machine including a base that is configured to perform an operational cycle;

at least one magnetic coupling device operatively coupled to the machine at a first end of the machine opposite the base, wherein each magnetic coupling device of the at least one magnetic coupling device comprises:

a housing including a switchable magnetic flux source supported by the housing;

a plurality of workpiece engagement surfaces supported by the housing and magnetically coupled to the switchable magnetic flux source, the plurality of workpiece engagement surfaces adapted to contact a ferromagnetic workpiece, a first workpiece engagement surface of the plurality of workpiece engagement surfaces corresponding to a north pole of the magnetic coupling device and a second workpiece engagement surface of the plurality of workpiece engagement surfaces corresponding to a south pole of the magnetic coupling device; and at least one magnetic field sensor supported by the housing, wherein a first magnetic field sensor of the at least one magnetic field sensor is positioned to monitor a first magnetic flux associated with the first workpiece engagement surface or a second magnetic flux associated with the second workpiece engagement surface; and a logic control circuit operatively coupled to the first magnetic field sensor and the machine, the logic control circuit configured to perform a calibration sequence for the at least one magnetic coupling device using an output from the first magnetic field sensor during the operational cycle, wherein the switchable magnetic flux source comprises a magnetic platter including a plurality of permanent magnet portions interposed between a plurality of ferromagnetic pole piece portions, the magnetic platter being linearly translatable within the housing along an axis extending between a first end portion of the housing and a second end portion of the housing to at least each of a first state and a second state, the magnetic platter being arranged adjacent to a ferrous piece such that the magnetic coupling device establishes a first magnetic circuit through the ferrous piece and provides a first magnetic field at a workpiece contact interface of the magnetic coupling device when the magnetic platter is in the first state and the magnetic platter being arranged spaced apart from the ferrous piece such that the magnetic coupling device provides a second magnetic field at the workpiece contact interface when the magnetic platter is in the second state, the second magnetic field being a non-zero magnetic field strength.

35. The system of claim 34, wherein the magnetic coupling device is linearly translatable to a third state, the magnetic platter being arranged between the first state and the second state when the magnetic platter is in the third state.

36. The system of claim 34, wherein the workpiece contact interface comprises a plurality of spaced-apart projections.

37. The system of claim 34, wherein the first magnetic field sensor is positioned to monitor the first magnetic flux and the at least one magnetic field sensor comprises a second magnetic field sensor positioned to monitor the second magnetic flux; and wherein the logic control circuit is configured to perform the calibration sequence for the at least one magnetic coupling device using the output from the first magnetic field sensor and an output from the second magnetic field sensor during the operational cycle.

* * * * *

UNITED STATES PATENT AND TRADEMARK OFFICE
CERTIFICATE OF CORRECTION

PATENT NO. : 12,023,770 B2
APPLICATION NO. : 17/049947
DATED : July 2, 2024
INVENTOR(S) : David H. Morton, Paul J. Karp and Cengiz Kizilkan Page 1 of 1

It is certified that error appears in the above-identified patent and that said Letters Patent is hereby corrected as shown below:

On the Title Page

Please remove item (86) "PCT No.: PCT/US2019/027267 § 371(c)(1), (2) Date: Oct. 22, 2020".

Please remove item (87) "PCT Pub. No.: WO2019/209553 PCT Pub. Date: Oct. 31, 2019".

Item (63) "Related U.S. Application Data", please add "Continuation of PCT/US2019/027267, filed on Apr. 12, 2019, which is a Continuation-in-part of application No. 15/964,884, and is a" prior to "Continuation-in-part of application No. 15/964,884, filed on Apr. 27, 2018, now Pat. No. 11,097,401".

Signed and Sealed this
Twentieth Day of May, 2025

Coke Morgan Stewart
*Acting Director of the United States Patent and Trademark Office*